United States Patent
Raring et al.

(10) Patent No.: US 10,587,090 B1
(45) Date of Patent: Mar. 10, 2020

(54) SAFE LASER LIGHT

(71) Applicant: Soraa Laser Diode, Inc., Goleta, CA (US)

(72) Inventors: James W. Raring, Goleta, CA (US); Paul Rudy, Goleta, CA (US); Steve DenBaars, Goleta, CA (US); Troy Trottier, Cary, NC (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 14/986,376

(22) Filed: Dec. 31, 2015

(51) Int. Cl.
*H01S 5/14* (2006.01)
*H01S 5/00* (2006.01)
*H01S 5/323* (2006.01)
*H01S 5/026* (2006.01)
*H01S 5/028* (2006.01)

(52) U.S. Cl.
CPC .......... *H01S 5/005* (2013.01); *H01S 5/0262* (2013.01); *H01S 5/14* (2013.01); *H01S 5/32341* (2013.01); *H01S 5/028* (2013.01)

(58) Field of Classification Search
None
See application file for complete search history.

(56) References Cited

U.S. PATENT DOCUMENTS

| | | | | |
|---|---|---|---|---|
| 5,995,692 A | * | 11/1999 | Hamakawa | G02B 6/4207 372/102 |
| 2002/0009102 A1 | * | 1/2002 | Hayakawa | H01S 5/141 372/22 |
| 2004/0099788 A1 | * | 5/2004 | Hedin | G01J 1/4257 250/205 |
| 2008/0217579 A1 | * | 9/2008 | Ishida | B82Y 20/00 252/301.4 R |
| 2010/0329298 A1 | * | 12/2010 | Weichmann | H01S 3/0627 372/50.121 |
| 2012/0051377 A1 | * | 3/2012 | Liang | H01S 5/0092 372/36 |
| 2014/0029641 A1 | * | 1/2014 | Volodin | G02B 27/0944 372/102 |

FOREIGN PATENT DOCUMENTS

JP 2004-134633 * 4/2004

* cited by examiner

*Primary Examiner* — Tod T Van Roy
(74) *Attorney, Agent, or Firm* — Kilpatrick Townsend & Stockton LLP

(57) ABSTRACT

The present invention provides a device and method for a laser based light source using a combination of laser diode or waveguide gain element excitation source based on gallium and nitrogen containing materials and wavelength conversion phosphor materials designed for inherent safety. In this invention a violet, blue, or other wavelength laser diode source based on gallium and nitrogen materials is closely integrated with phosphor materials, such as yellow phosphors, to form a compact, high-brightness, and highly-efficient, light source with closed loop design features to yield the light source as an eye safe light source.

19 Claims, 31 Drawing Sheets

Schematic diagram of ridge type waveguide gain element or laser diode fabricated on a polar substrate showing cavity architecture and mirrors.

SAFE LASER LIGHT

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

- The conventional light bulb dissipates more than 90% of the energy used as thermal energy.
- The conventional light bulb routinely fails due to thermal expansion and contraction of the filament element.
- The conventional light bulb emits light over a broad spectrum, much of which is not perceived by the human eye.
- The conventional light bulb emits in all directions, which is undesirable for applications requiring strong directionality or focus, e.g. projection displays, optical data storage, etc.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 uW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 uW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

While LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm2 range. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based lightbulb will require 3 mm2 to 30 mm2 of epi area. A second limitation of LEDs is also related to their brightness, more specifically it is related to their spatial brightness. A conventional high brightness LED emits ~1 W per mm$^2$ of epi area. With some advances and breakthrough perhaps this can be increased up to 5-10× to 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

Although useful, LEDs still have limitations that are desirable to overcome in accordance to the inventions described in the following disclosure.

SUMMARY

The present invention provides a device and method for an eye safe electromagnetic radiation source using a combination of laser diode excitation source or waveguide gain element such as superluminescent diode (SLED) based on gallium and nitrogen containing materials and light emitting/conversion source based on phosphor materials. In some embodiments of this invention a violet emitting, blue emitting, or other wavelength emitting waveguide gain element or laser diode source based on gallium and nitrogen materials is closely integrated with phosphor materials, such as yellow phosphors or a red and green phosphor, or a red, yellow, and green phosphor, to form a compact, high-brightness, and highly-efficient, white light source with novel configurations designed for eye safety. Specifically, the novel configurations for safety are designed to prevent environmental exposure of laser beams in case the light sources were to become compromised. In some embodiments, the novel safety features are designed to terminate lasing action from the laser based light source by altering the electrical circuit, optical circuit, or optical feedback into the laser gain element to drop the laser below the threshold condition. In some examples, all optical output power from the laser based light source would cease and in other cases the output optical power level and coherence would be greatly reduced to an eye safe level. In all embodiments we refer to the safety features a being "inherent" indicating that they are designed to be self-contained with a closed loop and not needing to interact with external monitoring or computing devices. In an example, the source can be provided for specialized applications, among general applications, and the like.

This invention includes laser-based light systems designed for user and environmental safety. More specifically, the light systems typically include a gallium and nitrogen containing waveguide gain element such as a SLED or laser diode excitation source coupled to a wavelength conversion element and employs novel designs to eliminate the possibility of laser beam exposure to the outside environment in the case that the wavelength conversion material is damaged or displaced from the optical pathway of the laser beam. This invention includes a gallium and nitrogen containing gain element or laser diode with a cavity comprising a waveguided gain medium with a pair of mirrors on the two ends of the cavity to provide feedback into the gain medium. The waveguide gain element or laser diode gain medium is configured with electrical inputs for electrical pumping to provide optical gain within the cavity. In a first group of embodiments, the wavelength converter material is coupled to at least one of the pair of mirrors such that if the wavelength converter material is removed or damaged the mirror will cease to provide feedback to the gain medium and the laser will fall below the threshold condition and stop lasing. In a second group of embodiments, the wavelength converter material is coupled to the electrical input such that if the wavelength converter material is removed or damaged the electrical input will cease to excite the gain medium and the laser light source will turn-off. In a third group of embodiments, detection and/or sensor schemes are employed to determine if the wavelength conversion material is damaged or removed from the optical pathway of the laser beam. Upon sensing such an event, a break in the electrical input or optical feedback to the gain medium will be triggered and the laser will cease to lase. In all group of these novel inherent safety features designed for laser based light sources, the safety features are self-contained with a closed loop and not needing to interact with external monitoring or computing devices.

Additional benefits are achieved over pre-existing techniques using the present invention. In particular, the present invention enables a cost-effective laser based light source such as a white light source with inherent safety features protecting the user and environment from laser related hazards. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing waveguide gain element or laser diode source is based on c-plane gallium nitride material and in other embodiments the gallium and nitrogen containing waveguide element laser diode is based on nonpolar or semipolar gallium and nitride material. In one embodiment the laser based light source is configured from a chip on submount (CoS) with an integrated phosphor on the submount to form a chip and phosphor on submount (CPoS) white light source.

In various embodiments, the waveguide gain element or laser device and one or more phosphor members are mounted on a common support member with or without intermediate submounts and the phosphor members are operated in a transmissive mode or a reflective mode to result in a laser-based light source. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, transformations, transportations, leveling, curing and other chemical treatments, heating, cutting and/or ablating, pumping other optical devices, other optoelectronic devices and related applications, and source lighting and the like.

Laser diodes and superluminescent diodes (SLEDs) are ideal as phosphor excitation sources. With a spatial brightness (optical intensity per unit area) greater than 10,000 times higher than conventional LEDs and the extreme directionality of the laser or SLED emission, laser diodes and SLEDs enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm2, 100 W/mm2, or even over 2,500 W/mm2 can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 microns, or 50 microns, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

Due to the high spatial brightness, high coherence, and the extreme directionality of laser diode output beams, direct or reflected exposure to the laser beam by a human, animal, or outside environment can pose serious hazards such as a damage to eyesight, blindness, burning of materials including flesh, and damage to any objects in the optical pathway. Therefore, extreme consideration and design effort must be exercised in any laser based light system to avoid such exposures to the laser beam. The laser based light system should be configured in a way such that in the event that the system is intentionally or unintentionally damaged or tampered with there there could not be an exposed laser beam. In the present invention eye safe laser based light sources and systems are described that employ specific and novel designs, to prevent inadvertent or intentional beam exposure to the environment In some embodiments of this invention, the eye safe laser light source is configured with a gallium and nitrogen containing waveguide gain element, a first and a second mirror providing optical feedback to the gain medium to form a cavity and achieve a lasing condition, and a wavelength conversion member such as a phosphor. The output of the eye safe laser light source is a white light output for example wherein the white light is comprised of a yellow emission from a wavelength conversion member such as a phosphor member excited by a blue light and a scattered blue light from the gain medium or is comprised of multiple colors emitted from wavelength conversion members such as a blue and yellow phosphor member excited with a violet emission from the gain medium or a red, green, and a blue phosphor member excited from a violet emission from the gain medium. In this embodiment, the output in standard operation of the laser based light source is eye safe due to the incoherent nature of the emission and reduced directionality. Since all or most of the emission is comprised of wavelength converted emission from phosphor member emitting incoherent light in a Lambertian pattern and scattered light emitted from a laser source, the total coherence and directionality of the light source can be considered eye safe with appropriate design.

In a preferred first category of this novel eye safe laser light source invention, a design inherent safety feature requires that at least one of the first or second mirrors is integrated with or coupled to the wavelength conversion material such that if the wavelength conversion material is damaged or compromised the optical feedback to the gain element is reduced and laser operation is ceased. In preferred embodiments of this invention the wavelength conversion member is a phosphor member. This safety feature is based on the so-called threshold condition of a laser system. The threshold condition is achieved when the gain inside the laser cavity is equal to all of the losses within the cavity wherein the losses include absorption loss, scattering loss, radiation loss, and the useful output of the laser which is also a loss from the cavity. In this invention, the gain is achieved in a gallium and nitrogen containing material typically configured in a waveguide wherein the light propagates. Gain is provided through an electrical pumping of the gallium and nitrogen containing gain medium, which creates a population inversion in the light emitting layers comprised of quantum wells or double hetereostructures. As the electrical pumping is increased through an increase in carrier density in the light emitting layers, the gain of the waveguide gain element increases until the gain equals the losses. At this so-called threshold condition stimulated emission takes over and the optical output power versus electrical input current characteristic exhibits a strong knee where the optical output power and spectral coherence rapidly increases. Above this threshold condition the laser is "lasing" and below this condition the output power is much lower [$1/10$ to $1/1000$] with drastically less coherence [$1/2$ to $1/1000$]. In this category of eye safe laser light source designs one or more of the mirrors comprising the laser cavity is coupled to the wavelength conversion material. If this wavelength conversion material is damaged or compromised, the feedback into the cavity would drastically reduce and hence increase the losses in the cavity such that the losses would exceed the gain and hence the laser would cease to maintain lasing operation falling below the threshold condition.

In a preferred embodiment in the first category of this invention an external cavity wavelength conversion configuration is formed. In this embodiment a gallium and nitrogen containing waveguide gain element is configured to emit a violet or blue wavelength and is configured with two ends of the waveguide. The first end of the waveguide is configured as a reflector and serves as the first cavity mirror of the laser diode providing strong optical feedback into the gain element. This first end mirror can be formed with a facet that can optionally be coated with a layer or layer stack that further increases the reflectivity. For example, the reflectivity of this first end can be increased to greater than 85% or 95%. The second end of the waveguide is configured for a reduced reflectivity for a low optical feedback to the gain element. The reduced reflectivity can be achieved with output facets angled relative to the waveguide and/or with optical coatings configured to reduce the reflectivity. For example, the reflectivity of this second end can be reduced to less than 5%, 1%, 0.1%, or 0.001%. The violet or blue wavelength output beam from the gain element exits this second end and is incident on a first surface of the wavelength conversion material where it excites the conversion material and generates at least a second wavelength. In one example of this preferred embodiment, the first surface of the wavelength conversion material itself is configured as the second mirror of the laser light source to complete the cavity. In this example the first surface functions to reflect a fraction of the violet or blue emission back into the gain element providing the optical feedback necessary to achieve the lasing condition. In another example of this preferred embodiment, a reflector member is configured on or coupled to the first surface of the wavelength conversion member. The reflector member serves as the second mirror of the laser light source to complete the cavity and functions to reflect a fraction of the violet or blue emission back into the gain element providing the optical feedback necessary to achieve the lasing condition. Since the wavelength conversion member is positioned just outside the cavity this preferred embodiment is an external cavity wavelength conversion configuration.

In this preferred embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member with the coupled reflector is positioned at a certain distance from the second end of the waveguide gain element. This distance or gap between the waveguide gain element and the phosphor can be comprised of free-space such that the violet or blue beam exiting the second end of the waveguide gain element travels through a free space before being reflected from the second mirror configured to be coupled to the first surface of the phosphor member. In another example the distance or gap between the second end of the waveguide gain element and the first surface of the phosphor wavelength conversion element is filled with a selected material. In yet another example the phosphor wavelength conversion member is fixed or attached to the second end of waveguide gain element. In this configuration intermediate layers or adhesive materials can be positioned between the first surface of the phosphor member or the wavelength conversion member and the waveguide gain element.

As described above, in this preferred embodiment the wavelength conversion member or phosphor member has two primary surfaces. The first surface can itself be configured to reflect the incident violet or blue light back into the gallium and nitrogen containing gain medium and complete the cavity or can be configured with a reflector member to enhance the reflection properties from the first surface. The first surface and/or the reflector member on the first surface is designed to reflect a first fraction of the incident beam back into the gain element and allow a second fraction of the beam to pass into the wavelength conversion member where at least a second wavelength is generated. The first fraction of light reflected back into the gain element is required to maintain the laser light source in a state of lasing and the second fraction of light exciting the wavelength conversion material is required to generate the eye safe light output from the laser light source. Since the second mirror forming the cavity is integrated with or coupled to the first surface of the wavelength conversion material as a reflector, if the wavelength conversion material is damaged, removed, displaced, or compromised it will directly affect or impair the optical feedback into the laser cavity. This impaired feedback results in an increased loss within the laser cavity and drops the laser below the threshold condition wherein the output optical power and coherence substantially reduces to a level of eye safety.

The second surface of the wavelength conversion member is configured for emission of the output light from laser based light source. In a preferred embodiment the second surface is outfitted with a reflection modification member or process to increase the extraction of useful output light. For example, the reflection modification member or process would be configured to increase the extraction of the light generated in the wavelength conversion member. In another example, the reflection modification member or process would be configured to increase the extraction of the light generated in the wavelength conversion member and the light generated in the gallium and nitrogen containing waveguide gain member. Specifically, reflection modification members or processes could include optical coatings, shaping, roughening, or other measures applied to the second surface of the wavelength conversion material. Roughening of the phosphor member has been shown to be an effective method to reduce the amount of light reflected back into a phosphor or other wavelength conversion member and thereby increasing the extraction. There are several methods to inducing a roughening effect on the surface of the phosphor including in the formation process, with a wet chemical etching process, with a dry etching process, with a physical process, and could be other processes. By reducing the reflectivity of this surface to the useful output light wavelengths such as blue and yellow wavelengths or red, green, and blue wavelengths the useful light output from the laser based light source will be increased.

In this preferred external cavity wavelength conversion laser light source embodiment, the reflector members or reflection modification members can be configured and formed in several ways. For example, the reflector member can be an optical coating deposited directly on the phosphor wherein the coating is designed to provide a specified reflectivity for the blue or violet beam. The coating can be formed from a distributed feedback reflector (DBR) configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements. In some configurations the reflector member is attached to the wavelength conversion member using a method such as gluing, brazing, soldering, bonding such as thermo-compression bonding, etc, but can be others.

Multiple reflector characteristics and/or members can be deployed to form a reflector system on this first surface of the wavelength conversion member. For example, the reflector system can be designed to reflect the violet or blue wavelength beam as described above and additionally provide a designed reflectivity to the wavelength converted light to provide a reflection from within the wavelength conversion material off the first surface and increase the extraction of light through the second surface. Moreover, optical coatings, shaping, roughening, or other measures can be applied to the second surface of the wavelength conversion material to enhance extraction and increase the light output from the laser based light source.

In one example of this preferred external cavity wavelength conversion embodiment, the beam exiting the gain element has a blue wavelength to excite a phosphor conversion member to convert a fraction of the blue beam to a yellow light such that a resulting blue and yellow color combination provides a white light output. In a second example of this preferred embodiment, the beam exiting the gain element has a violet wavelength to excite phosphor conversion members to convert a fraction of the violet beam to a yellow light and a blue light such that a resulting blue and yellow color combination provides a white light output. In a third example of this preferred embodiment configured for an improved white light quality, the beam exiting the gain element has a violet wavelength to excite phosphor conversion members to convert a fraction of the violet beam to a red light, green light, and blue light such that a resulting red, green, and blue color combination provides a white light output.

In an alternative preferred embodiment of this first category of the present invention, an intra-cavity wavelength conversion laser light source is formed. In this embodiment, most elements of the laser light source configuration are identical to the external cavity wavelength conversion configuration described above with one main difference. This main difference being that the reflector member integrated with the wavelength conversion member forming the second mirror of the cavity is positioned on the second surface of the wavelength conversion member as opposed to the first surface. In this configuration the blue or violet output beam from the waveguide gain element enters the wavelength conversion member through the first surface, propagates through the conversion member where a fraction of the blue or violet light is converted, a portion is reflected back off the second surface of the conversion member where the second mirror of the laser source is configured, backward propagates through the conversion member, out the first surface, and back into the waveguide gain element for feedback. In this design, the wavelength conversion material is positioned between the first and second mirror of the laser light source forming an intra-cavity wavelength conversion characteristic. Since the second mirror forming the cavity is integrated with or coupled to the second surface of the wavelength conversion material as a reflector, if the wavelength conversion material is damaged, removed, displaced, or compromised it will directly affect or impair the optical feedback into the laser cavity. This impaired feedback results in an increased loss within the laser cavity and drops the laser below the threshold condition wherein the output optical power and coherence substantially reduces to a level of eye safety.

In this preferred intra-cavity wavelength conversion laser light source embodiment, the second mirror is configured as the second surface of the wavelength conversion member either as the surface itself or as the surface coupled to an additional reflector member. In the case where the excitation wavelength from the gallium and nitrogen containing gain element is not a critical element of the useful output spectrum, such as in the example of a violet excitation source for white light, the reflectivity of this second surface to the excitation light can be made very high [i.e. >70%, >80%, >90%] to contain most of the excitation light in the cavity. However, in the case where the excitation wavelength is required in the output spectrum, such as in a blue excitation and a blue plus yellow white light source, the reflectivity would need to be tuned to allow the appropriate amount of blue light escape. The reflector member can be configured and formed in several ways on the second surface of the wavelength conversion member material. For example, the reflector member can be an optical coating deposited directly on a phosphor wherein the coating is designed to provide a reflectivity characteristic for the blue or violet beam. The coating can be formed from a DBR configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements providing a reflectivity characteristic. In some configurations the reflector member is attached to the wavelength conversion member using a method such as gluing, brazing, soldering, bonding such as thermo-compression bonding, etc, but can be others.

Multiple reflector characteristics and/or members can be deployed to form a reflector system on the second surface of the wavelength conversion member such as a phosphor member. For example, the reflector system can be designed to reflect the violet or blue wavelength beam as described above and additionally provide a very low reflectivity or anti-reflection to the wavelength converted light [such as yellow light in a blue-excited blue plus yellow white source or red, green, and blue light in violet excited red plus green plus blue white source] to increase the extraction of the useful output light. This can be achieved through overlaying multiple reflectors or designing a single reflector to possess both of these elements. Different filter or reflector designs can be implemented such as bandpass filters, notch filters, low pass filters, and high pass filters. Deposition techniques such as electron beam, sputtering, evaporating, or epitaxial methods can be used.

In this configuration, careful considerations and measures must be paid to the first surface of the wavelength conversion member. This surface should be configured for a low reflectivity or anti-reflectivity of the blue or violet light to let it freely pass into and out of the wavelength converter material. Simultaneously, this surface should be reflective or highly reflective to the wavelength converted light such that the useful converted light is not lost through the first surface and the extraction through the second surface is maximized. Different filter or reflector designs can be implemented such as bandpass filters, notch filters, low pass filters, and high pass filters. Deposition techniques such as electron beam, sputtering, evaporating, or epitaxial methods can be used.

In one example of this preferred intra-cavity wavelength converted light source embodiment, the beam exiting the gain element has a blue wavelength to excite a phosphor conversion member to convert a fraction of the blue beam to a yellow light such that a resulting blue and yellow color combination exiting the second surface of the wavelength conversion materials provides a white light output. In a second example of this preferred embodiment, the beam exiting the gain element has a violet wavelength to excite a first wavelength conversion member to convert a fraction of the violet beam to a blue light and the remaining violet beam and/or a fraction of the blue converted light excites a second wavelength conversion member emitting yellow light such that a resulting blue and yellow wavelength converted light combination provides a white light output. In a third example of this preferred embodiment, the beam exiting the gain element has a violet wavelength to excite a first wavelength conversion member to convert a fraction of the violet beam to a blue light, a fraction of the remaining violet beam and/or a fraction of the blue converted light excites a second wavelength conversion member emitting green light, a fraction of the remaining violet beam and/or a fraction of the blue converted light and green converted light excites a third wavelength conversion member emitting red light such that a resulting blue, green, and red wavelength converted light combination provides a white light output.

In this preferred external cavity wavelength conversion embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member or phosphor member is positioned at a certain distance from the second end of the waveguide gain element. This distance or gap between the waveguide gain element and the phosphor can be comprised of free-space such that the violet or blue beam exiting the second end of the waveguide gain element travels through a free space before entering the phosphor member through the first surface. In another example the distance or gap between the second end of the waveguide gain element and the first surface of the phosphor wavelength conversion element is filled with another material. In yet another example the phosphor wavelength conversion member is fixed or attached to the second end of waveguide gain element. In this configuration intermediate layers or adhesive materials can be positioned between the waveguide gain element and the first surface of the phosphor member or wavelength conversion member.

In both the intra-cavity and external cavity embodiments of this first category of eye-safe laser light sources, the the wavelength converter material is preferably a phosphor material. The phosphor material can be operated in a transmissive mode, a reflective mode, or a combination of a transmissive mode and reflective mode, or other modes. For best performance, the phosphor material is preferably comprised of a single crystal YAG or a ceramic YAG based phosphor. The phosphor material is characterized by a conversion efficiency, a resistance to thermal damage, a resistance to optical damage, a thermal quenching characteristic, a porosity to scatter excitation light, and a thermal conductivity. In some embodiments the phosphor may have an intentionally roughened surface to increase the light extraction from the phosphor. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the gallium and nitrogen containing gain element or laser diode device to generate the beam and excite the phosphor material. The white light source configured to produce greater than 1 lumen, 10 lumens, 100 lumens, 1000 lumens, or greater of white light output. The support member is configured to transport thermal energy from the at least one gallium and nitrogen containing gain element or laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

The preferred second category of this novel eye safe laser light source invention is based on a modification of the electrical inputs to the gain element of the laser diode. Specifically, the design inherent safety feature configures the electrical input circuitry to drive the laser with the wavelength conversion material such that if the wavelength conversion material is damaged or compromised the electrical input to the gain element is reduced or terminated and laser operation is ceased. Like the first category of eye-safe laser light source designs, this safety feature is based on the so-called threshold condition of a laser system since by reducing the electrical input the gain will be reduced or eliminated. If this wavelength conversion material is damaged or compromised, the electrical input to the gain region would drastically reduce and the losses would exceed the gain and hence the laser would cease to maintain lasing operation falling below the threshold condition and/or completely shut off.

In a preferred embodiment of this second category of the present invention, the eye safe laser light source is configured with a gallium and nitrogen containing laser diode configured with facets on the two ends of the laser diode cavity, a wavelength conversion member such as a phosphor, and a carefully designed electrical circuits or electrodes. The output of the eye safe laser light source is a white light output for example wherein the white light is comprised of a yellow emission from a wavelength conversion member such as a phosphor member excited by a blue laser diode and a scattered blue light from the laser diode or is comprised of multiple colors emitted from wavelength conversion members such as a blue and yellow phosphor member excited with a violet laser diode or a red, green, and a blue phosphor member excited from a violet laser diode.

In a preferred embodiment in the second category of this invention an external cavity wavelength conversion configuration is formed with an electrical safety feature. In this embodiment a gallium and nitrogen containing laser diode is configured to emit a violet or blue wavelength. The laser diode comprises a cavity member configured with a waveguide gain element for providing optical gain. An electrical input conductor configured to provide electrical current to the waveguide gain element from an input power source. The laser diode further comprises a first end and a second end wherein the first and second ends are configured as mirrors to provide optical feedback to the waveguide gain element forming the cavity. This first and second end mirrors can be formed with a facet formation and can optionally be coated with a layer or layer stack that further increases or decreases the reflectivity. For example, to improve the light output from the second end the reflectivity of first end can be increased to greater than 85% or greater than 95%. Further, the second end can be configured for a reduced reflectivity to allow more useful light to escape the cavity. The reduced reflectivity can be achieved with optical coatings configured to reduce the reflectivity to less than 15%, 10%, 5%, or 3%. The violet or blue wavelength output beam from this laser diode is incident on a first surface of the wavelength conversion material where it passes into and excites the wavelength conversion material to generate at least a second wavelength. Since the wavelength conversion member is positioned just outside the cavity this preferred embodiment is an external cavity wavelength conversion configuration.

The inherent safety design feature of this embodiment is based in the electrical circuit or electrodes that route the input electrical current to the gain medium of the laser diode. In a preferred embodiment the electrical conducting element is physically coupled to the wavelength conversion or phosphor member in a configuration such that if the wavelength conversion member or phosphor is damaged, compromised, or removed, the electrical input to the gain medium will be terminated and the laser diode will turn-off. In one preferred example the electrical conducting element comprises metallic layers such as gold layers deposited on surfaces of one or more of the laser diode, wavelength conversion element, and common support member. In another example, the electrical conducting elements comprise wires such as wires formed with a wirebond tool.

In a first configuration of this second category of an eye safe laser based light source the phosphor member is comprise an electrical conductor along at least a portion of the edge surfaces on the perimeter of the phosphor. The electrical conductor functions to transmit the input electrical input from the power source to the gain element of the laser diode. If the phosphor member is removed, partially removed, breaks, partially breaks, or is damaged the electrical conductor on the phosphor is compromised reducing or terminating the electrical input to the laser diode gain element and thereby dropping the laser diode below the threshold condition and ceasing laser operation.

In a first configuration of this second category of an eye safe laser based light source the phosphor member comprises an electrical conductor along at least a portion of the edge surfaces on the perimeter of the phosphor. The electrical conductor functions to transmit the input electrical input from the power source to the gain element of the laser diode. If the phosphor member is removed, partially removed, breaks, partially breaks, or is damaged the electrical conductor on the phosphor is compromised reducing or terminating the electrical input to the laser diode gain element and thereby dropping the laser diode below the threshold condition and ceasing laser operation.

In a second configuration of this second category of an eye safe laser based light source the phosphor member comprises an electrical conductor along at least a portion of a first edge surface on the perimeter of the phosphor. The first edge surface on the perimeter of the phosphor with the electrical conductor is the then bonded to a submount with electrical traces. The electrical traces on the submount are configured to transmit the electrical input from the power source to the gain element of the laser diode. The electrical trace pattern is configured with an "open" or gap on the submount such that there is a break in the electrical conduction path to the laser diode gain element. The first edge surface on the perimeter of the phosphor with the conductor is bonded the traces on the submount to close the gap or open in the electrical traces, closing the circuit and completing the circuit allowing current to conduct from the input power source to the gain element of the laser diode. If the phosphor member is removed or broken off the submount the conduction path from the electrical input source to the laser diode gain element is opened cutting off current conduction to the laser diode and thereby dropping the laser diode below the threshold condition and ceasing laser operation.

In a third configuration of this second category of an eye safe laser based light source the phosphor member comprises an electrical conductor along at least a portion of a first edge surface on the perimeter of the phosphor. The first edge surface on the perimeter of the phosphor with the electrical conductor is preferably at top edge of the phosphor. The phosphor member is mounted to a submount member or a common support with the laser diode. Electrical traces on the submount are configured to support transmission of the electrical input from the power source to the gain element of the laser diode. The electrical trace pattern is configured with an "open" or gap on the submount such that there is a break in the electrical conduction path to the laser diode gain element. One or more first wirebonds are formed from a first location on the electrical trace to the electrical conductor on the first edge of the phosphor member. One or more second wirebonds are additionally configured from the electrical conductor on the first edge of the phosphor member to a second location on the metal trace or directly to the laser diode chip. The first and second wirebonds are configured to close the gap and hence close the circuit to complete the circuit allowing current to conduct from the input power source to the gain element of the laser diode. If the phosphor member is removed or broken off the submount the wirebonds will break and the conduction path from the electrical input source to the laser diode gain element is will be opened, cutting off current conduction to the laser diode and thereby dropping the laser diode below the threshold condition and ceasing laser operation.

In a fourth configuration of this second category of an eye safe laser based light source an electrical element such as a thermal fuse is integrated into the package with the phosphor member. Thermal fuses are simple devices configured to conduct electricity under normal operation and typically consist of a low melting point alloy. In one example, the thermal fuse is comprised of metal material with a low melting point and configured to rapidly heat when irradiated directly or indirectly with the violet or blue laser beam light. The rapid heat rise in the thermal fuse material causes the material to melt, creating a discontinuity in the fuse metal which opens the electrical conduction pathway and prevents current flow through the fuse. Examples of alloys deployed for thermal fuses are given in Table 1.

TABLE 1

| Common Fusible Metals and Alloys and their metal Temperatures (Wikipedia) Alloy Composition | Melting Temp (C.) |
|---|---|
| Bi 32.5, In 51.0, Sn 16.5 | 60.5 |
| Bi 50, Pb 26.7, Sn 13.3, Cd 10 | 70 |
| Bi 49.5, Pb 27.3, Sn 13.1, Cd 10.1 | 70.9 |
| Bi 50.0, Pb 25.0, Sn 12.5, Cd 12.5 | 71 |
| In 66.3, Bi 33.7 | 72 |
| Bi 42.5, Pb 37.7, Sn 11.3, Cd 8.5 | 74 |
| Bi 56, Sn 30, In 14 | 79-91 |
| Bi 50, Pb 30, Sn 20, Impurities | 92 |
| Bi 52.5, Pb 32.0, Sn 15.5 | 95 |
| Bi 52, Pb 32.0, Sn 16 | 96 |
| Bi 50.0, Pb 31.2, Sn 18.8 | 97 |
| Bi 50.0, Pb 28.0, Sn 22.0 | 94-98 |
| Bi 56.5, Pb 43.5 | 125 |
| Bi 56, Sn 42 | 138 |
| Bi 57, Sn 43[10] | |
| In 100 | 157 |
| Sn 62.3, Pb 37.7 | 183 |
| Sn 63.0, Pb 37.0 | 183 |
| Sn 91.0, Zn 9.0 | 198 |
| Sn 92.0, Zn 8.0 | 199 |
| Sn 100 | 231.9 |
| Bi 100 | 271.5 |

In this embodiment of the present invention, one or more thermal fuses are contained within the electrical pathway providing the current input from an external power source to the gain element of the laser diode. The one or more thermal fuses are physically positioned in locations where the output of the violet or blue laser beam would be incident on it in the case that the phosphor member is comprised, broken, or removed. That is, the thermal fuse is placed in the package where the beam is not expected to be unless an upstream failure in the beam line has occurred. In the case of such an event, the violet or blue laser light would irradiate the fuse material inducing a temperature rise at or above the melting point and hence causing a melting of one or more thermal fuse elements. This melting would then open the electrical pathway and break the electrical circuit from the external power supply to the laser diode gain element and thereby shutting the laser device off. In this preferred example, the thermal fuse could cutoff power to the laser without requiring external control mechanisms.

There are a number of variations on the fusible alloy thermal fuse structure according to the present invention. In another example, one could utilize a tensioned spring which is soldered in place inside a ball of fusible allow. The spring and alloy provide the electrical circuit. When the alloy becomes soft enough, the spring pulls free, thereby breaking the circuit connection. In some embodiments the melting point could be suitably chosen to only break connection in the operating device when a sufficient temperature had been met or exceeded.

The above configurations of the present invention are merely examples of design inherent safety features based on modification of the electrical input to the laser diode or gain element. There are many other possible configurations that could modify the electrical input to the laser diode in the event the phosphor is compromised.

In this embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member or phosphor member is positioned at a certain distance from the second end of the waveguide gain element. This distance or gap between the waveguide gain element and the phosphor can be comprised of free-space such that the violet or blue beam exiting the second end of the waveguide gain element travels through a free space before entering the phosphor member through the first surface. In another example the distance or gap between the second end of the waveguide gain element and the first surface of the phosphor wavelength conversion element is filled with another material. In yet another example the phosphor wavelength conversion member is fixed or attached to the second end of waveguide gain element. In this configuration intermediate layers or adhesive materials can be positioned between the waveguide gain element and the first surface of the phosphor member or wavelength conversion member.

In this preferred embodiment the wavelength conversion member or phosphor member has two primary surfaces. The first surface is preferably configured with an anti-reflection element such as a coating to reduce the reflection of the excitation blue or violet wavelength from the surface and enable most efficient optical coupling of the excitation source to the wavelength conversion material. Similarly, the first surface can be treated with coatings or members to increase the reflectivity of the converted light to reduce the amount of potentially useful light escaping the backside of the phosphor where it will be useful, hence increasing the extraction efficiency and the overall efficiency of the light source.

In preferred embodiments, the second surface of the phosphor member is preferably configured with an anti-reflection element such as a coating or roughening to reduce the reflection of the desired output wavelengths such as the wavelengths emitted from the wavelength conversion material and the laser diode excitation wavelength in the configuration where the excitation laser light comprises a portion of the desired output light such as blue laser light. By application of this anti-reflection coating the amount of useful light output or extraction of light from the wavelength conversion element will be increased and the overall efficiency will be increased. In a case where the laser excitation light is not part of the useful light output spectrum, an element to increase the reflectivity of the excitation source wavelength on this second surface can be implemented. This increased reflectivity will improve efficiency by reducing the amount of excitation light escaping the wavelength conversion material without creating a wavelength conversion event. The anti-reflector and reflector members can be an optical coating deposited directly on a phosphor wherein the coating is designed to provide a specified reflectivity for the excitation light or the useful output of the light source. The coating can be formed from a DBR configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements. In some configurations the reflector member is attached to the wavelength conversion member using a method such as gluing, brazing, soldering, bonding such as thermo-compression bonding, etc, but can be others.

In one example of this preferred embodiment, the laser diode has a blue wavelength to excite a phosphor conversion member to convert a fraction of the blue beam to a yellow light such that a resulting blue and yellow color combination provides a white light output. In a second example of this preferred embodiment, the beam exiting the laser diode has a violet wavelength to excite phosphor conversion members to convert a fraction of the violet beam to a yellow light and a blue light such that a resulting blue and yellow color combination provides a white light output. In a third example of this preferred embodiment configured for an improved white light quality, the beam exiting the laser diode has a violet wavelength to excite phosphor conversion members to convert a fraction of the violet beam to a red light, green light, and blue light such that a resulting red, green, and blue color combination provides a white light output. The above configurations are just merely examples. Of course there can be other configurations and phosphor colors.

The preferred third category of this novel eye safe laser light source invention is based on active feedback sensors. Specifically, the design inherent safety feature is configured with active sensors monitoring the operation of the light source and ensuring that it is functioning as designed in a safe mode. Specifically, the feedback sensors are configured to ensure that the wavelength conversion material is actively converting the potentially dangerous laser output beam from the laser diode to an incoherent eye-safe output light. If a sensor indicates a deviation from this designed operation the electrical or optical input to the laser will be modified or reduced and subsequently drop the laser to below the threshold condition and cease laser operation. An important novelty of this inherent safety design features based on active feedback sensors is that it is a self-contained feedback loop such that there are no external computer interfaces or electronics communications with the laser source required to cease the operation.

In a preferred embodiment in the third category of an eye safe laser light source with active feedback sensor devices the laser light sources is an external cavity wavelength conversion configuration. In this embodiment a gallium and nitrogen containing laser diode is configured to emit a violet or blue wavelength. The laser diode comprises a cavity member configured with a waveguide gain element for providing optical gain. An electrical input conductor configured to provide electrical current to the waveguide gain element from an input power source. The laser diode further comprises a first end and a second end wherein the first and second ends are configured as mirrors to provide optical feedback to the waveguide gain element forming the cavity. This first and second end mirrors can be formed with a facet formation process such as cleaving or etching and can optionally be coated with a layer or layer stack that further increases or decreases the reflectivity. For example, to improve the light output from the second end the reflectivity of first end can be increased to greater than 85% or greater than 95%. Further, the second end can be configured for a reduced reflectivity to allow more useful light to escape the cavity. The reduced reflectivity can be achieved with optical coatings configured to reduce the reflectivity to less than 15%, 10%, 5%, or 3%.

In this preferred embodiment the violet or blue wavelength output beam from this laser diode is incident on a first surface of the wavelength conversion material where it passes into and excites the wavelength conversion material to generate at least a second wavelength. Since the wavelength conversion member is positioned just outside the cavity this preferred embodiment is an external cavity wavelength conversion configuration.

The inherent safety design feature of this embodiment is based on integrated sensors and feedback loops to cease operation of the laser light source if an un-safe operations state is indicated or detected. The integrated feedback loops including sensors are configured in a self-contained design such that the safety features do not rely on external signal processing or computing to interface with the sensor system. For example, in many laser light source systems today, photodetectors are integrated as a means to detect signal from the laser source emission and/or from the phosphor conversion emission. In these systems computers or signal processing devices are used to monitor the signal from the detectors and react when signals are detected that could indicate an unsafe state of the light source. That is, the reaction is initiated by an external system or electronic system. A common example of a reaction would be to halt power supply to the laser device and thereby ceasing laser operation. In this invention, the "reaction" to the unsafe state is triggered by a component within the self-contained laser safety system.

In a preferred embodiment the electrical input power to the laser diode is coupled via an electro-optic circuit to the optical output of the wavelength conversion or phosphor member with a photo-detector. Specifically, the circuit is configured with a photodetector designed to detect the wavelength converted color such as yellow in a blue+yellow white light source. When the photodector is sensing a sufficient or threshold level of wavelength converted light the circuit is in maintained in an on-state such that the electrical power from the outside source reaches the laser inducing operation of the laser light source. If in the event that the phosphor is damaged, removed, or compromised the amount of wavelength converted light would drop below this threshold level and the circuit would open, halting any power supply to the laser and ceasing laser light source operation. Typically photodetectors generate a photo-induced current, which can optionally be converted to an induced voltage via electrical elements such as a transimpedance amplifier (TIA), which can be operated as an operational amplifier (op-amp).

In one example of this configuration a transistor is used to sense the output of the photodetector and allow sufficient current to flow the laser diode for operation of the laser light source. A transistor is composed of semiconductor material with at least three terminals for connection to an external circuit. In a transistor a first voltage or current applied to one pair of the transistor's terminals changes a second current or voltage through another pair of terminals. The three terminals can be referred to as the gate, source, and drain or as the base, emitter, and collecotr. Transistors can be utilized as switch devices to turn on and off electrical signals and as amplifier devices to increase the current or voltage of an input signal to a much larger output signal. In this invention since the controlled (output) power going to the laser for operation can be much higher than the controlling (input) power from the photodetector, a transistor can use a small input signal from the photocurrent generated in a photodetector to enable the high current or voltage output to the laser diode. There are an assortment of circuit designs that can be used that employ this principle including using multiple transistors, TIAs, operational amplifiers, resistors, capacitors, inductors, and any other circuit elements. Moreover, any of an assortment type of transistor can be used such as field effect transistor (FET), junction field effect transistor (JFET), bi-polar junction transistor (BJT), metal-oxide-semiconductor field effect transistor (MOSFET), metal-semiconductor field effect transistor (MESFET), insulated-gate bipolar transistor (IGBT), high-electron-mobility transistor (HEMT), and "other types" including hetereojunction bipolar transistor (HBT). Additionally, other types of diodes can be included such as schottky diode and pn junction diodes.

A key consideration in the present embodiment of this third category utilizing the output from the photodetector to "turn on" a transistor through the base or gate region is configuring the circuit to initiate. More specifically, without light output from the laser source there will not be wavelength converted light to be detected by the photodetector and "turn on" the circuit enabling the power to reach the laser. Specific design characteristics or features would be used to address this potential issue. One example would be to employ a capacitor or other time dependent circuit element in a configuration such that upon initial start-up or turn on of the light source the safety circuit would be by-passed or over-ridden for a very short period of time.

In the above example embodiments of this third category of laser based light systems with inherent safety designs based on integrated sensors photodiode were implemented to detected a change in the emission from the waveguide converting phosphor member. In those embodiments the safety interlock design is triggered by a reduction in phosphor converted light, which would be an indication that the phosphor was compromised and may lead to an unsafe condition such as an exposed laser beam. In another embodiment, photodiodes intended to detect the light emission from the laser diode or waveguide gain element can be implemented either in combination with or as a replacement for the previous examples. In this embodiment, a photodiode configured to detect the excitation light such as blue or violet emission is spatially positioned in a location such that if the phosphor is compromised the excitation light intensity would increase on the photodiode. This would trigger an increase in photocurrent, which would subsequently de-activate the laser based light source.

The photodiode or photodetector may be configured for a surface normal detection wherein the detected light is incident on the photodiode at about an angle orthogonal to the semiconductor surface area. The light is typically detected with the generation of a photocurrent in a reversed biased semiconductor structure. This surface normal configuration is the conventional design for a discrete photodiode element integrated into the system, but in some embodiments the photodiode can be integrated with the laser diode or waveguide element either in the same epitaxial layer structure, on the same substrate, or mounted on a common support member. In some preferred embodiments the photodiode may be a waveguide photodiode wherein the detected light enters the photodiode from an edge surface into a waveguide where the light is detected with a photocurrent generation typically in a reverse biased semiconductor structure. Waveguide or edge illumination photodiodes may be configured as discrete photodiodes or may be integrated with the light emitter. Discrete photodiodes or other sensor members indicates that that they may be contained within the same package or assembly as the laser diode and could be mounted on the same support member. Monolithically integrated photodiodes are contained on the same chip as the laser diode or waveguide gain element in the laser based light source.

For the monolithic integration of the photodiode with the waveguide gain element or laser diode several approaches can be implemented. A simple and most straightforward embodiment would be to use the same epitaxial structure for the photodector as used for the laser diode or waveguide gain element. In this embodiment n and p contacts would be formed to the detector region similarly or identical to the laser diode or waveguide gain element, but the bias on the photodiode would be a reverse bias to sweep out the photogenerated current. That is, instead of applying a forward bias to induce a gain as in the laser diode, the photodiode is reverse biased to create an absorption. In alternative embodiments of monolithically integrated photodiodes, a selective area growth method or butt-joint regrowth method may be used to define a separate epitaxial structure than the laser diode or waveguide gain element.

In an embodiment with a monolithically integrated waveguide photodiode, the photodiode waveguide could be positioned relative to the laser diode or waveguide gain element in many configurations. In one embodiment it is positioned adjacent to the laser diode or gain element waveguide. In another embodiment the photodiode is spatially positioned behind or in front of the laser diode or waveguide gain element, or some combination of adjacent and behind or in front of. In yet another embodiment, the photodiode waveguide region is positioned along the same waveguide axis as the laser diode or the waveguide gain element. For example, the photodiode can be positioned behind the rear mirror of a laser diode or a SLED. The waveguide photodiode preferably has a similar structure as the laser diode or waveguide gain element, but optionally with different waveguide dimensions. For example, the photodiode waveguide absorption region can be much shorter such as having a length of 25-100 um, 100 to 250 um, or 250 um to 1000 um. The photodiode waveguide absorption waveguide region may also have a different width to improve its performance such as having a wider width of 15 um to 100 um or a narrower width of 1 um to 15 um. In alternative embodiments, surface normal photodiodes are integrated with the laser diodes or waveguide gain elements.

Active safety measures can make use of integrated active components. Example active components include photodiodes/photodetectors, thermistors, thermocouples, and others. Strategically located photodetectors designed to detect direct blue emission from the laser, scattered blue emission, or phosphor emission such as yellow phosphor emission can be used to detect failures of the phosphor where a blue beam could be exposed. Upon detection of such an event, a close circuit or feedback loop would be configured to cease power supply to the laser diode and effectively turn it off. As an example, a detector used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system. In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and deactivate it. Of course these are merely example embodiments, there are several configurations for photodiodes and/or thermistors to be integrated with a laser based white light source to form a safety feature such as a feedback loop to cease operation of the laser.

Of course other safety elements can be incorporated to any embodiment of the present invention. For example passive safety design features and measures can be employed. Passive safety measures can include positioning the laser beam with respect to the phosphor in a way such that if the phosphor is removed or damaged, the exposed laser beam would not make it to the outside environment in a harmful form such as collimated, coherent beam. More specifically, the light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor. The beam dumps, absorbing material, or scattering material will attenuate the power of the laser beam and make it incoherent.

In one embodiment, the present invention provides a laser-based eye safe white light source comprising a form factor characterized by a length, a width, and a height. The apparatus has a support member and at least one gallium and nitrogen containing waveguide gain element or laser diode devices and phosphor material overlying the support member. The waveguide gain element or laser device is capable of an emission of a laser beam with a wavelength preferably in the blue region of 425 nm to 475 nm or preferably in the ultra violet or violet region of 380 nm to 425 nm, but can be other such as in the cyan region of 475 nm to 510 nm or the green region of 510 nm to 560 nm. In a preferred embodiment the phosphor material can provide a yellowish emission in the 550 nm to 590 nm range such that when mixed with the blue emission of the laser diode a white light is produced. In other embodiments phosphors with red, green, yellow, and even blue emission can be used in combination with the laser diode excitation source to produce a white light with color mixing.

The apparatus can have a free space with a non-guided waveguide gain element or laser beam characteristic transmitting the emission of the beam from the waveguide gain element or laser device to the phosphor material. The beam spectral width, wavelength, size, shape, intensity, and polarization are configured to excite the phosphor material. The beam can be configured by positioning it at the precise distance from the phosphor to exploit the beam divergence properties of the waveguide gain element or laser diode and achieve the desired spot size. In one embodiment, the incident angle from the laser to the phosphor is optimized to achieve a desired beam shape on the phosphor. For example, due to the asymmetry of the aperture and the different divergent angles on the fast and slow axis of the beam the spot on the phosphor produced from a waveguide gain element or laser that is configured normal to the phosphor would be elliptical in shape, typically with the fast axis diameter being larger than the slow axis diameter. To compensate this, the waveguide gain element or laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 20 W.

In a preferred configuration of this laser-based eye safe white light source, the common support member comprises the same submount that the gallium and nitrogen containing waveguide gain element or laser diode chip is directly bonded to. That is, the waveguide gain element or laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The waveguide gain element or laser diode can be attached to a first surface of the submount using conventional die attaching techniques using solders such as AuSn solder, SAC solder, lead containing solder, or indium, but can be others. Similarly, the phosphor material may be bonded to the submount using a soldering technique, but it can be other techniques such as gluing technique or epoxy technique. Optimizing the bond for the lowest thermal impedance is a key parameter for heat dissipation from the phosphor, which is critical to prevent phosphor degradation and thermal quenching of the phosphor material.

In an alternative configuration of this laser-based eye safe white light source, the waveguide gain element or laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, but can be other techniques such as. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper. The phosphor material may be bonded using a soldering technique. In this configuration, the common support member should be configured of a thermally conductive material such as copper or copper tungsten. Optimizing the bond for the lowest thermal impedance is a key parameter for heat dissipation from the phosphor, which is critical to prevent phosphor degradation and thermal quenching of the phosphor material.

In yet another preferred variation of this laser-based eye safe white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a waveguide gain element or laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to to the submount using conventional die attaching techniques using solders such as AuSn solder, SAC solder, lead containing solder, or indium, but can be others. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In all embodiments of the laser-based eye safe white light source final packaging would need to be considered. There are many aspects of the package that should be accounted for such as form factor, cost, functionality, thermal impedance, sealing characteristics, and basic compatibility with the application. Form factor will depend on the application, but in general making the smallest size packaged white source will be desirable. Cost should be minimized in all applications, but in some applications cost will be the most important consideration. In such cases using an off-the-shelf packages produced in high volume may be desirable. Functionality options include direction and properties of the exiting light emission for the application as well as integration of features such as photodetectors, thermistors, or other electronics or optoelectronics. For best performance and lifetime the thermal impedance of the package should be minimized, especially in high power applications. Examples of sealing configurations include open environment, environmentally sealed, or hermetically sealed. Typically for GaN based lasers it is desirable for hermetically sealed packages, but other packages can be considered and deployed for various applications. Examples of off the shelf packages for the integrated white light source include TO cans such as TO38, TO56, TO9, TO5, or other TO can type packages. Flat packages configured with windows can also be used. Examples of flat packages include a butterfly package like a TOSA. Surface mount device (SMD) packages can also be used, which are attractive due to their low price, hermetic sealing, and potentially low thermal impedance. In other embodiments, custom packages are used.

In some embodiments of this invention, the laser-based eye safe white light source is combined with one or more optical members to manipulate the generated white light. In an example the white light source could serve in a spot light system such as a flashlight or an automobile headlamp or other light applications where the light must be directed or projected to a specified location or area. In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector. In an another example a lens is used to collimate the white light into a projected beam. In one example a simple aspheric lens would be positioned in front of the phosphor to collimate the white light. In other embodiments other types of collimating optics may be used such as spherical lenses or aspherical lenses.

In a specific embodiment of the general invention described above, the present invention is configured for a side-pumped phosphor operated in transmissive mode. In this configuration, the phosphor is positioned in front of the waveguide gain element or laser facet outputting the beam, wherein both the waveguide gain element or laser and the phosphor are configured on a support member. The gallium and nitrogen containing laser diode is configured with a cavity that has a length greater than 100 um, greater than 500 um, greater than 1000 um, or greater than 1500 um long and a width greater than 1 um, greater than 10 um, greater than 20 um, greater than 30 um, or greater than 45 um. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back of the laser diode. The phosphor is comprised of Ce doped YAG and emits yellow emission. The phosphor is shaped as a block, plate, sphere, cylinder, or other geometrical form. Specifically, the phosphor geometry primary dimensions may be less than 50 um, less than 100 um, less than 200 um, less than 500 um, less than 1 mm, or less than 10 mm. Operated in transmissive mode, the phosphor has a first primary side for receiving the incident laser beam and at least a second primary side where most of the useful white light will exit the phosphor to be coupled to the application. To improve the efficiency by maximizing the amount of light exiting the second side of the phosphor, the phosphor may be coated with layers configured to modify the reflectivity for certain colors. In one example, a coating configured to increase the reflectivity for yellow light is applied to the first side of the phosphor such that the amount of yellow light emitted from the first side is reduce. In an another example, a coating to increase the reflectivity of the blue light is spatially patterned on the first side of the phosphor to allow the excitation light to pass, but prevent backward propagating scattered light to escape. In another example, optical coatings configured to reduce the reflectivity to yellow and blue light are applied to at least the second side of the phosphor to maximize the light escaping from this primary side where the useful light exits. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, lead containing solders, indium solders, indium, and other solders. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors. The side-pumped transmissive apparatus has a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

In alternative embodiments of the present invention, multiple phosphors are operated in a transmissive mode for a white emission. In one example, a violet waveguide gain element or laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the waveguide gain element or laser beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration the laser beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light.

In an alternative embodiment of a multi-phosphor transmissive example according to the present invention, a waveguide gain element or blue laser diode operating with a wavelength of 425 nm to 480 nm is configured to excite a first green phosphor and a second red phosphor. In this configuration, a first green phosphor plate could be fused or bonded to the second red phosphor plate. In a practical configuration the waveguide gain element or laser beam would be directly incident on the first green phosphor wherein a fraction of the green emission would excite the second red phosphor to emit red emission to combine with green phosphor emission and blue waveguide gain element or laser diode emission to generate a white light. In an alternative practical configuration the waveguide gain element or laser beam would be directly incident on the second red phosphor wherein a fraction of the blue electromagnetic emission would be absorbed in the red phosphor to excite red emission and a portion of the remaining blue waveguide gain element or laser emission would pass to the green phosphor and create a green emission to combine with the red phosphor emission and waveguide gain element or blue laser diode emission to generate a white light. The benefit or feature of this embodiment is the higher color quality that could be achieved from a white light comprised of red, green, and blue emission. Of course there could be other variants of this invention including integrating more than two phosphor and could include one of or a combination of a red, green, blue, and yellow phosphor.

In yet another variation of a side pumped phosphor configuration, a "point source" or "point source like" integrated white emitting device is achieved. In this configuration the phosphor would most likely have a cube geometry or spherical geometry such that white light can be emitted from more than 1 primary emission surface. For example, in a cube geometry up to all six faces of the cube can emit white light or in a sphere configuration the entire surface can emit to create a perfect point source. In some configurations of this embodiment the phosphor is attached to the common support member wherein the common support member may not be fully transparent. In this configuration the surface or side of the phosphor where it is attached would have impeded light emission and hence would reduce the overall efficiency or quality of the point source white light emitter. However, this emission impediment can be minimized or mitigated to provide a very efficient illumination. In other configurations, the phosphor is supported by one or more optically transparent member such that the light is free to emit in all directions from the phosphor point source. In one variation, the phosphor is fully surrounded in or encapsulated by an optically transparent material such as a solid material like SiC, diamond, GaN, or other, or a liquid material like water or a more thermally conductive liquid.

In another variation, the support member could also serve as a waveguide for the waveguide gain element or laser light to reach the phosphor. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assembly are applied to a large point source, the optical control and collimation is diminished.

In all of the side pumped and transmissive embodiments of this invention the additional features and designs can be included. For example shaping of the excitation waveguide gain element or laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated.

A point source omni-directional light source is configurable into several types of illumination patterns including 4-pi steradian illumination to provide a wide illumination to a three dimensional volume such as a room, lecture hall, or stadium. Moreover, optical elements can be included to manipulate the generated white light to produce highly directional illumination. In some embodiments reflectors such as parabolic reflectors or lenses such as collimating lenses are used to collimate the white light or create a spot light that could be applicable in an automobile headlight, flashlight, spotlight, or other lights. In other embodiments, the point source illumination can be modified with cylindrical optics and reflectors into linear omni-directional illumination, or linear directional illumination. Additionally, the point source illumination coupled into planar waveguides for planar 2-pi steradian emission, planar 4-pi steradian emission to produce glare-free illumination patterns that emit from a plane.

In another specific preferred embodiment of the integrated white light source, the present invention is configured for a reflective mode phosphor operation. In one example the excitation waveguide gain element or laser beam enters the phosphor through the same primary surface as the useful white light is emitted from. That is, operated in reflective mode the phosphor could have a first primary surface configured for both receiving the incident excitation waveguide gain element or laser beam and emitting useful white light. In this configuration, the phosphor is positioned in front of the waveguide gain element or laser facet outputting the waveguide gain element or laser beam, wherein both the laser and the phosphor are configured on a support member. The gallium and nitrogen containing waveguide gain element or laser diode is configured with a cavity that has a length greater than 100 um, greater than 500 um, greater than 1000 um, or greater than 1500 um long and a width greater than 1 um, greater than 10 um, greater than 20 um, greater than 30 um, or greater than 45 um. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back facet of the laser diode. In one example, the phosphor can be comprised of Ce doped YAG and emits yellow emission. The phosphor may be a ceramic phosphor and could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 um, greater than 100 um, greater than 200 um, greater than 500 um, greater than 1 mm, or greater than 10 mm and a thickness of less than 500 um, less than 200 um, less than 100 um or less than 50 um.

In one example of the reflective mode eye safe laser based white light source embodiment of this invention optical coatings, material selections are made, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light and is applied to the phosphor prior to attaching the phosphor to the common support member. In an another example, a reflective material is used as a bonding medium that attaches the phosphor to the support member or to an intermediate submount member. Examples of reflective materials include reflective solders and reflective glues, but could be others. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, lead containing solders, indium solders, indium, and other solders. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

In all of the reflective mode embodiments of this invention the additional features and designs can be included. For example shaping of the excitation laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop or a type of feedback loop to turn the laser off when a signal is indicated. Moreover, optical elements can be included to manipulate the generated white light. In some embodiments reflectors such as parabolic reflectors or lenses such as collimating lenses are used to collimate the white light or create a spot light that could be applicable in an automobile headlight, flashlight, spotlight, or other lights.

A further understanding of the nature and advantages of the present invention may be realized by reference to the latter portions of the specification and attached drawings.

DETAILED DESCRIPTION

Figure 1:
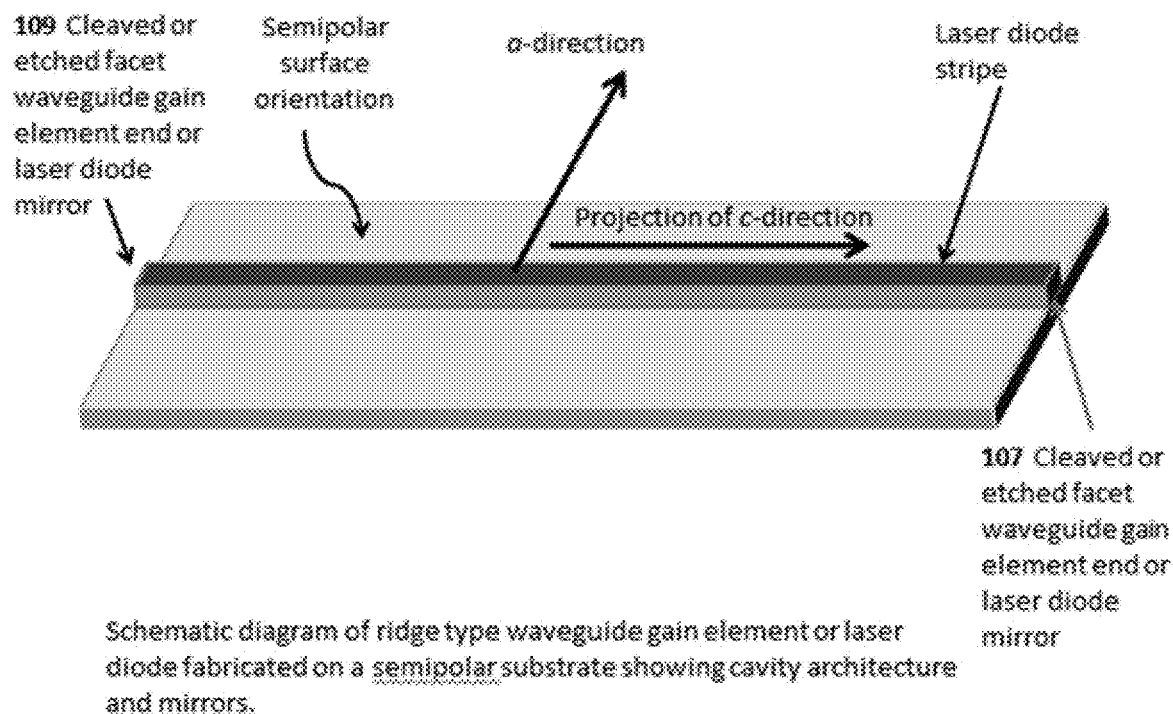
FIG. 1 is a simplified diagram illustrating a gallium and nitrogen containing waveguide gain element or laser diode device configured on a semipolar substrate according to the present invention.

The present invention provides a device and method for an eye safe electromagnetic radiation source using a combination of laser diode excitation source or waveguide gain element such as superluminescent diode (SLED) based on gallium and nitrogen containing materials and light emitting/conversion source based on phosphor materials. In some embodiments of this invention a violet emitting, blue emitting, or other wavelength emitting waveguide gain element or laser diode source based on gallium and nitrogen materials is closely integrated with phosphor materials, such as yellow phosphors or a red and green phosphor, or a red, yellow, and green phosphor, to form a compact, high-brightness, and highly-efficient, white light source with novel configurations designed for eye safety. Specifically, the novel configurations for safety are designed to prevent environmental exposure of laser beams in case the light sources were to become compromised. In some embodiments, the novel safety features are designed to terminate lasing action from the laser based light source by altering the electrical circuit, optical circuit, or optical feedback into the laser gain element to drop the laser below the threshold condition. In some examples, all optical output power from the laser based light source would cease and in other cases the output optical power level and coherence would be greatly reduced to an eye safe level. In all embodiments we refer to the safety features a being "inherent" indicating that they are designed to be self-contained with a closed loop and not needing to interact with external monitoring or computing devices. In an example, the source can be provided for specialized applications, among general applications, and the like.

This invention includes laser-based light systems designed for user and environmental safety. More specifically, the light systems typically include a gallium and nitrogen containing waveguide gain element such as a SLED or laser diode excitation source coupled to a wavelength conversion element and employs novel designs to eliminate the possibility of laser beam exposure to the outside environment in the case that the wavelength conversion material is damaged or displaced from the optical pathway of the laser beam. This invention includes a gallium and nitrogen containing gain element or laser diode with a cavity comprising a waveguided gain medium with a pair of mirrors on the two ends of the cavity to provide feedback into the gain medium. The waveguide gain element or laser diode gain medium is configured with electrical inputs for electrical pumping to provide optical gain within the cavity. In a first group of embodiments, the wavelength converter material is coupled to at least one of the pair of mirrors such that if the wavelength converter material is removed or damaged the mirror will cease to provide feedback to the gain medium and the laser will fall below the threshold condition and stop lasing. In a second group of embodiments, the wavelength converter material is coupled to the electrical input such that if the wavelength converter material is removed or damaged the electrical input will cease to excite the gain medium and the laser light source will turn-off. In a third group of embodiments, detection and/or sensor schemes are employed to determine if the wavelength conversion material is damaged or removed from the optical pathway of the laser beam. Upon sensing such an event, a break in the electrical input or optical feedback to the gain medium will be triggered and the laser will cease to lase. In all group of these novel inherent safety features designed for laser based light sources, the safety features are self-contained with a closed loop and not needing to interact with external monitoring or computing devices.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm2 range. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm2 to 30 mm2 of epi area. A second limitation of LEDs is also related to their brightness, more specifically it is related to their spatial brightness. A conventional high brightness LED emits ~1 W per $mm^2$ of epi area. With some advances and breakthrough perhaps this can be increased up to 5-10× to 5-10 W per mm² of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 um wide by about 0.5 um tall, which equates to over 250,000 W/mm2. This spatial brightness is over 5 orders of magnitude higher than LEDs or put another way, 10,000 times brighter than an LED.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Based on essentially all the pioneering work on GaN LEDs described above, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective laser based light source such as a white light source with inherent safety features protecting the user and environment from laser related hazards. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing waveguide gain element or laser diode source is based on c-plane gallium nitride material and in other embodiments the gallium and nitrogen containing waveguide element laser diode is based on nonpolar or semipolar gallium and nitride material. In one embodiment the laser based light source is configured from a chip on submount (CoS) with an integrated phosphor on the submount to form a chip and phosphor on submount (CPoS) white light source.

In various embodiments, the waveguide gain element or laser device and one or more phosphor members are mounted on a common support member with or without intermediate submounts and the phosphor members are operated in a transmissive mode or a reflective mode to result in a laser-based light source. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, transformations, transportations, leveling, curing and other chemical treatments, heating, cutting and/or ablating, pumping other optical devices, other optoelectronic devices and related applications, and source lighting and the like.

Laser diodes and superluminescent diodes (SLEDs) are ideal as phosphor excitation sources. With a spatial brightness (optical intensity per unit area) greater than 10,000 times higher than conventional LEDs and the extreme directionality of the laser or SLED emission, laser diodes and SLEDs enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm2, 100 W/mm2, or even over 2,500 W/mm2 can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 microns, or 50 microns or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In one embodiment, the present invention provides a laser-based white light source comprising a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations. The apparatus has a support member and at least one gallium and nitrogen containing waveguide gain element or laser diode devices and phosphor material overlying the support member. The waveguide gain element or laser device is capable of an emission of an excitation beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

The waveguide gain element or laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane.

Critical to the novelty of this invention is the gallium and nitrogen containing laser diode and/or waveguide gain element. The Group-III nitride based devices generate light and provide optical gain in the UV or visible electromagnetic spectrum, preferably in the UV, violet or blue wavelength ranges. In some embodiments of this eye safe laser based light source more conventionally structured gallium and nitrogen containing laser diodes are implemented such as Fabry Perot laser diodes while. In other embodiments of this invention, gallium and nitrogen containing gain elements are used within the cavity of a laser structure wherein at least one of the mirrors is not formed on the gallium and nitrogen containing material. Both the conventionally structured laser diodes and gain element typically consistent of an optical waveguide in the epitaxial gallium and nitrogen containing material comprising an active region and a cladding region. The waveguide is formed to provide vertical optical confinement with the refractive index profile of the epitaxial layer structure. The waveguide can be configured to provide lateral optical waveguiding can using various methods including by etching a ridge structure in the p-cladding region. An electrical input is provided to the optical waveguide where electrons and holes are injected in the active layers generating a violet or a blue emission, forming an optical mode, and providing gain to the optical mode as it travels in the cavity with sufficient electrical injection. The waveguide is preferably designed to provide a low loss of less than 15 cm-1, less than 10 cm-1, less than 5 cm-1, or less than 2 cm-1, and is configured to provide a high optical gain.

In embodiments according to this eye safe laser light source invention wherein more conventional laser are employed, the waveguide gain structure is configured into a cavity region by forming mirrors on a first end and a second end of the gallium and nitrogen containing waveguide gain structure. The mirrors can be formed into the gallium and nitrogen containing material with a facet cleaving process, a facet etching process, a polishing process, or other processes. Optionally, optical coatings can be deposited on the facet regions to modify the reflectivity by decreasing or increasing the reflectivity. Such optical coatings can be comprised of one or more layers or layer stacks of materials such as SiO2, Ta2O5, AlN, SiN, AlN, etc. In a typical configuration a first facet or back facet is coated to increase the reflectivity and the second facet or front facet is coated to decrease the reflectivity. Examples of this more conventional laser light source are Fabry Perot laser diodes.

In embodiments according to this eye safe laser light source invention wherein less conventional laser structures are employed, the waveguide gain structure is configured into a cavity region by forming mirrors on surfaces external to the waveguide gain element. In these embodiments at least one of the ends of the waveguide gain element is configured for a low reflectivity to reduce the optical feedback and prevent lasing from that surface. For example, in one embodiment a first back end of the waveguide gain element is comprised of a facet such as a cleaved or etched facet and is configured for high reflectivity. The second end of the waveguide gain element is configured for a reduced reflectivity such that light exits the waveguide and then reflects on a first or second surface back into the waveguide to induce lasing. In preferred embodiment the first or second surface is configured with a wavelength conversion element such as a phosphor. In a preferred embodiment the phosphor is a ceramic phosphor or a single crystal phosphor. In this configuration the gallium and nitrogen waveguide is providing the gain element within the cavity of the laser light source, but not necessarily providing the first and second mirror regions to form the cavity.

In several embodiment of this invention wherein the gallium and nitrogen containing waveguide gain element is not configured with both mirrors to form a laser cavity and induce lasing on the ends of the waveguide, the waveguide gain element can be described as a superluminescent diode (SLED). A SLED is similar to a laser diode as it is based on an electrically driven junction that when injected with current becomes optically active and generates amplified spontaneous emission and gain over a wide range of wavelengths. SLEDs are designed to have high single pass gain or amplification for the spontaneous emission generated along the waveguide but, unlike laser diodes, insufficient feedback to achieve lasing action. More specifically, at least one of the waveguide ends is designed to provide very low reflectivity back into the waveguide gain element. This reduced reflectivity can be achieved by using one or more of reflectivity optical coatings and tilted or angled waveguide ends facets. Throughout the description of this invention, in some embodiments the use of the term "waveguide gain element" and the like can be used interchangeably with "superluminescent diode" or "SLED".

FIG. 1a is a simplified schematic diagram of an example of a polar c-plane waveguide gain element or laser diode formed on a gallium and nitrogen containing substrate with the cavity aligned in the m-direction with cleaved or etched ends. The laser stripe region is characterized by a cavity orientation substantially in an m-direction, which is substantially normal to an a-direction, but can be others such as cavity alignment substantially in the a-direction. The waveguide gain element or laser strip region has a first end 107 and a second end 109 and is formed on an m-direction on a {0001} gallium and nitrogen containing substrate having a pair of cleaved or etched waveguide ends or mirror structures, which face each other. For example, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where 0≤x, y, x+y≤1. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface.

FIG. 1b is a simplified schematic diagram of an example of a semipolar plane waveguide gain element or laser diode formed on a gallium and nitrogen containing substrate with the cavity aligned in a projection of a c-direction with cleaved or etched ends. The waveguide gain element or laser stripe region is characterized by a cavity orientation substantially in a projection of a c-direction, which is substantially normal to an a-direction, but can be others such as cavity alignment substantially in the a-direction. The waveguide gain element or laser strip region has a first end 107 and a second end 109 and is formed on an semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. For example, the gallium and nitrogen containing substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where 0≤x, y, x+y≤1. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface.

The example waveguide gain element or laser diode devices in FIGS. 1a and 1b have a pair of cleaved or etched ends that can be configured as mirror structures or waveguide ends, which face each other. The first cleaved or etched waveguide end or facets can comprise a reflective coating and the second cleaved or etched waveguide end or facet can comprise no coating, an antireflective coating, or exposes gallium and nitrogen containing material. The first cleaved or etched waveguide end or facet is substantially parallel with the second cleaved or etched waveguide end or facet. The first and second waveguide ends or cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The first and second waveguide ends or mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of waveguide end or facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), reactive ion beam etching (RIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, RIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAME and RIBE is known to provide very smooth and low damage sidewalls due to the chemical nature of the etch, while it can provide highly vertical etches due to the ability to tilt the wafer stage to compensate for any inherent angle in etch.

The waveguide gain element or laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 50 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 50 microns, and others. In a specific embodiment, the width is substantially constant in dimension, although there may be slight variations. The width and length are often formed using a masking and etching process, which are commonly used in the art.

The waveguide gain element or laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

In certain embodiments, GaN surface orientation is substantially in the c-plane, m-plane, {40-41}, {30-31}, {20-21}, {40-4-1}, {30-3-1}, {20-2-1} {20-21} orientation, and the device has a laser stripe region formed overlying a portion of the off-cut crystalline orientation surface region. For example, the waveguide gain element or laser stripe region is characterized by a cavity orientation substantially in a projection of a c-direction, which is substantially normal to an a-direction. In a specific embodiment, the laser strip region has a first end 107 and a second end 109. In a preferred embodiment wherein the waveguide gain element or laser is formed on a semipolar orientation, the device is formed on a projection of a c-direction on a gallium and nitrogen containing substrate having a pair of cleaved mirror structures, which face each other.

In a preferred embodiment, the device has a first cleaved facet provided on the first end of the laser stripe region and a second cleaved facet provided on the second end of the waveguide gain element or laser stripe region. In one or more embodiments, the first cleaved is substantially parallel with the second cleaved facet. In the embodiment of a laser diode formed completely in the gallium and nitrogen containing gain chip such as a Fabry Perot laser, mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. The first mirror surface can also have an anti-reflective coating. In the embodiment of a waveguide gain element such as a SLED, a mirror surfaces can be formed on one of the cleaved surfaces and the second surface or cleaved surface is configured for a very low reflectivity. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface has an anti-reflective coating.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 375 nm and greater light in a ridge waveguide gain element or laser embodiment. The device is provided with one or more of the following epitaxially grown elements:
- an n-GaN or n-AlGaN cladding layer with a thickness from 100 nm to 3000 nm with Si doping level of 5E17 $cm^{-3}$ to 3E18 $cm^{-3}$;
- an n-side SCH layer comprised of InGaN with molar fraction of indium of between 2% and 12% and thickness from 10 nm to 250 nm;
- multiple quantum well active region layers comprised of at least two 2.0 nm to 8.5 nm InGaN quantum wells separated by 1.5 nm and greater, and optionally up to about 12 nm, GaN or InGaN barriers;
- a p-side SCH layer comprised of InGaN with molar a fraction of indium of between 0% and 10% and a thickness from 15 nm to 250 nm or an upper GaN-guide layer;
- an electron blocking layer comprised of AlGaN with molar fraction of aluminum of between 0% and 22% and thickness from 5 nm to 20 nm and doped with Mg;
- a p-GaN or p-AlGaN cladding layer with a thickness from 400 nm to 1500 nm with Mg doping level of 2E17 $cm^{-3}$ to 2E19 cm-3; and
- a p++-GaN contact layer with a thickness from 20 nm to 40 nm with Mg doping level of 1E19 $cm^{-3}$ to 1E21 $cm^{-3}$.

Figure 3:
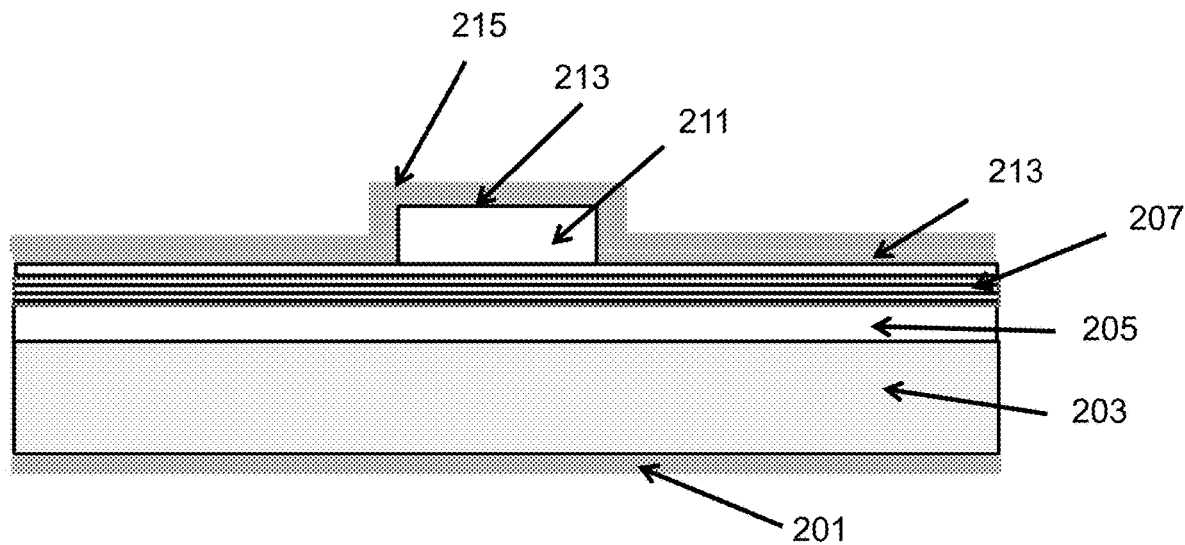
FIG. 3 is a simplified schematic cross-section of conventional ridge waveguide gain element or laser diode according to the present invention.

FIG. 3 is a cross-sectional view of a waveguide gain element or laser device 200. As shown, the waveguide gain element or laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

An n-type $Al_uIn_vGa_{1-u-v}N$ layer, where 0≤u, v, u+v≤1, is deposited on the substrate. The carrier concentration may lie in the range between about $10^{16}$ $cm^{-3}$ and $10^{20}$ $cm^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes 213 contact region. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof.

Active region 207 preferably includes one to ten quantum well regions or a double heterostructure region for light emission. Following deposition of the n-type $Al_uIn_vGa_{1-u-v}N$ layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_xIn_yGa_{1-s-t}N$, where $0 \le s$, t, s+t$\le$1, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes 213 contact region.

Figure 2:
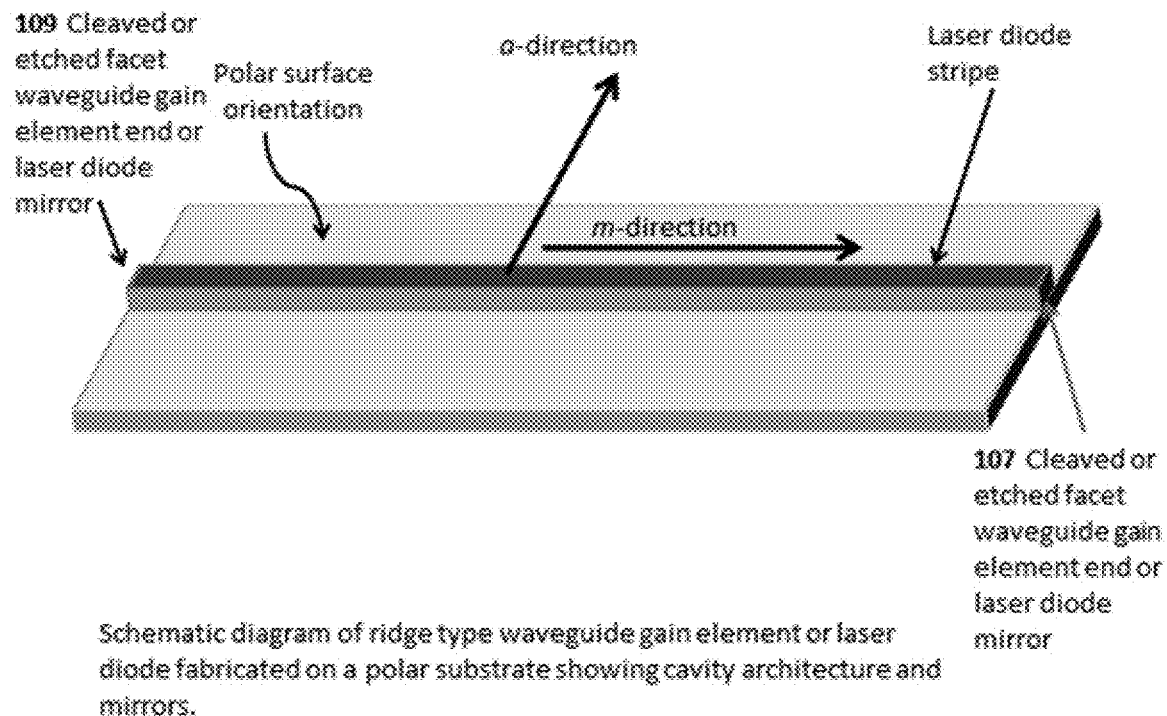
FIG. 2 is a simplified diagram illustrating a gallium and nitrogen containing waveguide gain element or laser diode device configured on a polar c-plane substrate according to the present invention.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIGS. 1 and 2 and described above are typically suitable for relative low-power applications.

In various embodiments, the present invention realizes high output power from a diode laser is by widening one or more portions of the laser cavity member from the single lateral mode regime of 1.0-3.0 μm to the multi-lateral mode range 5.0-20 μm. In some cases, laser diodes having cavities at a width of 50 μm or greater are employed.

The waveguide gain element or laser stripe length, or cavity length ranges from 100 to 3000 μm and employs growth and fabrication techniques such as those described in U.S. patent application Ser. No. 12/759,273, filed Apr. 13, 2010, which is incorporated by reference herein. As an example, waveguide gain elements or laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

FIG. 3 illustrates an example cross-sectional diagram of a gallium and nitrogen based waveguide gain element or laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlInGaN, or InGaN and n-type cladding layers comprised of GaN, AlGaN, or AlInGaN. The n-typed layers may have thickness in the range of 0.3 um to about 3 microns or to about 5 microns and may be doped with an n-type carriers such as Si or O to concentrations between 1E16 cm3 to 1E19 cm3. Overlying the n-type layers is the active region and waveguide layers 207. This region could contain an n-side waveguide layer or separate confinement hetereostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double hetereostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 um to about 2 microns and is doped with Mg to a concentration of between 1E16 cm3 to 1E19 cm3. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing one or more of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing one or more of Au, Al, Pd, Pt, Ni, Ti, or Ag and may be deposited with electron beam deposition, sputter deposition, or thermal evaporation.

After the waveguide gain element or laser diode chip fabrication as described above, the waveguide gain element or laser diode can be mounted to a submount. In some examples the submount is comprised of AlN, SiC, BeO, diamond, or other materials such as metals, ceramics, or composites. The submount can be the common support member wherein the wavelength conversion memer such as a phosphor member of laser based light source would also be attached. Alternatively, the submount can be an intermediate submount intended to be mounted to the common support member wherein the phosphor material is attached. The submount member may be characterized by a width, length, and thickness. In an example wherein the submount is the common support member for the phosphor and the waveguide gain element or laser diode chip the submount would have a width and length ranging in dimension from about 0.5 mm to about 5 mm or to about 15 mm and a thickness ranging from about 150 um to about 2 mm. In the example wherein the submount is an intermediate submount between the waveguide gain element or laser diode chip and the common support member it could be characterized by width and length ranging in dimension from about 0.5 mm to about 5 mm and the thickness may range from about 50 um to about 500 um. The waveguide gain element or laser diode is attached to the submount using a bonding process, a soldering process, a gluing process, or a combination thereof. In one embodiment the submount is electrically isolating and has metal bond pads deposited on top. The waveguide gain element or laser chip is mounted to at least one of those metal pads. The waveguide gain element or laser chip can be mounted in a p-side down or a p-side up configuration. After bonding the waveguide gain element or laser chip, wire bonds are formed from the chip to the submount such that the final chip on submount (CoS) is completed and ready for integration.

Figure 4:
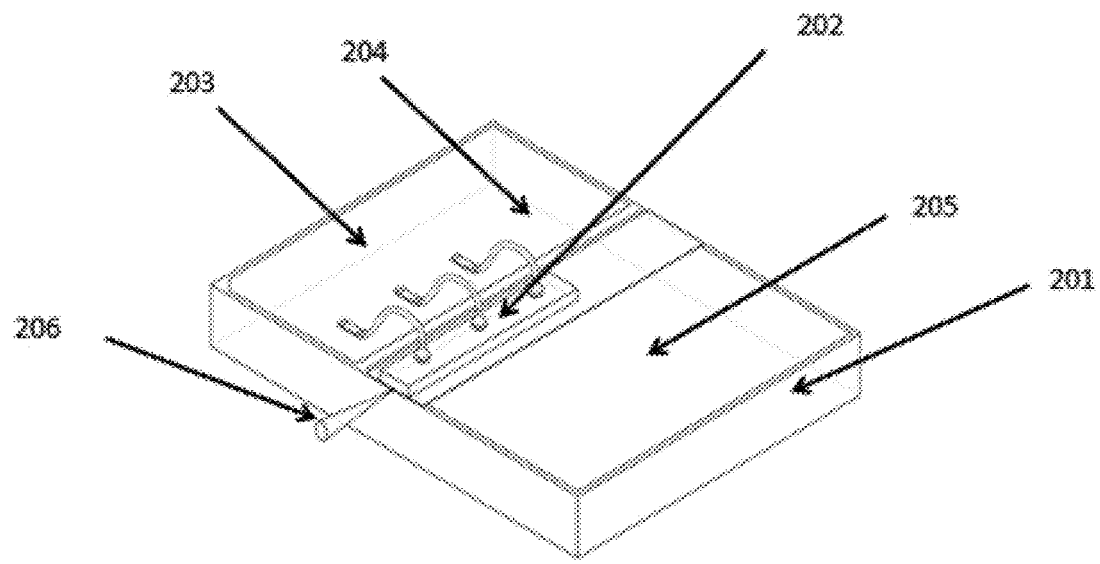
FIG. 4 is a simplified diagram illustrating a conventional laser diode chip on submount (CoS) according to the present invention.

A schematic diagram illustrating a CoS based on a conventional waveguide gain element or laser diode formed on gallium and nitrogen containing substrate technology according to this present invention is shown in FIG. 4. The CoS is comprised of submount material 201 configured to act as an intermediate material between a waveguide gain element or laser diode chip 202 and a final mounting surface. The submount is configured with electrodes 203 and 205 that may be formed with deposited metal layers such as Au. In one example, Ti/Pt/Au is used for the electrodes. Wirebonds 204 are configured to couple the electrical power from the electrodes 203 and 205 on the submount to the waveguide gain element or laser diode chip to generate a laser beam output 206 from the laser diode. The electrodes 203 and 205 are configured for an electrical connection to an external power source such as a laser driver, a current source, or a voltage source. Wirebonds can be formed on the electrodes to couple electrical power to the waveguide gain element or laser diode device and activate the laser based light source.

In another embodiment, the gallium and nitrogen containing waveguide gain element or laser diode fabrication includes an epitaxial release step to lift off the epitaxially grown gallium and nitrogen layers and prepare them for transfer to a carrier wafer which could comprise the submount after laser fabrication. The transfer step requires precise placement of the epitaxial layers on the carrier wafer to enable subsequent processing of the epitaxial layers into waveguide gain element or laser diode devices. The attachment process to the carrier wafer could include a wafer bonding step with a bond interface comprised of metal-metal, semiconductor-semiconductor, glass-glass, dielectric-dielectric, or a combination thereof.

In yet another preferred variation of this eye safe laser based light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After waveguide gain element or laser fabrication is complete, a phosphor material is introduced onto the submount to form an integrated light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, but can be other techniques such as SAC solders, lead containing solders, indium solders, or other attachment methods such as thermal adhesives. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In this embodiment, gallium and nitrogen containing epitaxial layers are grown on a bulk gallium and nitrogen containing substrate. The epitaxial layer stack comprises at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the one or more sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the one or more sacrificial layers. PEC is a photo-assisted wet etch technique that can be used to etch GaN and its alloys. The process involves an aboveband-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and HNO3 have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Figure 5:
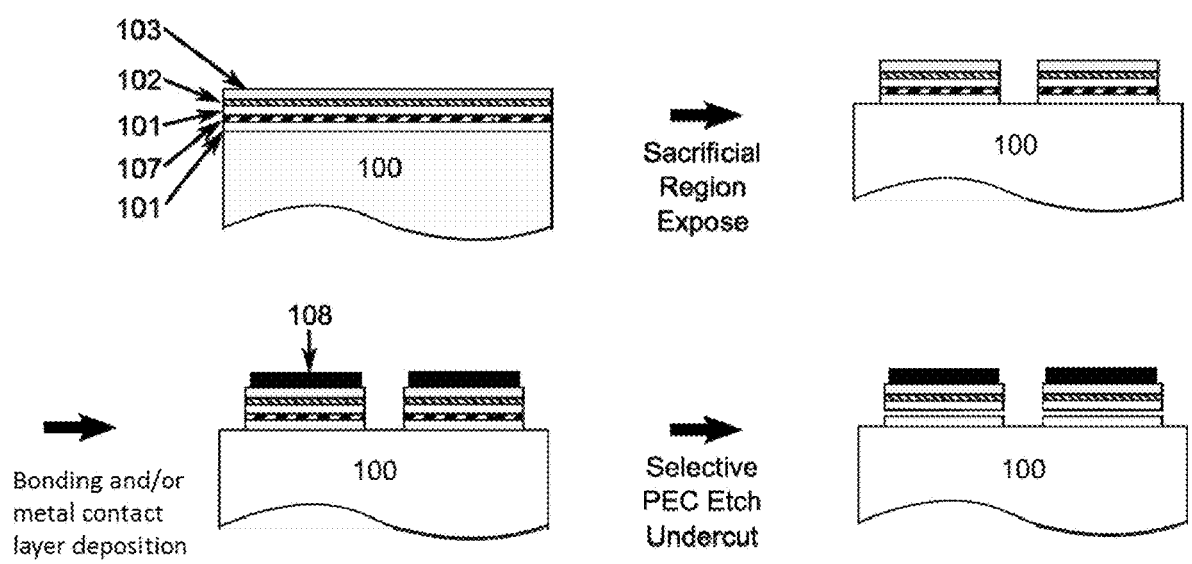
FIG. 5 is a simplified diagram illustrating epitaxy preparation process flow for epi transfer to a carrier wafer according to the present invention.

The preparation of the epitaxy wafer is shown in FIG. 5. A substrate 100 is overlaid by a buffer layer 101, a selectively removable sacrificial layer 107, an buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 5 is a top down etch to expose the sacrificial layers, followed by a bonding metal deposition as shown in FIG. 5. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall. The device layers are exposed using an etch and an etch resistant protect layer is deposited overlaying the edges of the device layers such that they are not exposed to the etch chemicals. The sacrificial layer is then exposed by an etch of vias. A bonding layer is deposited and a selective etch process is used to remove the sacrificial layers. In some embodiments the bonding layer is deposited after the selective etch. This work flow is advantageous when the device layers are susceptible to damage from the etch process used to remove the sacrificial layer. With the sacrificial region exposed a bandgap selective PEC etch is used to undercut the mesas. At this point, the selective area bonding process is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In some embodiments PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with one or more of acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, copper tungsten, gold, silver, aluminum, stainless steel, or steel.

In another embodiment, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

Figure 6:
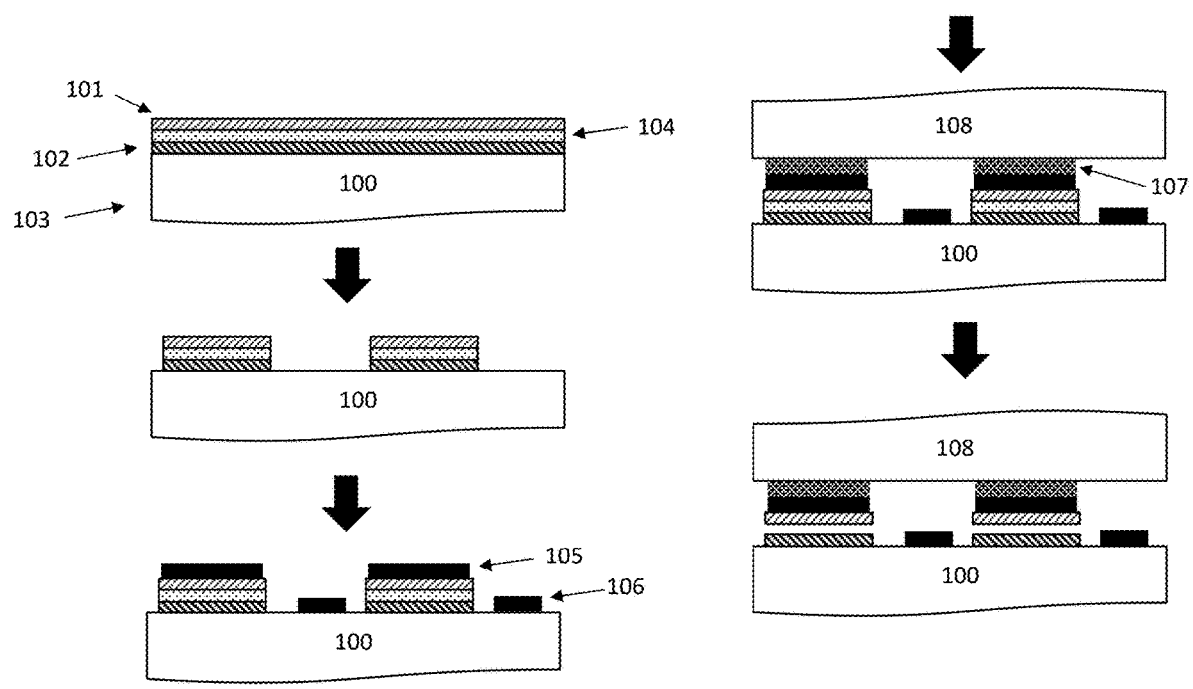
FIG. 6 is a simplified diagram illustrating a bond then etch process flow for epi layer transfer to a carrier wafer according to the present invention.

In one embodiment of this invention, the bonding of the semiconductor device epitaxial material to the carrier wafer process can be performed prior to the selective etching of the sacrificial region and subsequent release of the gallium and nitrogen containing substrate. FIG. 6 is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 6 substrate wafer 101 is overlaid by a buffer layer 102, a selectively etchable sacrificial layer 104 and a collection of device layers 101. The bond layer 105 is deposited along with a cathode metal 106 that will be used to facilitate the photoelectrochemical etch process for selectively removing the sacrificial layer.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In one example, the "etch then bond" process flow can be deployed where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The bond layer 105 is deposited along with a cathode metal 106 that will be used to facilitate the photoelectrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing substrate prior to the bonding step wherein they are releases from the gallium and nitrogen containing substrate and transferred to the carrier wafer.

Anchor regions are special features that can be designed into the photo masks which attach the undercut device layers to the gallium and nitrogen containing substrate, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. In one example the mesas are retained on the substrate by deposition of an etch resistant material acting as an anchor by connecting the mesas to the substrate. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. A layer of etch resistant material, which may be composed of metal, ceramic, polymer or a glass, is deposited such that it connects to both the mesa and the substrate. The selective etch process is carried out such that the sacrificial layer is fully removed and only the etch-resistant layer connects the mesa to the substrate In another example of anchor techniques, the mesas are retained on the substrate by use of an anchor composed of epitaxial material. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. The anchor is shaped such that during the etch, a small portion of the sacrificial layer remains unetched and creates a connection between the undercut mesa and the substrate wafer.

In one embodiment the anchors are positioned either at the ends or sides of the undercut die such that they are connected by a narrow undercut region of material. In this example the narrow connecting material is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

The mesa regions can be formed by dry or wet chemical etching, and in one example would include at least a p++ GaN contact layer, a p-type cladding layer comprised of GaN, AlGaN, or InAlGaN, light emitting layers such as quantum wells separated by barriers, waveguiding layers such as InGaN layers, and the one or more n-type cladding layers comprised of GaN, AlGaN, or InAlGaN, the sacrificial layer, and a portion of the n-type GaN epitaxial layer beneath the sacrificial layer. A p-contact metal is first deposited on the p++ GaN contact layer in order to form a high quality electrical contact with the p-type cladding. A second metal stack is then patterned and deposited on the mesa, overlaying the p-contact metal. The second metal stack consists of an n-contact metal, forming a good electrical contact with the n-type GaN layer beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

The use of metal anchors have several advantages over the use of anchors made from the epitaxial device material. The first is density of the transferrable mesas on the donor wafer containing the epitaxial semiconductor device layers and the gallium and nitrogen containing bulk substrate. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 7:
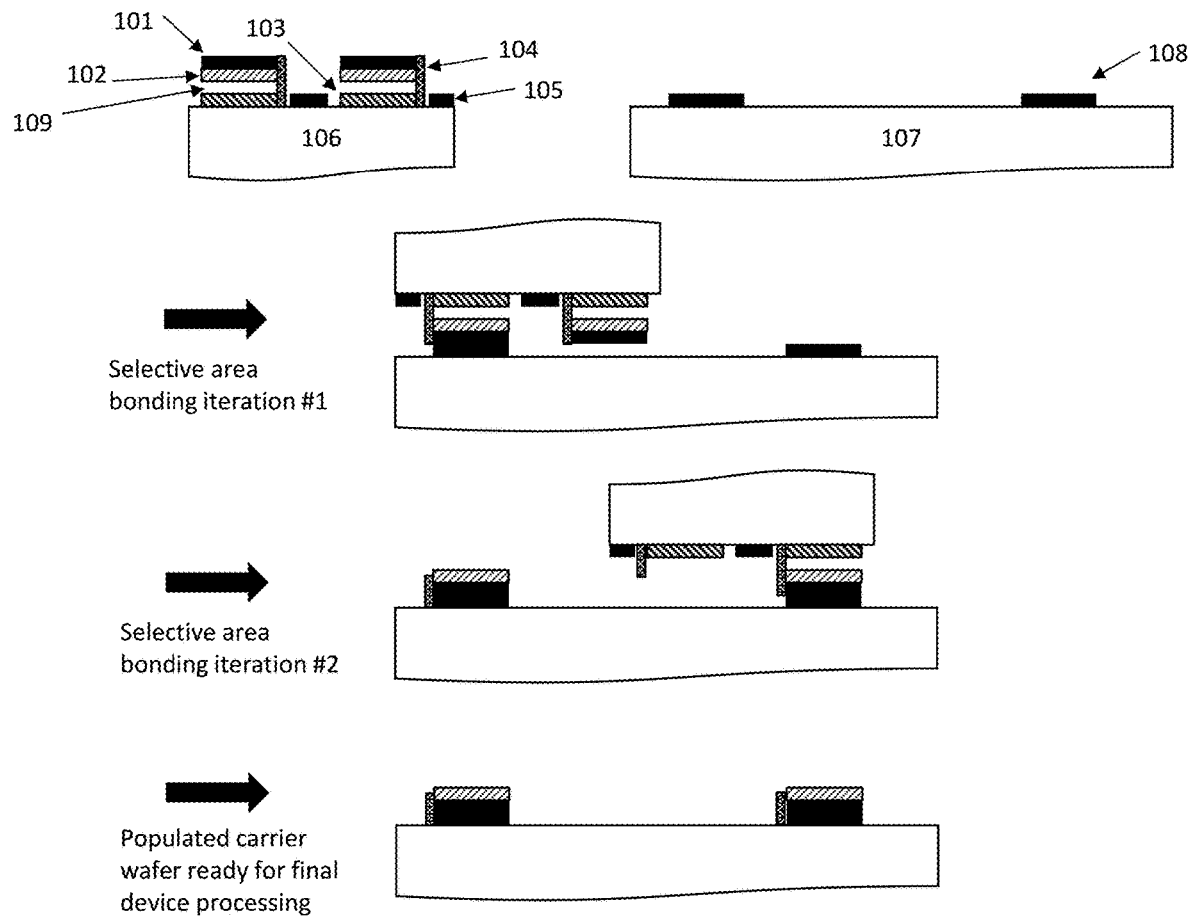
FIG. 7 is a simplified diagram illustrating a side view of die expansion with selective area bonding according to the present invention.

FIG. 7 is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 7, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 7. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 μm and about 100 μm wide or between about 100 micron and about 500 microns wide or between about 500 micron and about 3000 microns wide and between about 100 and about 3000 μm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

Figure 8:
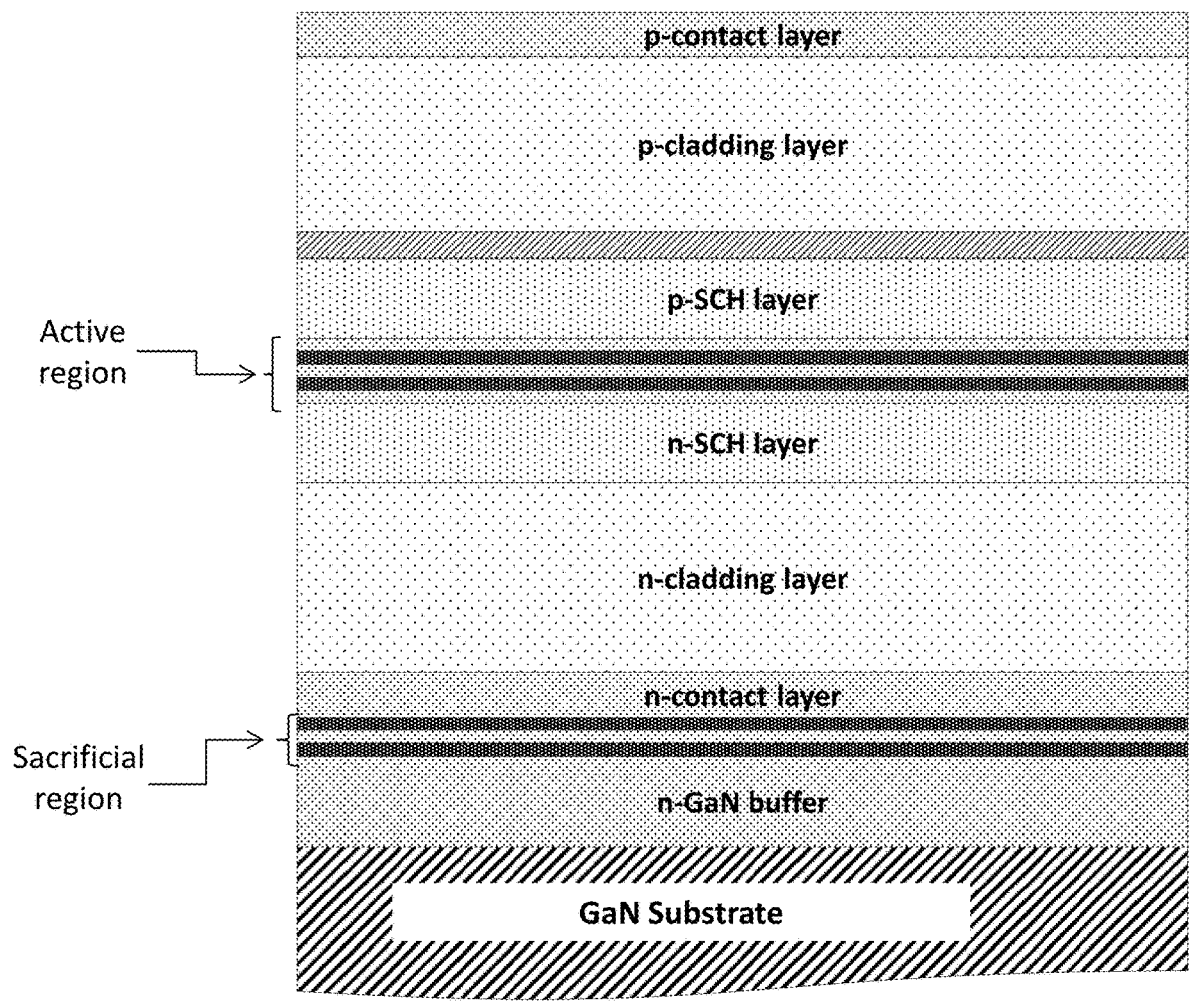
FIG. 8 is a simplified diagram illustrating an example of a waveguide gain element or laser diode epitaxial structure according to the epitaxial transfer embodiment according to the present invention.

An example of an epitaxial structure for a waveguide gain element or laser diode device according to this invention is shown in FIG. 8. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the substrate is comprised of a semipolar or nonpolar orientation. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm-3, but can be other doping levels in the range between 5E17 and 1E19 cm-3. Overlaying the contact layer is an n-type cladding layer comprised of GaN or AlGaN layer with a thickness of 1 micron with an average composition of 4% AlN, though in other embodiments the thickness may range from 0.25 to 2 microns with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an optional AlGaN electron blocking layer [EBL] with a composition of 10% AlN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 to 2 microns with an average composition of 0-8% AlN. The p-cladding is terminated at the free surface of the crystal with a highly doped p++ or p-contact layer that enables a high quality electrical p-type contact to the device.

Once the waveguide gain element or laser diode epitaxial structure has been transferred to the carrier wafer as described in this invention, wafer level processing can be used to fabricate the die into waveguide gain element or laser diode devices. The wafer process steps may be similar to those described in this specification for more conventional waveguide gain element or laser diodes. For example, in many embodiments the bonding media and die will have a total thickness of less than about 7 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The waveguide gain element or laser diode device may have stripe region formed in the transferred gallium and nitrogen containing epitaxial layers. In the case where the waveguide gain element or laser is formed on a polar c-plane, the waveguide can be aligned in the in-direction with cleaved or etched mirrors. Alternatively, in the case where the waveguide gain element or laser is formed on a semipolar plane, the waveguide can be aligned in a projection of a c-direction. The waveguide gain element or laser strip region has a first end and a second end and is formed on a gallium and nitrogen containing substrate having a pair of etched or cleaved waveguide ends or mirror structures, which face each other. In the case of laser diodes and waveguide gain elements the first cleaved facet comprises a reflective coating and the second cleaved facet comprises no coating, a reflective coating, or in a waveguide gain element an anti-reflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAME), or other method. Typical gases used in the etching process may include Cl and/or BCl3. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets facet each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The waveguide gain element or laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 35 microns, and others. In a specific embodiment, the width is substantially constant in dimension, although there may be slight variations. The width and length are often formed using a masking and etching process, which are commonly used in the art.

The waveguide gain element or laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Figure 9:
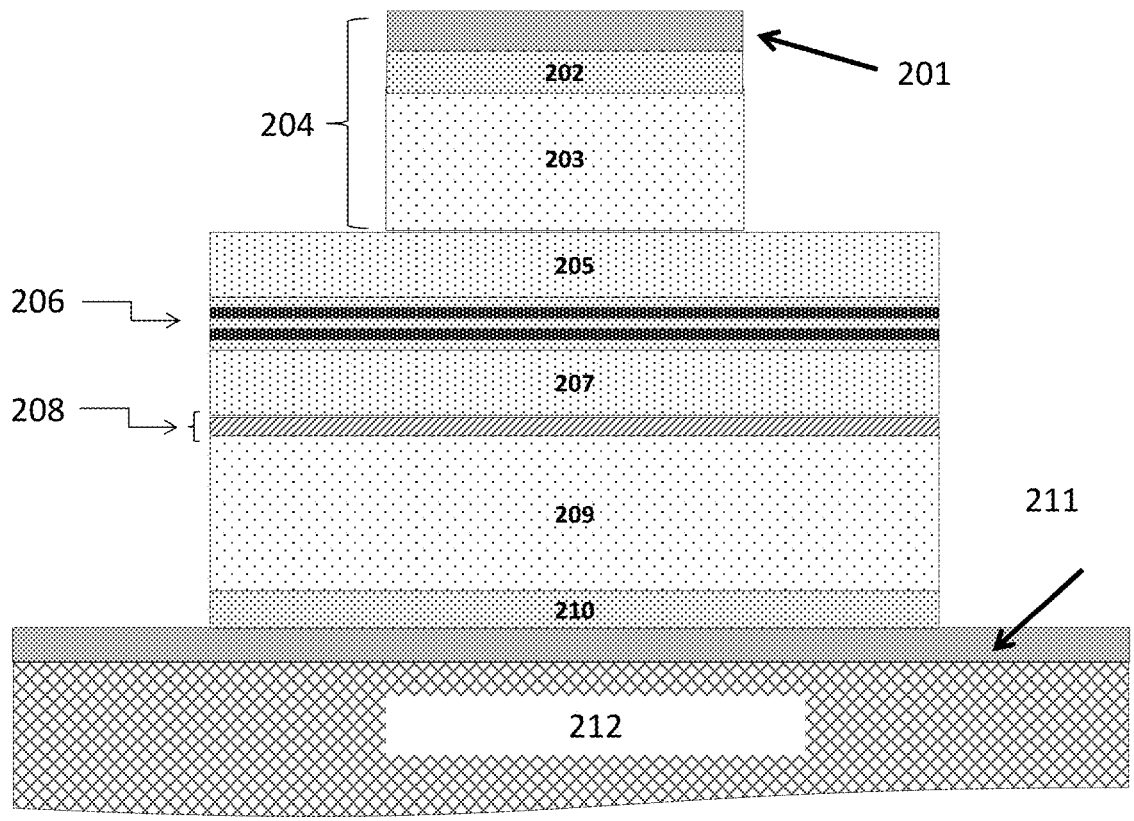
FIG. 9 is a simplified diagram illustrating an example of waveguide gain element or laser diode device structure formed on carrier wafer from epitaxial structure in FIG. 8 according to the present invention.

An example of a processed waveguide gain element or laser diode cross-section according to one embodiment of the present invention is shown in FIG. 9. In this example an n-contact 201 is formed on top of n-type gallium and nitrogen contact layer 202 and n-type cladding layer 203 that have been etched to form a ridge waveguide 204. The n-type cladding layer 203 overlies an n-side waveguide layer or separate confinement hetereostructure (SCH) layer 205 and the n-side SCH overlies an active region 206 that contains light emitting layers such as quantum wells. The active region overlies an optional p-side SCH layer 207 and an electron blocking layer (EBL) 208. The optional p-side SCH layer overlies the p-type cladding 209 and a p-contact layer 210. Underlying the p-contact layer 210 is a metal stack 211 that contains the p-type contact and bond metal used to attach the transferred gallium and nitrogen containing epitaxial layers to the carrier wafer 212.

Once the waveguide gain elements or lasers have been fully processed within the gallium and nitrogen containing layers that have been transferred to the carrier wafer, the carrier wafer must be diced. Several techniques can be used to dice the carrier wafer and the optimal process will depend on the material selection for the carrier wafer. As an example, for Si, InP, or GaAs carrier wafers that cleave very easily, a cleaving process can be used wherein a scribing and breaking process using conventional diamond scribe techniques may be most suitable. For harder materials such as GaN, AlN, SiC, sapphire, or others where cleaving becomes more difficult a laser scribing and breaking technique may be most suitable. In other embodiments a sawing process may be the most optimal way to dice the carrier wafer into individual laser chips. In a sawing process a rapidly rotating blade with hard cutting surfaces like diamond are used, typically in conjunction with spraying water to cool and lubricate the blade. Example saw tools used to commonly dice wafers include Disco saws and Accretech saws.

By choosing a carrier wafer material such as AlN, BeO, diamond, or SiC that is suitable as a submount between the waveguide gain element or laser chip and the mounting surface, the diced waveguide gain element or laser chip on the carrier wafer is in itself a chip on submount (CoS). This wafer level packaging features is a strong benefit of the lifted-off and transferred gallium and nitrogen containing epitaxial layer embodiment of this invention. The submount can be the common support member wherein the phosphor member of in the light source would also be attached. Alternatively, the submount can be an intermediate submount intended to be mounted to the common support member wherein the phosphor material is attached. The submount member is characterized by a width, length, and thickness. In one example wherein the submount is the common support member for the phosphor and the waveguide gain element or laser diode, the submount would likely have a length ranging in dimension from about 0.5 mm to about 3 mm or about 5 mm, a width ranging from about 0.3 mm to about 1 mm or from about 1 mm to 3 mm, and a thickness from about 200 um to about 1 mm. In tan example wherein the submount is an intermediate submount between the waveguide gain element or laser diode and the common support member it may be characterized by length ranging in dimension from about 0.5 mm to about 2 mm, a width ranging from about 150 um to about 1 mm, and the thickness may ranging from about 50 um to about 500 um.

Figure 10:
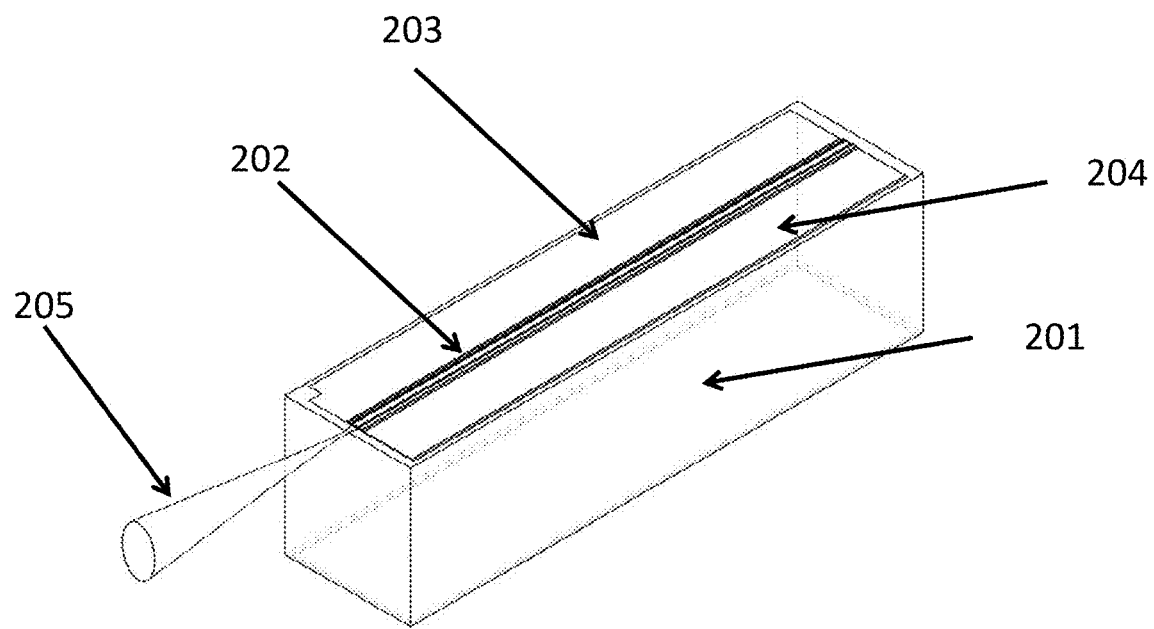
FIG. 10 is a simplified diagram illustrating a chip on submount (CoS) fabricated via wafer-level processing after transfer of gallium and nitrogen containing epitaxial layers according to an embodiment of the present invention.

A schematic diagram illustrating a CoS waveguide gain element or laser diode based on lifted off and transferred epitaxial gallium and nitrogen containing layers according to this present invention is shown in FIG. 10. The CoS is comprised of submount material 201 configured from the carrier wafer with the transferred epitaxial material with a laser diode configured within the epitaxy 202. Electrodes 203 and 204 are electrically coupled to the n-side and the p-side of the waveguide gain element or laser diode device and configured to transmit power from an external source to the laser diode to generate a laser beam output 205 from the laser diode. The electrodes are configured for an electrical connection to an external power source such as a laser driver, a current source, or a voltage source. Wirebonds can be formed on the electrodes to couple the power to the waveguide gain element or laser diode device. This integrated CoS device with transferred epitaxial material offers advantages over the conventional configuration illustrated in FIG. 4 such as size, cost, and performance due to the low thermal impedance.

Further process and device description for this embodiment describing waveguide gain element or laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

In this embodiment, the carrier wafer can be selected to provide an ideal submount material for the laser based light source. That is, the carrier wafer serving as the laser diode submount would also serve as the common support member for the laser diode and the phosphor to enable an ultra-compact laser based light source comprising a gallium and nitrogen containing waveguide gain element or laser diode emitting in the violet or blue region and a wavelength conversion member, preferably a phosphor member. In one example, the carrier wafer is formed from silicon carbide (SiC). SiC is an ideal candidate due to its high thermal conductivity, low electrical conductivity, high hardness and robustness, and wide availability. In other examples AlN, diamond, GaN, InP, GaAs, or other materials can be used as the carrier wafer and resulting submount for the laser based light source. In one example, the waveguide gain element chip or laser chip is diced out such that there is an area in front of the front facet intended for the phosphor. The phosphor material would then be bonded to the carrier wafer and configured for laser excitation according to this embodiment.

After fabrication of the waveguide gain element or laser diode on a submount member, in one or more embodiments of this invention the construction of the laser based light source would proceed to integration of the phosphor in the laser system or with the waveguide gain element or laser diode and common support member. Phosphor selection is a key consideration within the laser based light source. The phosphor must be able to withstand the extreme optical intensity and associated heating induced by the excitation spot without severe degradation. Important characteristics to consider for phosphor selection include;

- A high conversion efficiency of optical excitation power to white light lumens. In the example of a blue laser exciting a yellow phosphor, a conversion efficiency of over 150 lumens per optical watt, or over 200 lumens per optical watt, or over 300 lumens per optical watt is desired.
- A high optical damage threshold capable of withstanding 1-20 W of laser power in a spot comprising a diameter of 1 mm, 500 um, 200 um, 100 um, or even 50 um.
- High thermal damage threshold capable of withstanding temperatures of over 150° C., over 200° C., or over 300° C. without decomposition.
- A low thermal quenching characteristic such that the phosphor remains efficient as it reaches temperatures of over 150° C., 200° C., or 250° C.
- A high thermal conductivity to dissipate the heat and regulate the temperature. Thermal conductivities of greater than 3 W/mK, greater than 5 W/mK, greater than 10 W/mKm, and even greater than 15 W/mK are desirable.
- A proper phosphor emission color for the application
- A suitable porosity characteristic that leads to the desired scattering of the coherent excitation without unacceptable reduction in thermal conductivity or optical efficiency.
- A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.
- A surface condition optimized for the application. In an example, one or more of the phosphor surfaces can be intentionally roughened for improved light extraction.

In a preferred embodiment, a blue waveguide gain element or laser diode operating in the 420 nm to 480 nm wavelength range would be combined with a phosphor material providing a yellowish emission in the 560 nm to 580 nm range such that when mixed with the blue emission of the waveguide gain element or laser diode a white light is produced. For example, to meet a white color point on the black body line the energy of the combined spectrum may be comprised of about 30% from the blue emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the one or more waveguide gain elements or laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du 'v' of less than 0.010 of the Planckian blackbody locus of points. In an example, the color point of the white light is preferably located within du 'v' of less than 0.03 of the Planckian blackbody locus of points.

The wavelength conversion member is preferably a phosphor material in the laser based light source according to this invention. The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment a blue emitting gallium and nitrogen containing waveguide gain element or laser diode is combined with a phosphor material comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for excitation by the high brightness spots associated with laser sources can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase outcoupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, a ceramic yttrium aluminum garnets (YAG) doped with Ce3+ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:CE can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt. Additionally, the ceramic YAG:Ce phosphors is characterized by a temperature quenching characteristics above 150° C., above 200° C., or above 250° C. and a high thermal conductivity of 5-10 W/mK to effectively dissipate heat to a heat sink member and keep the phosphor at an operable temperature.

In another preferred embodiment according to this invention, the white light source is configured with a single crystal phosphor (SCP) such as YAG:Ce. In one example the Ce:Y3Al5O12 SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt. Additionally, the single crystal YAG:Ce phosphors is characterized by a temperature quenching characteristics above 150° C., above 200° C., or above 300° C. and a high thermal conductivity of 8-20 W/mK to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:CE can be configured to emit a yellow emission. In alternative or the same embodiments a YAG:CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one embodiment of the present invention the phosphor material contains a yttrium aluminum garnet host material and a rare earth doping element, and others. In an example, the wavelength conversion element is a phosphor which contains a rare earth doping element, selected from one or more of Ce, Nd, Er, Yb, Ho, Tm, Dy and Sm, combinations thereof, and the like. In some examples the phosphor is doped with Gadolinium (Gd) to enhance it emission propertie. In an example, the phosphor material is a high-density phosphor element. In an example, the high-density phosphor element has a density greater than 90% of pure host crystal. Cerium (III)-doped YAG (YAG:Ce3+, or Y3Al5O12:Ce3+) can be used wherein the phosphor absorbs the light from the violet or blue waveguide gain element or laser diode and emits in a broad range from greenish to reddish, with most of output in yellow. This yellow emission combined with the remaining blue emission gives the "white" light, which can be adjusted to color temperature as warm (yellowish) or cold (blueish) white. The yellow emission of the Ce3+:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with Ce3+ ions (Y1-aGda)3(Al1-bGab)5O12:Ce3+, SrGa2S4:Eu2+, SrS:Eu2+, terbium aluminum based garnets (TAGs) (Tb3Al5O5), colloidal quantum dot thin films containing CdTe, ZnS, ZnSe, ZnTe, CdSe, or CdTe.

In further alternative examples, some rare-earth doped Sialons can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red CaAlSiN3-based (CASN) phosphor may be used.

In yet a further example, white light sources can be made by combining near ultraviolet emitting laser diodes with a mixture of high efficiency europium based red and blue emitting phosphors plus green emitting copper and aluminium doped zinc sulfide (ZnS:Cu,Al).

In an example, a phosphor or phosphor blend can be selected from one or more of (Y, Gd, Tb, Sc, Lu, La)$_3$(Al, Ga, In)$_5$O$_{12}$:Ce$^{3+}$, SrGa$_2$S$_4$:Eu$^{2+}$, SrS:Eu$^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from one or more of the group consisting of (Gd,Y,Lu,La)$_2$O$_3$:Eu$^{3+}$, Bi$^{3+}$; (Gd,Y,Lu,La)$_2$O$_2$S:Eu$^{3+}$, Bi$^{3+}$; (Gd,Y,Lu,La)VO$_4$:Eu$^{3+}$, Bi$^{3+}$; Y$_2$(O,S)$_3$: Eu$^{3+}$; Ca$_{1-x}$Mo$_{1-y}$Si$_y$O$_4$: where $0.05 \leq x \leq 0.5$, $0 \leq y \leq 0.1$; (Li,Na,K)$_5$Eu(W,Mo)O$_4$; (Ca,Sr)S:Eu$^{2+}$; SrY$_2$S$_4$:Eu$^{2+}$; CaLa$_2$S$_4$:Ce$^{3+}$; (Ca,Sr)S:Eu$^{2+}$; 3.5MgO*0.5MgF$_2$*GeO$_2$:Mn$^{4+}$(MFG); (Ba,Sr,Ca)Mg$_x$P$_2$O$_7$:Eu$^{2+}$, Mn$^{2+}$; (Y,Lu)$_2$WO$_6$:Eu$^{3+}$, Mo$^{6+}$; (Ba,Sr,Ca)$_3$Mg$_x$Si$_2$O$_8$:Eu$^{2+}$, Mn$^{2+}$, wherein $1 < x \leq 2$; (RE$_{1-y}$Ce$_y$)Mg$_{2-x}$Li$_x$Si$_{3-x}$P$_x$O$_{12}$, where RE is at least one of Sc, Lu, Gd, Y, and Tb, $0.0001 < x < 0.1$ and $0.001 < y < 0.1$; (Y, Gd, Lu, La)$_{2-x}$Eu$_x$W$_{1-y}$Mo$_y$O$_6$, where $0.5 \leq x \leq 1.0$, $0.01 \leq y \leq 1.0$; (SrCa)$_{1-x}$Eu$_x$Si$_5$N$_8$, where $0.01 \leq x \leq 0.3$; SrZnO$_2$:Sm$^{+3}$; M$_m$O$_n$X, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and Eu$^{3+}$ activated phosphate or borate phosphors; and mixtures thereof. Further details of other phosphor species and related techniques can be found in U.S. Pat. No. 8,956,894, in the name of Raring et al. issued Feb. 17, 2015, and titled White light devices using non-polar or semipolar gallium containing materials and phosphors, which is commonly owned, and hereby incorporated by reference herein.

In some embodiments of the present invention, ceramic phosphor materials are embedded in a binder material such as silicone. This configuration is typically less desirable because the binder materials often have poor thermal conductivity, and thus get very hot wherein they rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the laser based light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 1 W to 100 W range focused to spot sizes of less than 1 mm in diameter, less than 500 microns in diameter, or even less than 100 microns in diameter, power densities of over 1 W/mm2, 100 W/mm2, or even over 2,500 W/mm2 can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm2, 10 W/mm2, or even over 250 W/mm2. Thus, even for this best case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is either attached to the common support member as the waveguide gain element or laser diode as in the laser based light source or is attached to an intermediate submount member that is subsequently attached to the common support member. Candidate materials for the common support member or intermediate submount member are SiC, AlN, BeO, diamond, copper, copper tungsten, sapphire, aluminum, or others. The interface joining the phosphor to the submount member or common support member must be carefully considered. The joining material should be comprised of a high thermal conductivity material such as solder (or other) and be substantially free from voids or other defects that can impede heat flow. In some embodiments, glue materials can be used to fasten the phosphor. Ideally the phosphor bond interface will have a substantially large area with a flat surface on both the phosphor side and the support member sides of the interface.

In the present invention, the waveguide gain element or laser diode output beam must be configured to be incident on the phosphor material to excite the phosphor. In some embodiments the laser beam may be directly incident on the phosphor and in other embodiments the laser beam may interact with an optic, reflector, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

The apparatus typically has a free space with a non-guided optical beam characteristic transmitting the emission of the laser beam from the waveguide gain element or laser device to the phosphor material. The beam spectral width, wavelength, size, shape, intensity, and polarization are configured to excite the phosphor material. The beam can be configured by positioning it at the precise distance from the phosphor to exploit the beam divergence properties of the waveguide gain element or laser diode and achieve the desired spot size. In one embodiment, the incident angle from the waveguide to the phosphor is optimized to achieve a desired beam shape on the phosphor. For example, due to the asymmetry of the waveguide element laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The laser light source apparatus also has an electrical input interface configured to couple electrical input power to the waveguide gain element or laser diode device to activate the laser and generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 1000 lumens, 10,000 lumens, or greater of white light output.

The support member is configured to transport thermal energy from the at least one waveguide gain element or laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(mK), aluminum with a thermal conductivity of about 200 W/(mK), 4H—SiC with a thermal conductivity of about 370 W/(mK), 6H—SiC with a thermal conductivity of about 490 W/(mK), AlN with a thermal conductivity of about 230 W/(mK), a synthetic diamond with a thermal conductivity of about >1000 W/(mK), sapphire, or other metals, ceramics, or semiconductors. The support member may be formed from a growth process such as SiC, AlN, or synthetic diamond, and then mechanically shaped by machining, cutting, trimming, or molding. Alternatively the support member may be formed from a metal such as copper, copper tungsten, aluminum, or other by machining, cutting, trimming, or molding.

In a preferred configuration of this laser based light source, the common support member comprises the same submount that the gallium and nitrogen containing the waveguide gain element or laser diode chip is directly bonded to. That is, the gallium and nitrogen containing chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The gallium and nitrogen containing waveguide gain element or laser diode can be attached to a first surface of the submount using conventional die attaching techniques using solders such as AuSn solder, but can be other techniques such as SAC solder, lead containing phosphor, or indium. Similarly, the phosphor material may be bonded to the submount using a soldering technique such as AuSn solder, SAC solder, lead containing phosphor, or with indium, but it can be other techniques. The joint could also be formed from thermally conductive glues, thermal epoxies such as silver epoxy, thermal adhesives, and other materials. Alternatively the joint could be formed from a metal-metal bond such as a Au—Au bond. Optimizing the bond for the lowest thermal impedance is a key parameter for heat dissipation from the phosphor, which is critical to prevent phosphor degradation and thermal quenching of the phosphor material.

In an alternative configuration of this laser based light source, the gallium and nitrogen containing waveguide gain element or laser diode is bonded to an intermediate submount configured between the gallium and nitrogen containing chip and the common support member. In this configuration, the intermediate submount can be comprised of SiC, AlN, diamond, or other, and the laser can be attached to a first surface of the submount using conventional die attaching techniques using solders such as AuSn solder, but can be other techniques such as. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper. The phosphor material may be bonded using a soldering technique. In this configuration, the common support member should be configured of a thermally conductive material such as copper. Optimizing the bond for the lowest thermal impedance is a key parameter for heat dissipation from the phosphor, which is critical to prevent phosphor degradation and thermal quenching of the phosphor material.

In a specific embodiment of the present invention, the laser based light source is configured for a side-pumped phosphor operated in transmissive mode. In this configuration, the phosphor is positioned in front of the waveguide gain element or laser facet that outputs the optical beam such that upon activation the generated beam is incident on a backside of the phosphor, wherein both the waveguide gain element or laser and the phosphor are configured on a support member. The gallium and nitrogen containing waveguide gain element or laser diode is configured with a length greater than 100 um, greater than 500 um, greater than 1000 um, or greater than 1500 um long and a width greater than 1 um, greater than 10 um, greater than 20 um, greater than 30 um, or greater than 45 um. In the embodiments wherein conventional gallium and nitrogen laser diodes are deployed, the cavity is configured with a front facet or mirror and back facet or mirror on the end, wherein the front facet comprises the output facet and configured to emit the laser beam incident on the phosphor. The front facet can be configured with an anti-reflective coating to decrease the reflectivity or no coating at all thereby allowing radiation to pass through the mirror without excessive reflectivity. In some cases the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%.

In one example, the phosphor is comprised of a ceramic yttrium aluminum garnet (YAG) doped with Ce3+ ions and emits yellow emission. The phosphor is shaped as a block, plate, sphere, cylinder, or other geometrical form. Specifically, the phosphor geometry primary dimensions may be less than 50 um, less than 100 um, less than 200 um, less than 500 um, less than 1 mm, or less than 10 mm. Operated in transmissive mode, the phosphor has a first primary side (back side) for receiving the incident laser beam and at least a second primary side (front side) where most of the useful white light will exit the phosphor to be coupled to the application. The phosphor is attached to the common support member or submount positioned in front of the waveguide gain element or laser diode output facet such that the first primary side of the phosphor configured for receiving the excitation light will be in the optical pathway of the output beam. The beam geometrical shape, size, spectral width, wavelength, intensity, and polarization are configured to excite the phosphor material. An advantage to transmissive mode phosphor operation is mitigation of the excitation source blocking or impeding any useful white light emitted from the primary emitting surface. Additionally, by exciting from the backside of the phosphor there will not be an obstruction relating to the excitation source or beam that may make integration of optics to collimate or project the white light difficult. In alternative embodiments the YAG: CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In some embodiments of this invention, the eye safe laser light source is configured with a gallium and nitrogen containing waveguide gain element, a first and a second mirror providing optical feedback to the gain medium to form a cavity and achieve a lasing condition, and a wavelength conversion member such as a phosphor. The output of the eye safe laser light source is a white light output for example wherein the white light is comprised of a yellow emission from a wavelength conversion member such as a phosphor member excited by a blue light and a scattered blue light from the gain medium or is comprised of multiple colors emitted from wavelength conversion members such as a blue and yellow phosphor member excited with a violet emission from the gain medium or a red, green, and a blue phosphor member excited from a violet emission from the gain medium. In this embodiment, the output in standard operation of the laser based light source is eye safe due to the incoherent nature of the emission and reduced directionality. Since all or most of the emission is comprised of wavelength converted emission from phosphor member emitting incoherent light in a Lambertian pattern and scattered light emitted from a laser source, the total coherence and directionality of the light source can be considered eye safe with appropriate design.

In a preferred first category of this novel eye safe laser light source invention, a design inherent safety feature requires that at least one of the first or second mirrors is integrated with or coupled to the wavelength conversion material such that if the wavelength conversion material is damaged or compromised the optical feedback to the gain element is reduced and laser operation is ceased. In preferred embodiments of this invention the wavelength conversion member is a phosphor member. This safety feature is based on the so-called threshold condition of a laser system. The threshold condition is achieved when the gain inside the laser cavity is equal to all of the losses within the cavity wherein the losses include absorption loss, scattering loss, radiation loss, and the useful output of the laser which is also a loss from the cavity. In this invention, the gain is achieved in a gallium and nitrogen containing material typically configured in a waveguide wherein the light propagates. Gain is provided through an electrical pumping of the gallium and nitrogen containing gain medium, which creates a population inversion in the light emitting layers comprised of quantum wells or double hetereostructures. As the electrical pumping is increased through an increase in carrier density in the light emitting layers, the gain of the waveguide gain element increases until the gain equals the losses. At this so-called threshold condition stimulated emission takes over and the optical output power versus electrical input current characteristic exhibits a strong knee where the optical output power and spectral coherence rapidly increases. Above this threshold condition the laser is "lasing" and below this condition the output power is much lower [$1/10$ to $1/1000$] with drastically less coherence [$1/2$ to $1/1000$]. In this category of eye safe laser light source designs one or more of the mirrors comprising the laser cavity is coupled to the wavelength conversion material. If this wavelength conversion material is damaged or compromised, the feedback into the cavity would drastically reduce and hence increase the losses in the cavity such that the losses would exceed the gain and hence the laser would cease to maintain lasing operation falling below the threshold condition.

In a preferred embodiment in the first category of this invention an external cavity wavelength conversion configuration is formed. In this embodiment a gallium and nitrogen containing waveguide gain element is configured to emit a violet or blue wavelength and is configured with two ends of the waveguide. The first end of the waveguide is configured as a reflector and serves as the first cavity mirror of the laser diode providing strong optical feedback into the gain element. This first end mirror can be formed with a facet that can optionally be coated with a layer or layer stack that further increases the reflectivity. For example, the reflectivity of this first end can be increased to greater than 85% or 95%. The second end of the waveguide is configured for a reduced reflectivity for a low optical feedback to the gain element. The reduced reflectivity can be achieved with output facets angled relative to the waveguide and/or with optical coatings configured to reduce the reflectivity. For example, the reflectivity of this second end can be reduced to less than 5%, 1%, 0.1%, or 0.001%. The violet or blue wavelength output beam from the gain element exits this second end and is incident on a first surface of the wavelength conversion material where it excites the conversion material and generates at least a second wavelength. In one example of this preferred embodiment, the first surface of the wavelength conversion material itself is configured as the second mirror of the laser light source to complete the cavity. In this example the first surface functions to reflect a fraction of the violet or blue emission back into the gain element providing the optical feedback necessary to achieve the lasing condition. In another example of this preferred embodiment, a reflector member is configured on or coupled to the first surface of the wavelength conversion member. The reflector member serves as the second mirror of the laser light source to complete the cavity and functions to reflect a fraction of the violet or blue emission back into the gain element providing the optical feedback necessary to achieve the lasing condition. Since the wavelength conversion member is positioned just outside the cavity this preferred embodiment is an external cavity wavelength conversion configuration.

In this preferred embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member with the coupled reflector is positioned at a certain distance from the second end of the waveguide gain element. This distance or gap between the waveguide gain element and the phosphor can be comprised of free-space such that the violet or blue beam exiting the second end of the waveguide gain element travels through a free space before being reflected from the second mirror configured to be coupled to the first surface of the phosphor member. In another example the distance or gap between the second end of the waveguide gain element and the first surface of the phosphor wavelength conversion element is filled with a selected material. In yet another example the phosphor wavelength conversion member is fixed or attached to the second end of waveguide gain element. In this configuration intermediate layers or adhesive materials can be positioned between the first surface of the phosphor member or the wavelength conversion member and the waveguide gain element.

As described above, in this preferred embodiment the wavelength conversion member or phosphor member has two primary surfaces. The first surface can itself be configured to reflect the incident violet or blue light back into the gallium and nitrogen containing gain medium and complete the cavity or can be configured with a reflector member to enhance the reflection properties from the first surface. The first surface and/or the reflector member on the first surface is designed to reflect a first fraction of the incident beam back into the gain element and allow a second fraction of the beam to pass into the wavelength conversion member where at least a second wavelength is generated. The first fraction of light reflected back into the gain element is required to maintain the laser light source in a state of lasing and the second fraction of light exciting the wavelength conversion material is required to generate the eye safe light output from the laser light source. Since the second mirror forming the cavity is integrated with or coupled to the first surface of the wavelength conversion material as a reflector, if the wavelength conversion material is damaged, removed, displaced, or compromised it will directly affect or impair the optical feedback into the laser cavity. This impaired feedback results in an increased loss within the laser cavity and drops the laser below the threshold condition wherein the output optical power and coherence substantially reduces to a level of eye safety.

Figure 11:
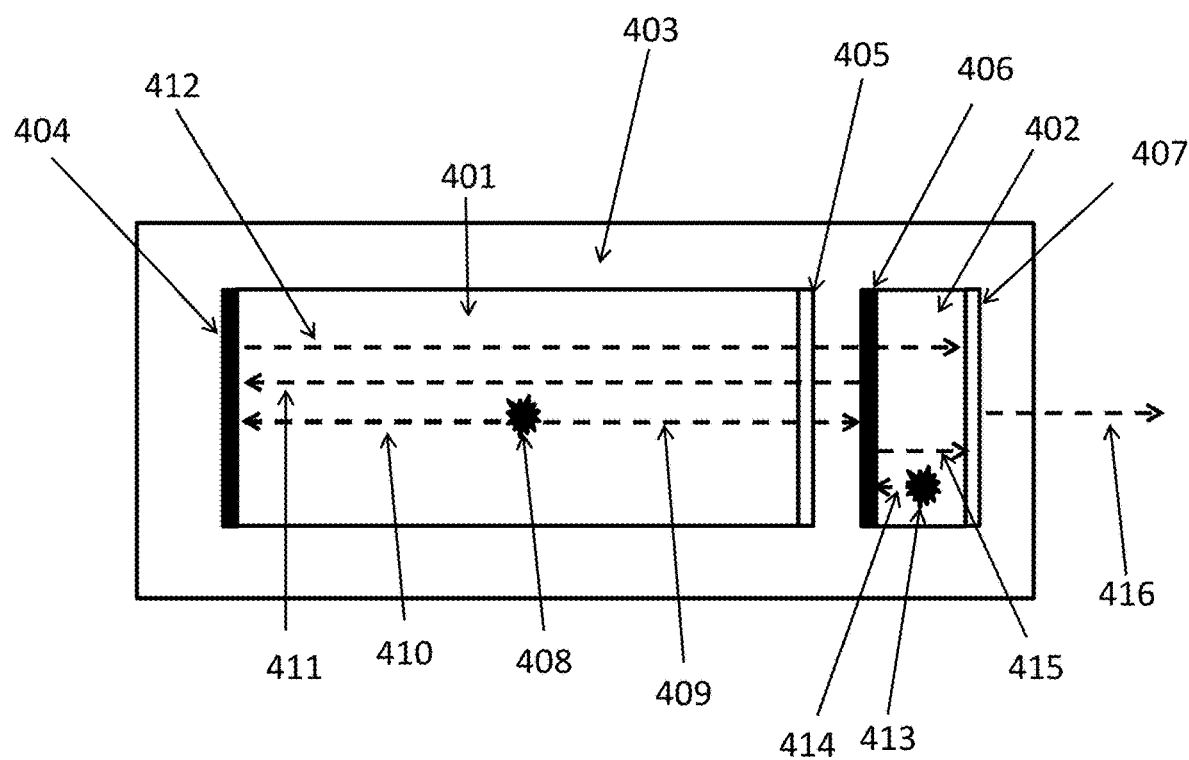
FIG. 11 is a top view schematic illustrating a laser based light source with external cavity wavelength conversion according to this invention.

FIG. 11 presents a top view schematic with ray tracing to illustrate a simplified version of operation according to one embodiment of an external cavity wavelength conversion eye-safe laser based light source. The laser based light source device is comprised of a gallium and nitrogen containing waveguide gain element 401, a wavelength conversion member such as one or more phosphor members 402, and a common support member 403 configured to act as a base member for the gain element and the one or more phosphor members. The waveguide gain element comprises a first end 404 and a second end 405 and the phosphor member comprises a first surface 406 and a second surface 407. The laser based light source is configured with an electrical input to couple electrical power to the waveguide gain element and generate emission of violet or blue excitation light 408 in the waveguide gain element. The generated emission is waveguided and configured to propagate backward toward the first end 404 and forward toward the second end 405. The forward propagating light 409 is preferably transmitted through the second end 405. In a specific example, the second end is a cleaved or an etched facet. In a preferred embodiment the second end is configured for a low reflectivity to prevent substantial optical feedback and prevent lasing off that end. To achieve the low reflectivity an optical coating can be applied to reduce the reflectivity and/or facet shaping can be introduced. Facet shaping can include using an angled facet to prevent feedback, a roughening of the facet, or any other modifications to the surface or shape of the facet. Through the use of coating and/or facet shaping the total reflectivity of the second end can be made to be less than 5%, 1%, 0.1%, 0.01%, or 0.001%. The backward propagating light 410 is reflected on the first end 404 and becomes forward propagating light 411. In a specific example, the first end is a cleaved or an etched facet. In a preferred embodiment the first end has a high reflectivity coating applied to it to increase the reflectivity to greater than 70%, 80%, 90%, or 95%. After reflection on the first end this initially backward propagating light is forward propagating where it encounters the second waveguide end configured for low reflectivity. Since both the initial forward and initial backward propagating light will be substantially incident on the second end configured for low reflectivity, this light will be transmitted out of the second facet and onto the first surface of the one or more phosphor members. In a preferred embodiment the waveguide gain element within the laser based light source is a superluminescent diode (SLED).

In this external cavity laser embodiment in FIG. 11 according to the present invention, the blue or violet excitation light exiting the waveguide gain element is incident on the first surface 406 of the one or more phosphor members 406. The first surface of the phosphor member is configured to reflect a substantial portion of the incident excitation light into backward light 412 and into the waveguide gain element and provide optical feedback to the waveguide gain element 401. This optical feedback enables the system to achieve a threshold condition wherein stimulated emission takes over and lasing is induced to realize the laser based light source. The portion of the incident excitation light on the phosphor that is not reflected is transmitted into the one or more phosphor where it excites 413 the one or more phosphors and creates a wavelength conversion, wherein the converted light is emitted in a lambertian, isotropic, or other pattern. The light that is emitted toward the second surface of the one or more phosphors 407 is configured to escape the one or more phosphor as useful light. The light that is emitted 414 toward the first surface of the one or more phosphor 406 is preferably configured to reflect back 415 toward the second surface 407 of the one or more phosphors where it is configured to escape the one or more phosphor as useful light. The resulting output light 416 is compromised of the wavelength converted light and in some embodiments a mixture of the wavelength converted light and the excitation light. The second surface 407 of the one or more phosphor member is preferably configured for a reduced reflectivity for the wavelength converted light to increase the output of the converted light. In some preferred embodiments the second surface of the one or more phosphor members 407 is configured for an increased or decreased reflectivity of the excitation light.

In some examples of this embodiment according to FIG. 11, the first surface of the one or more phosphor members 406 is physically attached to the second end of the waveguide gain element 405, either in direct contact or with intermediate materials separating them. Examples of intermediate materials include ceramic materials, semiconductor materials, dielectric materials, adhesive materials, or other materials. In some examples of this embodiment there is a free space between the first surface of the one or more phosphor members 406 and the second end of the waveguide gain element 405 as depicted in the schematic. In a specific embodiment, an optical element is positioned between the first surface of the one or more phosphor members 406 and the second end of the waveguide gain element 405. The optical element could be a free-space optic designed to collimate and/or shape the output of the waveguide gain element. Optics such as aspheric lens, slow axis collimating lens, fast axis collimating lens, ball lens, or other can be included according to this invention.

Figure 12:
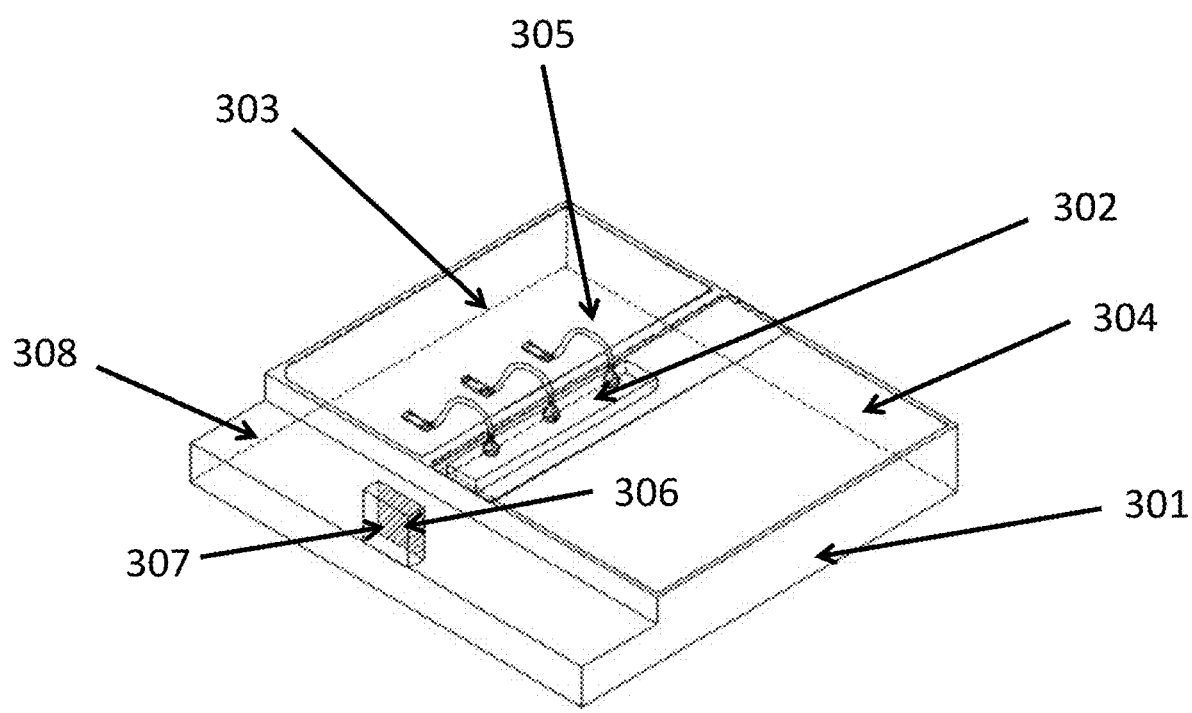
FIG. 12 is a simplified diagram illustrating a laser based light source with external cavity wavelength conversion with a laser diode and phosphor member integrated onto a submount according to an embodiment of the present invention.

FIG. 12 presents a schematic diagram illustrating an embodiment of an external cavity wavelength conversion eye-safe laser based light source based on a conventionally conformed waveguide gain element formed on gallium and nitrogen containing substrate technology according to this present invention. The laser based light source device is comprised of submount material 301 that serves as the common support member configured to act as an intermediate material between a waveguide gain element chip 302 and a final mounting surface and as an intermediate material between the phosphor material 306/307 and a final mounting surface. The submount is configured with electrodes 303 and 304 that may be formed with deposited metal layers such as Au. In one example, Ti/Pt/Au is used for the electrodes. Wirebonds 305 are configured to couple the electrical power from the electrodes 303 and 304 on the submount to the waveguide gain element chip to generate an output optical beam. The beam output is incident on a first surface of a one or more phosphor members 306 positioned in front of the waveguide gain element output facet wherein the first surface is configured to provide an optical reflection or feedback into the waveguide gain element to induce a laser operation. The first surface comprises a mirror of the laser cavity and can be treated for a modified reflectivity to both the waveguide gain element violet or blue excitation light and the wavelength converted light in the one or more phosphor members. The one or more phosphor member has a second surface 307 configured for extraction of the useful light of the laser light source. The second surface can be treated for a modified reflectivity to both the waveguide gain element violet or blue excitation light and the wavelength converted light in the one or more phosphor member. For example, a blue excitation light from the waveguide may be converted to a yellow light to make a combination of blue and yellow light for a white light. In a second example, a blue excitation light from the waveguide may be converted to a red and green light in red and green phosphor members to make a combination of blue, red, and green light for white light. In a third example, a violet excitation light from the waveguide may be converted to a blue, red, and green light in blue, red, and green phosphor members to make a combination of blue, red, and green light for white light. The one or more phosphor members can be comprised of a phosphor plate is attached to the submount on a ledge 308 or recessed region. The electrodes 303 and 304 are configured for an electrical connection to an external power source such as a laser driver, a current source, or a voltage source. Wirebonds can be formed on the electrodes to couple the power to the waveguide gain element device. Of course this is merely an example of a configuration and there could be many variants on this embodiment including but not limited to different shape phosphors, different geometrical designs of the submount or common support member, different orientations of the output beam with respect to the phosphor, different electrode and electrical designs, and others.

Figure 13:
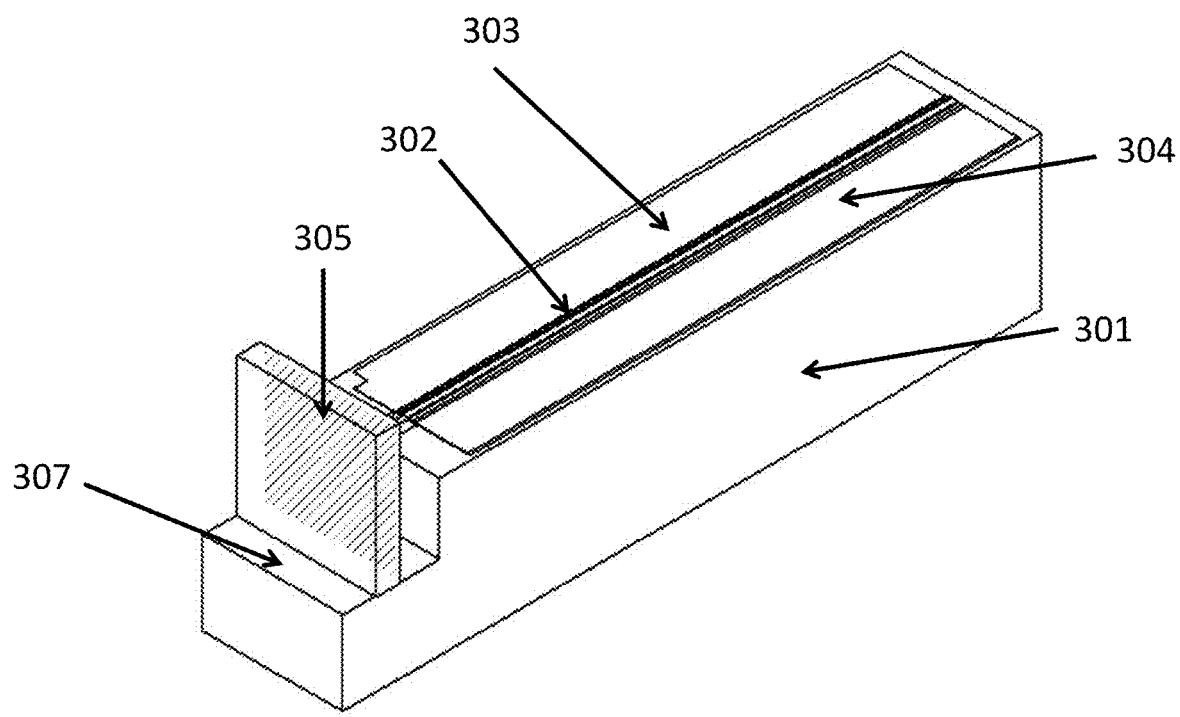
FIG. 13 is a simplified illustrating a laser based light source with external cavity wavelength conversion with the waveguide gain element fabricated in gallium and nitrogen containing epitaxial layers transferred to a submount member and a phosphor member integrated onto the submount member according to an embodiment of the present invention.

FIG. 13 presents a schematic diagram illustrating an embodiment of an external cavity wavelength conversion eye-safe laser based light source based on a transferred gallium and nitrogen containing material technology. The waveguide gain element formed on gallium and nitrogen containing epitaxial layers transferred from the substrate to a carrier wafer according to this present invention. The laser based light source device is comprised of submount material 301 formed from the carrier wafer that serves as the common support member configured to act as an intermediate material between a waveguide gain element chip 302 formed in the transferred gallium and nitrogen containing material and a final mounting surface and as an intermediate material between the one or more phosphor members 305/306 and a final mounting surface. The submount is configured with electrodes 303 and 304 that may be formed with deposited metal layers such as Au. In one example, Ti/Pt/Au is used for the electrodes. The optical beam output from the waveguide gain element is incident on a first surface of a one or more phosphor member 305 positioned in front of the waveguide gain element output facet wherein the first surface is configured to provide an optical reflection or feedback into the waveguide gain element to induce a laser operation. The first surface comprises a mirror of the laser cavity and can be treated for a modified reflectivity to both the waveguide gain element violet or blue excitation light and the wavelength converted light in the one or more phosphor member. The phosphor member has a second surface 306 configured for extraction of the useful light of the laser light source. The second surface can be treated for a modified reflectivity to both the waveguide gain element violet or blue excitation light and the wavelength converted light in the one or more phosphor member. For example, a blue excitation light from the waveguide may be converted to a yellow light to make a combination of blue and yellow light for a white light. In a second example, a blue excitation light from the waveguide may be converted to a red and green light in red and green phosphor members to make a combination of blue, red, and green light for white light. In a third example, a violet excitation light from the waveguide may be converted to a blue, red, and green light in blue, red, and green phosphor members to make a combination of blue, red, and green light for white light. The one or more phosphor member can be comprised of a phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple the power to the waveguide gain element device. Of course this is merely an example of a configuration and there could be many variants on this embodiment including but not limited to different shape phosphors, different geometrical designs of the submount or common support member, different orientations of the output beam with respect to the phosphor, different electrode and electrical designs, and others.

The second surface of the wavelength conversion or phosphor members is configured for emission of the output light from laser based light source. In a preferred embodiment the second surface is outfitted with a reflection modification member or process to increase the extraction of useful output light. For example, the reflection modification member or process would be configured to increase the extraction of the light generated in the wavelength conversion member. In another example, the reflection modification member or process would be configured to increase the extraction of the light generated in the wavelength conversion member and the light generated in the gallium and nitrogen containing waveguide gain member. Specifically, reflection modification members or processes could include optical coatings, shaping, roughening, or other measures applied to the second surface of the wavelength conversion material. Roughening of the phosphor member has been shown to be an effective method to reduce the amount of light reflected back into a phosphor or other wavelength conversion member and thereby increasing the extraction. There are several methods to inducing a roughening effect on the surface of the phosphor including in the formation process, with a wet chemical etching process, with a dry etching process, with a physical process, and could be other processes. By reducing the reflectivity of this surface to the useful output light wavelengths such as blue and yellow wavelengths or red, green, and blue wavelengths the useful light output from the laser based light source will be increased.

In this preferred external cavity wavelength conversion laser light source embodiment, the reflector members or reflection modification members can be configured and formed in several ways. For example, the reflector member can be an optical coating deposited directly on the phosphor wherein the coating is designed to provide a specified reflectivity for the blue or violet beam. The coating can be formed from a distributed feedback reflector (DBR) configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements. In some configurations the reflector member is attached to the wavelength conversion member using a method such as gluing, brazing, soldering, bonding such as thermo-compression bonding, etc, but can be others.

Multiple reflector characteristics and/or members can be deployed to form a reflector system on this first surface of the wavelength conversion member. For example, the reflector system can be designed to reflect the violet or blue wavelength beam as described above and additionally provide a designed reflectivity to the wavelength converted light to provide a reflection from within the wavelength conversion material off the first surface and increase the extraction of light through the second surface. Moreover, optical coatings, shaping, roughening, or other measures can be applied to the second surface of the wavelength conversion material to enhance extraction and increase the light output from the laser based light source.

In one example of this preferred external cavity wavelength conversion embodiment, the beam exiting the gain element has a blue wavelength to excite a phosphor conversion member to convert a fraction of the blue beam to a yellow light such that a resulting blue and yellow color combination provides a white light output. In a second example of this preferred embodiment, the beam exiting the gain element has a violet wavelength to excite phosphor conversion members to convert a fraction of the violet beam to a yellow light and a blue light such that a resulting blue and yellow color combination provides a white light output. In a third example of this preferred embodiment configured for an improved white light quality, the beam exiting the gain element has a violet wavelength to excite phosphor conversion members to convert a fraction of the violet beam to a red light, green light, and blue light such that a resulting red, green, and blue color combination provides a white light output.

In an alternative preferred embodiment of this first category of the present invention, an intra-cavity wavelength conversion laser light source is formed. In this embodiment, most elements of the laser light source configuration are identical to the external cavity wavelength conversion configuration described above with one main difference. This main difference being that the reflector member integrated with the wavelength conversion member forming the second mirror of the cavity is positioned on the second surface of the wavelength conversion member as opposed to the first surface. In this configuration the blue or violet output beam from the waveguide gain element enters the wavelength conversion member through the first surface, propagates through the conversion member where a fraction of the blue or violet light is converted, a portion is reflected back off the second surface of the conversion member where the second mirror of the laser source is configured, backward propagates through the conversion member, out the first surface, and back into the waveguide gain element for feedback. In this design, the wavelength conversion material is positioned between the first and second mirror of the laser light source forming an intra-cavity wavelength conversion characteristic. Since the second mirror forming the cavity is integrated with or coupled to the second surface of the wavelength conversion material as a reflector, if the wavelength conversion material is damaged, removed, displaced, or compromised it will directly affect or impair the optical feedback into the laser cavity. This impaired feedback results in an increased loss within the laser cavity and drops the laser below the threshold condition wherein the output optical power and coherence substantially reduces to a level of eye safety.

In this preferred intra-cavity wavelength conversion laser light source embodiment, the second mirror is configured as the second surface of the wavelength conversion member either as the surface itself or as the surface coupled to an additional reflector member. In the case where the excitation wavelength from the gallium and nitrogen containing gain element is not a critical element of the useful output spectrum, such as in the example of a violet excitation source for white light, the reflectivity of this second surface to the excitation light can be made very high [ie >70%, >80%, >90%] to contain most of the excitation light in the cavity. However, in the case where the excitation wavelength is required in the output spectrum, such as in a blue excitation and a blue plus yellow white light source, the reflectivity would need to be tuned to allow the appropriate amount of blue light escape. The reflector member can be configured and formed in several ways on the second surface of the wavelength conversion member material. For example, the reflector member can be an optical coating deposited directly on a phosphor wherein the coating is designed to provide a reflectivity characteristic for the blue or violet beam. The coating can be formed from a DBR configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements providing a reflectivity characteristic. In some configurations the reflector member is attached to the wavelength conversion member using a method such as gluing, brazing, soldering, bonding such as thermo-compression bonding, etc, but can be others.

Figure 14:
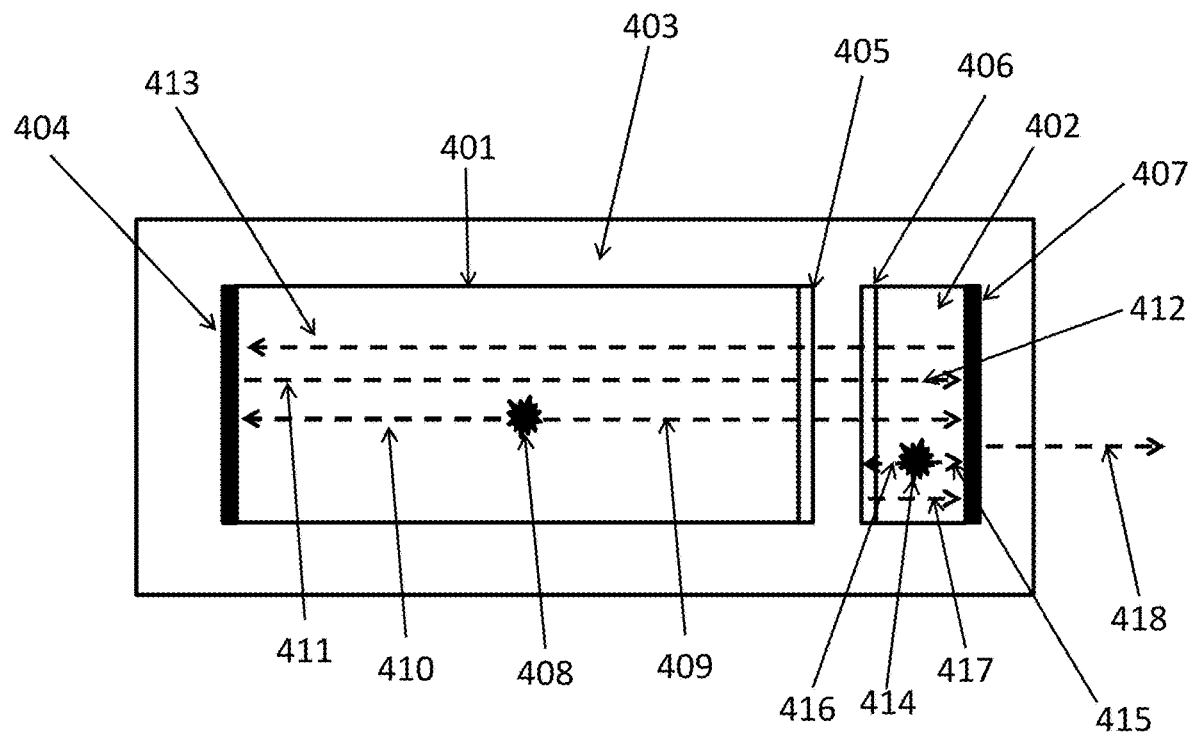
FIG. 14 is a top view schematic illustrating a laser based light source with internal cavity wavelength conversion according to this invention.

FIG. 14 presents a top view schematic with ray tracing to illustrate a simplified version of operation according to one embodiment of an internal cavity wavelength conversion eye-safe laser based light source. The laser based light source device is comprised of a gallium and nitrogen containing waveguide gain element 401, a wavelength conversion member such as one or more phosphor members 402, and a common support member 403 configured to act as a base member for the gain element and the one or more phosphor members. The waveguide gain element comprises a first end 404 and a second end 405 and the phosphor member comprises a first surface 406 and a second surface 407. The laser based light source is configured with an electrical input to couple electrical power to the waveguide gain element and generate emission of violet or blue excitation light 408 in the waveguide gain element. The generated emission is waveguided and configured to propagate backward toward the first end 404 and forward toward the second end 405. The forward propagating light 409 is preferably transmitted through the second end 405. In a specific example, the second end is a cleaved or an etched facet. In a preferred embodiment the second end is configured for a low reflectivity to prevent substantial optical feedback and prevent lasing off that end. To achieve the low reflectivity an optical coating can be applied to reduce the reflectivity and/or facet shaping can be introduced. Facet shaping can include using an angled facet to prevent feedback, a roughening of the facet, or any other modifications to the surface or shape of the facet. Through the use of coating and/or facet shaping the total reflectivity of the second end can be made to be less than 5%, 1%, 0.1%, 0.01%, or 0.001%. The backward propagating light 410 is reflected on the first end 404 and becomes forward propagating light 411. In a specific example, the first end is a cleaved or an etched facet. In a preferred embodiment the first end has a high reflectivity coating applied to it to increase the reflectivity to greater than 70%, 80%, 90%, or 95%. After reflection on the first end this initially backward propagating light is forward propagating where it encounters the second waveguide end configured for low reflectivity. Since both the initial forward and initial backward propagating light will be substantially incident on the second end configured for low reflectivity, this light will be transmitted out of the second facet and onto the first surface of the one or more phosphor members. In a preferred embodiment the waveguide gain element within the laser based light source is a superluminescent diode (SLED).

In this internal cavity laser embodiment in FIG. 14 according to the present invention, the blue or violet excitation light exiting the waveguide gain element is incident on the first surface 406 of the one or more phosphor members 406. The first surface of the one or more phosphor member 406 is configured for a low reflection to the incident excitation light, enabling a high coupling efficiency to the one or more phosphor members and without inducing substantial reflected light back into the waveguide gain element. Once entering the first surface of the phosphor member 406, a fraction of the light 412 will continue propagation and be incident on the second surface 407 of the one or more phosphor members. The second surface of the one or more phosphor members 407 is configured for a substantial reflectivity to the incident excitation light to reflect the light 413 backward and provide optical feedback to the waveguide gain element 401. This optical feedback enables the system to achieve a threshold condition wherein stimulated emission takes over and lasing is induced to realize the laser based light source. A fraction of the excitation light entering the first surface of the phosphor 406 will excite the one or more phosphors and create a wavelength converted light 414 in the one or more phosphor members, wherein the converted light is emitted in a lambertian, isotropic, or other pattern. The light 415 that is emitted toward the second surface of the one or more phosphors 407 is configured to escape the one or more phosphor as useful light. The light that is emitted 416 toward the first surface of the one or more phosphor 406 is preferably configured to reflect back 417 toward the second surface 407 of the one or more phosphors where it is configured to escape the one or more phosphor as useful light. The resulting output light 418 is compromised of the wavelength converted light and in some embodiments a mixture of the wavelength converted light and the excitation light.

In some examples according to this embodiment, the second surface 407 of the one or more phosphor member is preferably configured for a reduced reflectivity for the wavelength converted light to increase the output of the converted light. In some preferred embodiments the second surface of the one or more phosphor members 407 is configured for an increased or decreased reflectivity of the excitation light. In some examples of this embodiment according to FIG. 14, the first surface of the one or more phosphor members 406 is physically attached to the second end of the waveguide gain element 405, either in direct contact or with intermediate materials separating them. Examples of intermediate materials include ceramic materials, semiconductor materials, dielectric materials, adhesive materials, or other materials. In some examples of this embodiment there is a free space between the first surface of the one or more phosphor members 406 and the second end of the waveguide gain element 405 as depicted in the schematic. In a specific embodiment, an optical element is positioned between the first surface of the one or more phosphor members 406 and the second end of the waveguide gain element 405. The optical element could be a free-space optic designed to collimate and/or shape the output of the waveguide gain element. Optics such as aspheric lens, slow axis collimating lens, fast axis collimating lens, ball lens, or other can be included according to this invention.

Figure 15:
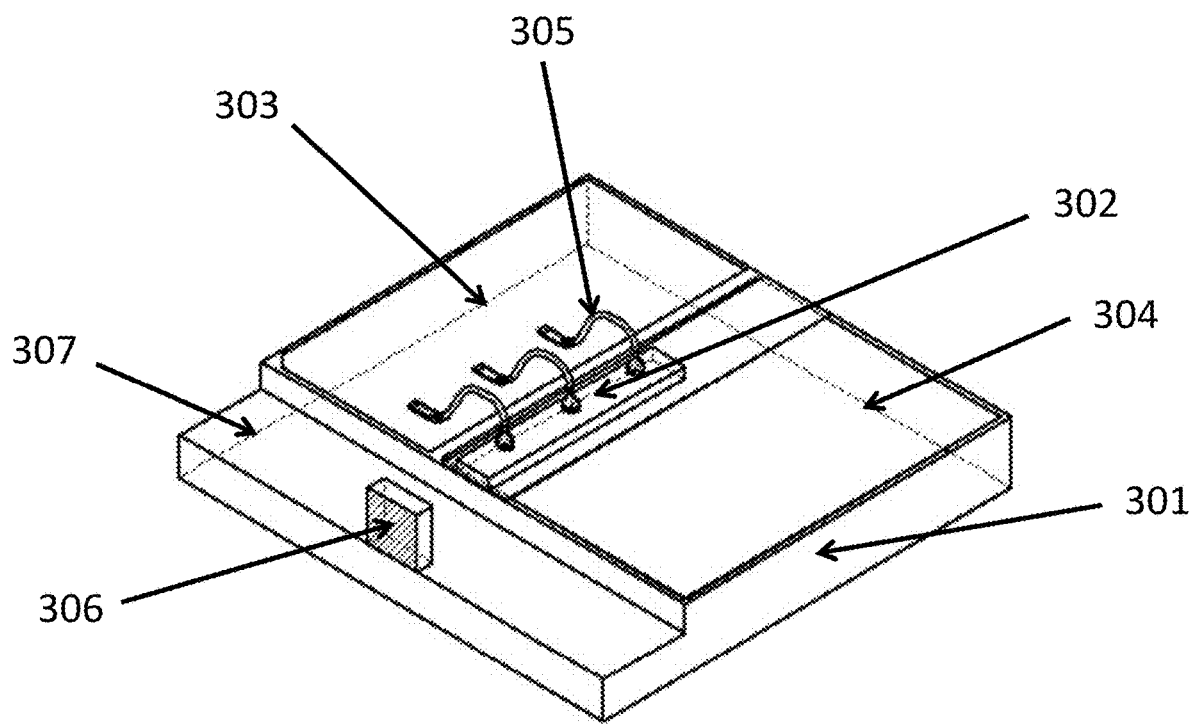
FIG. 15 is a simplified diagram illustrating a laser based light source with internal cavity wavelength conversion with a laser diode and phosphor member integrated onto a submount according to an embodiment of the present invention.

FIG. 15 presents a schematic diagram illustrating an embodiment of an internal cavity wavelength conversion eye-safe laser based light source based on a conventionally conformed waveguide gain element formed on gallium and nitrogen containing substrate technology according to this present invention. The laser based light source device is comprised of submount material 301 that serves as the common support member configured to act as an intermediate material between a waveguide gain element chip 302 and a final mounting surface and as an intermediate material between the phosphor material 306 and a final mounting surface. The submount is configured with electrodes 303 and 304 that may be formed with deposited metal layers such as Au. In one example, Ti/Pt/Au is used for the electrodes. Wirebonds 305 are configured to couple the electrical power from the electrodes 303 and 304 on the submount to the waveguide gain element chip to generate an output optical beam. The beam output is incident on a first surface of a one or more phosphor member 306 positioned in front of the waveguide gain element output facet wherein the light enters the one or more phosphor member to induce a wavelength conversion. For example, a blue excitation light from the waveguide may be converted to a yellow light to make a combination of blue and yellow light for a white light. In a second example, a blue excitation light from the waveguide may be converted to a red and green light in red and green phosphor members to make a combination of blue, red, and green light for white light. In a third example, a violet excitation light from the waveguide may be converted to a blue, red, and green light in blue, red, and green phosphor members to make a combination of blue, red, and green light for white light. The first surface is configured to provide efficient optical coupling of the excitation light to the one or more phosphor members and provide a reflection of the wavelength converted colors. The one or more phosphor member has a second surface 307 configured for providing a mirror of the laser cavity and provide the optical feedback into the laser cavity to induce lasing. The second surface can be treated for a modified reflectivity to both the waveguide gain element violet or blue excitation light and the wavelength converted light in the phosphor member. Typically the second surface can be treated for an increased reflectivity to the waveguide gain element violet or blue excitation light and a reduced reflectivity for the wavelength converted light in the one or more phosphor members. The phosphor plate is attached to the submount on a ledge 308 or recessed region. The electrodes 303 and 304 are configured for an electrical connection to an external power source such as a laser driver, a current source, or a voltage source. Wirebonds can be formed on the electrodes to couple the power to the waveguide gain element device. Of course this is merely an example of a configuration and there could be many variants on this embodiment including but not limited to different shape phosphors, different geometrical designs of the submount or common support member, different orientations of the output beam with respect to the phosphor, different electrode and electrical designs, and others.

Figure 16:
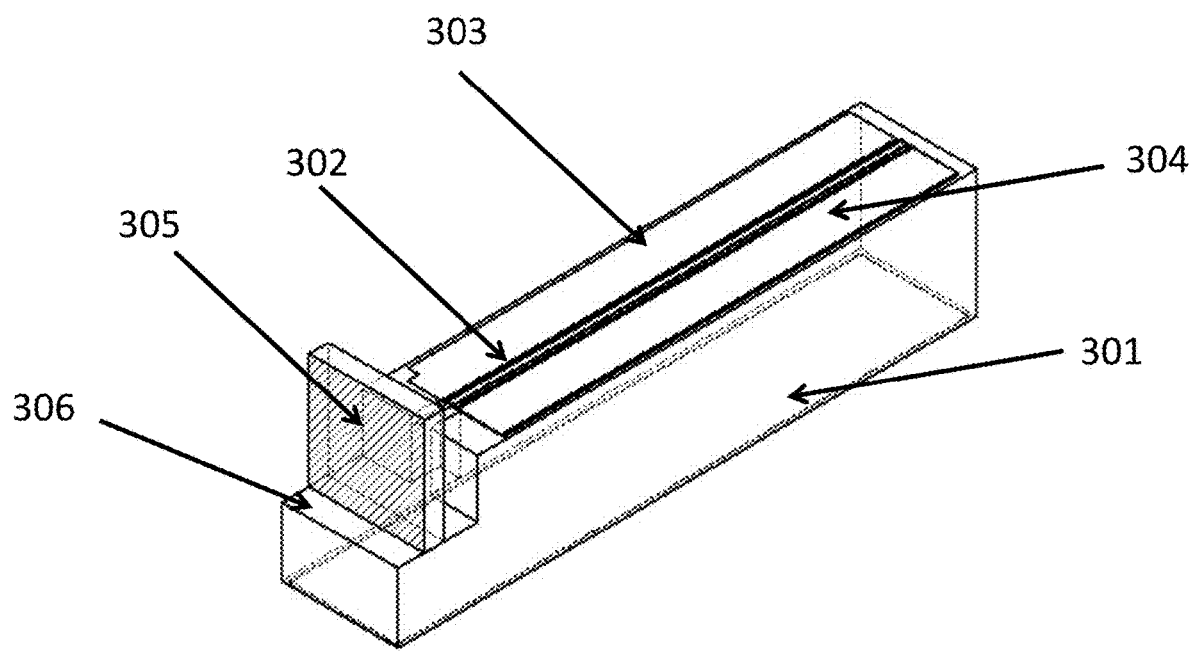
FIG. 16 is a simplified illustrating a laser based light source with internal cavity wavelength conversion with the waveguide gain element fabricated in gallium and nitrogen containing epitaxial layers transferred to a submount member and a phosphor member integrated onto the submount member according to an embodiment of the present invention.

FIG. 16 presents a schematic diagram illustrating an embodiment of an external cavity wavelength conversion eye-safe laser based light source based on a transferred gallium and nitrogen containing material technology. The waveguide gain element formed on gallium and nitrogen containing epitaxial layers transferred from the substrate to a carrier wafer according to this present invention. The laser based light source device is comprised of submount material 301 formed from the carrier wafer that serves as the common support member configured to act as an intermediate material between a waveguide gain element chip 302 formed in the transferred gallium and nitrogen containing material and a final mounting surface and as an intermediate material between the one or more phosphor members 305/306 and a final mounting surface. The submount is configured with electrodes 303 and 304 that may be formed with deposited metal layers such as Au. In one example, Ti/Pt/Au is used for the electrodes. The optical beam output from the waveguide gain element is incident on a first surface of a one or more phosphor member 305 positioned in front of the waveguide gain element output facet wherein the light enters the one or more phosphor member to induce a wavelength conversion. For example, a blue excitation light from the waveguide may be converted to a yellow light to make a combination of blue and yellow light for a white light. In a second example, a blue excitation light from the waveguide may be converted to a red and green light in red and green phosphor members to make a combination of blue, red, and green light for white light. In a third example, a violet excitation light from the waveguide may be converted to a blue, red, and green light in blue, red, and green phosphor members to make a combination of blue, red, and green light for white light. The first surface is configured to provide efficient optical coupling of the excitation light to the one or more phosphor members and provide a reflection of the wavelength converted colors. The one or more phosphor member has a second surface 306 configured for providing a mirror of the laser cavity and provide the optical feedback into the laser cavity to induce lasing. The second surface can be treated for a modified reflectivity to both the waveguide gain element violet or blue excitation light and the wavelength converted light in the phosphor member. Typically the second surface can be treated for an increased reflectivity to the waveguide gain element violet or blue excitation light and a reduced reflectivity for the wavelength converted light in the one or more phosphor members. The one or more phosphor member may be configured as a phosphor plate and is attached to the submount on a ledge 307 or recessed region. The electrodes 303 and 304 are configured for an electrical connection to an external power source such as a laser driver, a current source, or a voltage source. Wirebonds can be formed on the electrodes to couple the power to the waveguide gain element device. Of course this is merely an example of a configuration and there could be many variants on this embodiment including but not limited to different shape phosphors, different geometrical designs of the submount or common support member, different orientations of the output beam with respect to the phosphor, different electrode and electrical designs, and others.

Multiple reflector characteristics and/or members can be deployed to form a reflector system on the second surface of the wavelength conversion member such as a phosphor member. For example, the reflector system can be designed to reflect the violet or blue wavelength beam as described above and additionally provide a very low reflectivity or anti-reflection to the wavelength converted light [such as yellow light in a blue-excited blue plus yellow white source or red, green, and blue light in violet excited red plus green plus blue white source] to increase the extraction of the useful output light. This can be achieved through overlaying multiple reflectors or designing a single reflector to possess both of these elements. Different filter or reflector designs can be implemented such as bandpass filters, notch filters, low pass filters, and high pass filters. Deposition techniques such as electron beam, sputtering, evaporating, or epitaxial methods can be used.

In this configuration, careful considerations and measures must be paid to the first surface of the wavelength conversion member. This surface should be configured for a low reflectivity or anti-reflectivity of the blue or violet light to let it freely pass into and out of the wavelength converter material. Simultaneously, this surface should be reflective or highly reflective to the wavelength converted light such that the useful converted light is not lost through the first surface and the extraction through the second surface is maximized. Different filter or reflector designs can be implemented such as bandpass filters, notch filters, low pass filters, and high pass filters. Deposition techniques such as electron beam, sputtering, evaporating, or epitaxial methods can be used.

In one example of this preferred intra-cavity wavelength converted light source embodiment, the beam exiting the gain element has a blue wavelength to excite a phosphor conversion member to convert a fraction of the blue beam to a yellow light such that a resulting blue and yellow color combination exiting the second surface of the wavelength conversion materials provides a white light output. In a second example of this preferred embodiment, the beam exiting the gain element has a violet wavelength to excite a first wavelength conversion member to convert a fraction of the violet beam to a blue light and the remaining violet beam and/or a fraction of the blue converted light excites a second wavelength conversion member emitting yellow light such that a resulting blue and yellow wavelength converted light combination provides a white light output. In a third example of this preferred embodiment, the beam exiting the gain element has a violet wavelength to excite a first wavelength conversion member to convert a fraction of the violet beam to a blue light, a fraction of the remaining violet beam and/or a fraction of the blue converted light excites a second wavelength conversion member emitting green light, a fraction of the remaining violet beam and/or a fraction of the blue converted light and green converted light excites a third wavelength conversion member emitting red light such that a resulting blue, green, and red wavelength converted light combination provides a white light output.

In this preferred external cavity wavelength conversion embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member or phosphor member is positioned at a certain distance from the second end of the waveguide gain element. This distance or gap between the waveguide gain element and the phosphor can be comprised of free-space such that the violet or blue beam exiting the second end of the waveguide gain element travels through a free space before entering the phosphor member through the first surface. In another example the distance or gap between the second end of the waveguide gain element and the first surface of the phosphor wavelength conversion element is filled with another material. In yet another example the phosphor wavelength conversion member is fixed or attached to the second end of waveguide gain element. In this configuration intermediate layers or adhesive materials can be positioned between the waveguide gain element and the first surface of the phosphor member or wavelength conversion member.

In both the intra-cavity and external cavity embodiments of this first category of eye-safe laser light sources, the the wavelength converter material is preferably a phosphor material. The phosphor material can be operated in a transmissive mode, a reflective mode, or a combination of a transmissive mode and reflective mode, or other modes. For best performance, the phosphor material is preferably comprised of a single crystal YAG or a ceramic YAG based phosphor. The phosphor material is characterized by a conversion efficiency, a resistance to thermal damage, a resistance to optical damage, a thermal quenching characteristic, a porosity to scatter excitation light, and a thermal conductivity. In some embodiments the phosphor may have an intentionally roughened surface to increase the light extraction from the phosphor. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the gallium and nitrogen containing gain element or laser diode device to generate the beam and excite the phosphor material. The white light source configured to produce greater than 1 lumen, 10 lumens, 100 lumens, 1000 lumens, or greater of white light output. The support member is configured to transport thermal energy from the at least one gallium and nitrogen containing gain element or laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

The preferred second category of this novel eye safe laser light source invention is based on a modification of the electrical inputs to the gain element of the laser diode. Specifically, the design inherent safety feature configures the electrical input circuitry to drive the laser with the wavelength conversion material such that if the wavelength conversion material is damaged or compromised the electrical input to the gain element is reduced or terminated and laser operation is ceased. Like the first category of eye-safe laser light source designs, this safety feature is based on the so-called threshold condition of a laser system since by reducing the electrical input the gain will be reduced or eliminated. If this wavelength conversion material is damaged or compromised, the electrical input to the gain region would drastically reduce and the losses would exceed the gain and hence the laser would cease to maintain lasing operation falling below the threshold condition and/or completely shut off.

In a preferred embodiment of this second category of the present invention, the eye safe laser light source is configured with a gallium and nitrogen containing laser diode configured with facets on the two ends of the laser diode cavity, a wavelength conversion member such as a phosphor, and a carefully designed electrical circuits or electrodes. The output of the eye safe laser light source is a white light output for example wherein the white light is comprised of a yellow emission from a wavelength conversion member such as a phosphor member excited by a blue laser diode and a scattered blue light from the laser diode or is comprised of multiple colors emitted from wavelength conversion members such as a blue and yellow phosphor member excited with a violet laser diode or a red, green, and a blue phosphor member excited from a violet laser diode.

In a preferred embodiment in the second category of this invention an external cavity wavelength conversion configuration is formed with an electrical safety feature. In this embodiment a gallium and nitrogen containing laser diode is configured to emit a violet or blue wavelength. The laser diode comprises a cavity member configured with a waveguide gain element for providing optical gain. An electrical input conductor configured to provide electrical current to the waveguide gain element from an input power source. The laser diode further comprises a first end and a second end wherein the first and second ends are configured as mirrors to provide optical feedback to the waveguide gain element forming the cavity. This first and second end mirrors can be formed with a facet formation and can optionally be coated with a layer or layer stack that further increases or decreases the reflectivity. For example, to improve the light output from the second end the reflectivity of first end can be increased to greater than 85% or greater than 95%. Further, the second end can be configured for a reduced reflectivity to allow more useful light to escape the cavity. The reduced reflectivity can be achieved with optical coatings configured to reduce the reflectivity to less than 15%, 10%, 5%, or 3%. The violet or blue wavelength output beam from this laser diode is incident on a first surface of the wavelength conversion material where it passes into and excites the wavelength conversion material to generate at least a second wavelength. Since the wavelength conversion member is positioned just outside the cavity this preferred embodiment is an external cavity wavelength conversion configuration.

The inherent safety design feature of this embodiment is based in the electrical circuit or electrodes that route the input electrical current to the gain medium of the laser diode. In a preferred embodiment the electrical conducting element is physically coupled to the wavelength conversion or phosphor member in a configuration such that if the wavelength conversion member or phosphor is damaged, compromised, or removed, the electrical input to the gain medium will be terminated and the laser diode will turn-off. In one preferred example the electrical conducting element comprises metallic layers such as gold layers deposited on surfaces of one or more of the laser diode, wavelength conversion element, and common support member. In another example, the electrical conducting elements comprise wires such as wires formed with a wirebond tool.

In a first configuration of this second category of an eye safe laser based light source the phosphor member is comprise an electrical conductor along at least a portion of the edge surfaces on the perimeter of the phosphor. The electrical conductor functions to transmit the input electrical input from the power source to the gain element of the laser diode. If the phosphor member is removed, partially removed, breaks, partially breaks, or is damaged the electrical conductor on the phosphor is compromised reducing or terminating the electrical input to the laser diode gain element and thereby dropping the laser diode below the threshold condition and ceasing laser operation.

In a first configuration of this second category of an eye safe laser based light source the phosphor member comprises an electrical conductor along the edge surfaces on the perimeter of the phosphor with the exception of the bottom edge of the phosphor region wherein there is a gap in the conductor material. The electrical traces on the submount are configured to transmit the electrical current from the power source to the gain element of the laser diode. The electrical trace pattern is configured with an "open" or gap on the submount such that there is a break in the electrical conduction path to the laser diode gain element. The bottom edge surface on the perimeter of the phosphor with the gap in the conductor is bonded to the traces on the submount forming an electrical path along the outside edge of the phosphor to close the gap or open in the electrical traces, closing the circuit and completing the circuit allowing current to conduct from the input power source to the gain element of the laser diode. The electrical conductor functions to transmit the input electrical current from the power source to the gain element of the laser diode. If the phosphor member is removed, partially removed, breaks, partially breaks, or is damaged the electrical conductor on the phosphor is compromised reducing or terminating the electrical input to the laser diode gain element and thereby dropping the laser diode below the threshold condition and ceasing laser operation.

Figure 17:
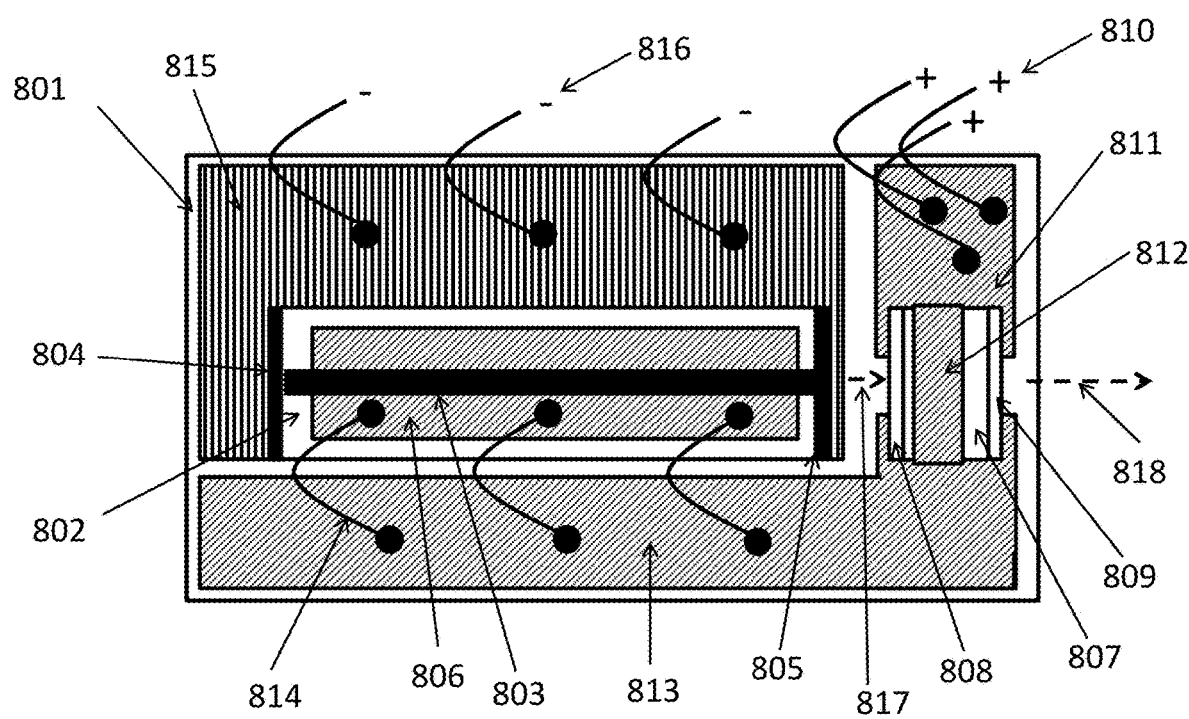
FIG. 17 is a schematic illustrating a laser based light source with an integrated safety feature based on the electrical circuit according to an embodiment of the present invention.

FIG. 17 presents a simplified top-view schematic diagram illustrating a laser based light source according to this second category of laser based light sources with inherent safety. The laser based light source device is comprised of submount or common support member 801 that serves as the support member configured for the gallium and nitrogen containing waveguide gain element chip or laser diode 802. The waveguide gain element such as a SLED or laser diode device has a waveguide region 803 that could be an etched ridge waveguide, a first end of the waveguide 804 which can be configured as a first mirror, and a second end of a waveguide 805 which can be configured as a second mirror to form a cavity. On the top of the SLED or laser diode device is an electrode 806 configured to inject current to the active region and generate emission such as blue or violet emission and generate a lasing action. In this example, the electrode is attached to the p-side of the diode and configured to inject hole carriers, but in other configurations it could be the n-side electrode configured on the top of the device such as in a p-down mounted device or a device formed with the gallium and nitrogen containing material transfer technology. A phosphor wavelength converter element 807 is attached to the common support member 801, wherein the phosphor member functions to convert at least a fraction of the violet or blue output emission from the laser diode or SLED and convert it to other colors such as yellow, or blue and yellow, or red, green, and blue. The phosphor member has a first surface 808 and a second surface 809.

According to the embodiment in FIG. 17, an input current 810 is applied to the laser based light source typically through wirebonds from an external power source. The input current is conducted through a first region of metal trace 811 or other conductor element overlying the support or submount member. The phosphor member 807 is configured with a metal trace 812 that wraps around its perimeter edge regions, but configured with a gap region in the conductor in the bottom surface attached to the metal trace region 811 such that a first portion of the bottom surface with the conductor 812 forms an electrical contact to the trace 811. This configuration forces the input current to flow around the perimeter region of the phosphor through the conducting element 812. A second region of metal trace 813 overlies the submount or common support member and is configured to form an electrical connection to a second portion of the conducting member 812 on the bottom surface where in the first portion and the second portion of conducting element are configured with a gap on the bottom surface preventing current flow. After traveling around the edge of the phosphor member, the input current is injected to the p-electrode of the laser diode or SLED member, typically through wirebonds as shown with 814. The input current forms electrons and holes in the active region configured in the waveguide and generates an excitation emission. Electrons exit the bottom-side of the laser diode or SLED member and into a third trace region on the submount 815. The electrons travel to the ground or negative lead 816 of the input power source. A blue or violet excitation beam 817 from the laser diode or SLED is output from the second mirror 805 and incident on the first surface of the phosphor member 808 where it enters the phosphor member and generates a second or more wavelength with wavelength conversion. The wavelength converted light and in some embodiments a fraction of the excitation light 818 exits the second surface of the wavelength conversion element 809 where it provides the useful light output of the laser based light source. The inherent safety feature of this embodiment is configured such that if the phosphor is broken, removed, chipped, damaged, or compromised anywhere around it's perimeter region the electrical input current will be interrupted and the laser will be de-activated. Of course this is merely an example of a configuration and there could be many variants on this embodiment including but not limited to different shape phosphors, different geometrical designs of the submount or common support member, different orientations of the output beam with respect to the phosphor such as reflection mode phosphor, different electrode and electrical designs, and others.

In a second configuration of this second category of an eye safe laser based light source the phosphor member comprises an electrical conductor along at least a portion of a first edge surface on the perimeter of the phosphor. The first edge surface on the perimeter of the phosphor with the electrical conductor is the then bonded to a submount with electrical traces. The electrical traces on the submount are configured to transmit the electrical current from the power source to the gain element of the laser diode. The electrical trace pattern is configured with an "open" or gap on the submount such that there is a break in the electrical conduction path to the laser diode gain element. The first edge surface on the perimeter of the phosphor with the conductor is bonded the traces on the submount to close the gap or open in the electrical traces, closing the circuit and completing the circuit allowing current to conduct from the input power source to the gain element of the laser diode. If the phosphor member is removed or broken off the submount the conduction path from the electrical input source to the laser diode gain element is opened cutting off current conduction to the laser diode and thereby dropping the laser diode below the threshold condition and ceasing laser operation.

Figure 18:
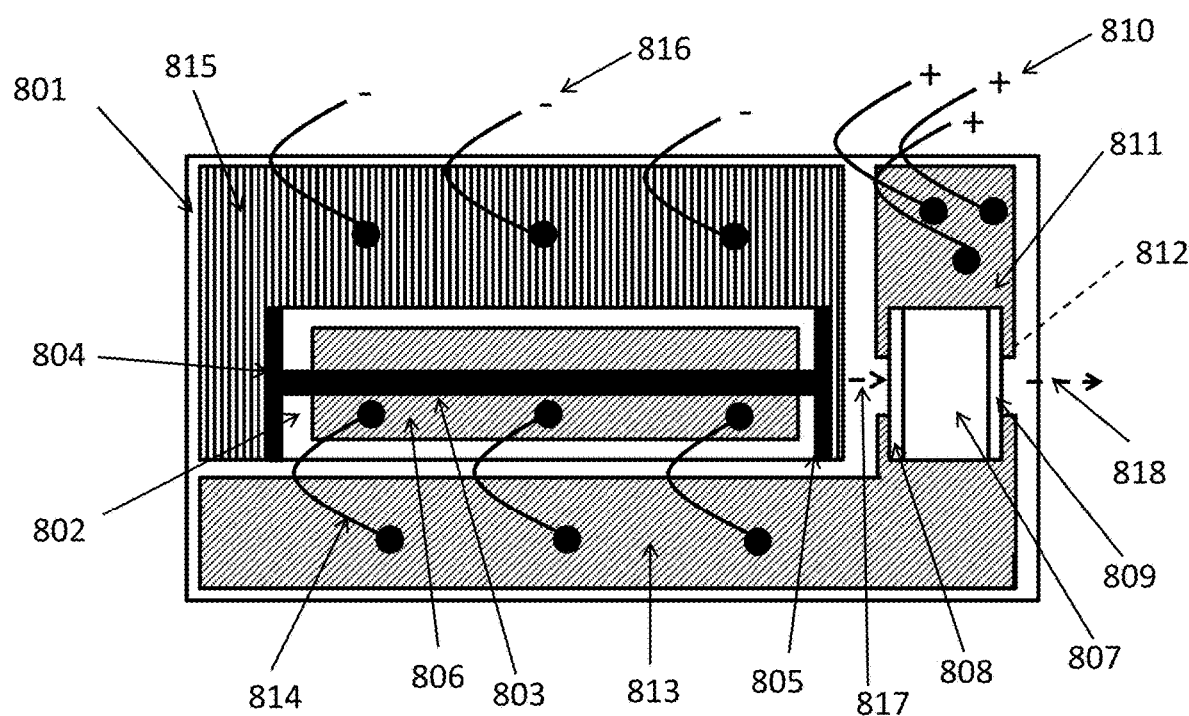
FIG. 18 is a schematic illustrating a laser based light source with an integrated safety feature based on the electrical circuit according to an embodiment of the present invention.

FIG. 18 presents a simplified top-view schematic diagram illustrating a laser based light source according to this second category of laser based light sources with inherent safety. The laser based light source device is comprised of submount or common support member 801 that serves as the support member configured for the gallium and nitrogen containing waveguide gain element chip or laser diode 802.

The waveguide gain element such as a SLED or laser diode device has a waveguide region 803 that could be an etched ridge waveguide, a first end of the waveguide 804 which can be configured as a first mirror, and a second end of a waveguide 805 which can be configured as a second mirror to form a cavity. On the top of the SLED or laser diode device is an electrode 806 configured to inject current to the active region and generate emission such as blue or violet emission and generate a lasing action. In this example, the electrode is attached to the p-side of the diode and configured to inject hole carriers, but in other configurations it could be the n-side electrode configured on the top of the device such as in a p-down mounted device or a device formed with the gallium and nitrogen containing material transfer technology. A phosphor wavelength converter element 807 is attached to the common support member 801, wherein the phosphor member functions to convert at least a fraction of the violet or blue output emission from the laser diode or SLED and convert it to other colors such as yellow, or blue and yellow, or red, green, and blue. The phosphor member has a first surface 808 and a second surface 809.

According to the embodiment in FIG. 18, an input current 810 is applied to the laser based light source typically through wirebonds from an external power source. The input current is conducted through a first region of metal trace 811 or other conductor element overlying the support or submount member. The phosphor member 807 is configured with a conductor element such as a metal trace 812 on at least the bottom surface of the phosphor. A second region of metal trace 813 overlies the submount or common support member. The first region of the metal trace or conductor and the second region of the metal trace or conductor on the submount are configured with a gap such that there is no electrical connection or continuity between them. The bottom surface of the phosphor member with the conductor element such as a metal trace is bonded down to contact both the first portion and the second portion of the metal traces on the submount member creating an electrical continuity or pathway from the first portion to the second portion. This configuration forces the input current to flow along the bottom edge of the phosphor through the conducting element 812. After traveling along the bottom surface of the phosphor member and through the second portion of metal trace on the submount 813, the input current is injected to the p-electrode of the laser diode or SLED member, typically through wirebonds as shown with 814. The input current forms electrons and holes in the active region configured in the waveguide and generates an excitation emission. Electrons exit the bottomside of the laser diode or SLED member and into a third trace region on the submount 815. The electrons travel to the ground or negative lead 816 of the input power source. A blue or violet excitation beam 817 from the laser diode or SLED is output from the second mirror 805 and incident on the first surface of the phosphor member 808 where it enters the phosphor member and generates a second or more wavelength with wavelength conversion. The wavelength converted light and in some embodiments a fraction of the excitation light 818 exits the second surface of the wavelength conversion element 809 where it provides the useful light output of the laser based light source. The inherent safety feature of this embodiment is configured such that if the phosphor is broken, removed, or substantially compromised along the bottom edge surface the electrical input current will be interrupted and the laser will be de-activated. Of course this is merely an example of a configuration and there could be many variants on this embodiment including but not limited to different shape phosphors, different geometrical designs of the submount or common support member, different orientations of the output beam with respect to the phosphor such as reflection mode phosphor, different electrode and electrical designs, and others.

In a third configuration of this second category of an eye safe laser based light source the phosphor member comprises an electrical conductor along at least a portion of a first edge surface on the perimeter of the phosphor. The first edge surface on the perimeter of the phosphor with the electrical conductor is preferably at top edge of the phosphor. The phosphor member is mounted to a submount member or a common support with the laser diode. Electrical traces on the submount are configured to support transmission of the electrical input current from the power source to the gain element of the laser diode. The electrical trace pattern is configured with an "open" or gap on the submount such that there is a break in the electrical conduction path to the laser diode gain element. One or more first wirebonds are formed from a first location on the electrical trace to the electrical conductor on the first edge of the phosphor member. One or more second wirebonds are additionally configured from the electrical conductor on the first edge of the phosphor member to a second location on the metal trace or directly to the laser diode chip. The first and second wirebonds are configured to close the gap and hence close the circuit to complete the circuit allowing current to conduct from the input power source to the gain element of the laser diode. If the phosphor member is removed or broken off the submount the wirebonds will break and the conduction path from the electrical input source to the laser diode gain element is will be opened, cutting off current conduction to the laser diode and thereby dropping the laser diode below the threshold condition and ceasing laser operation.

Figure 19A:
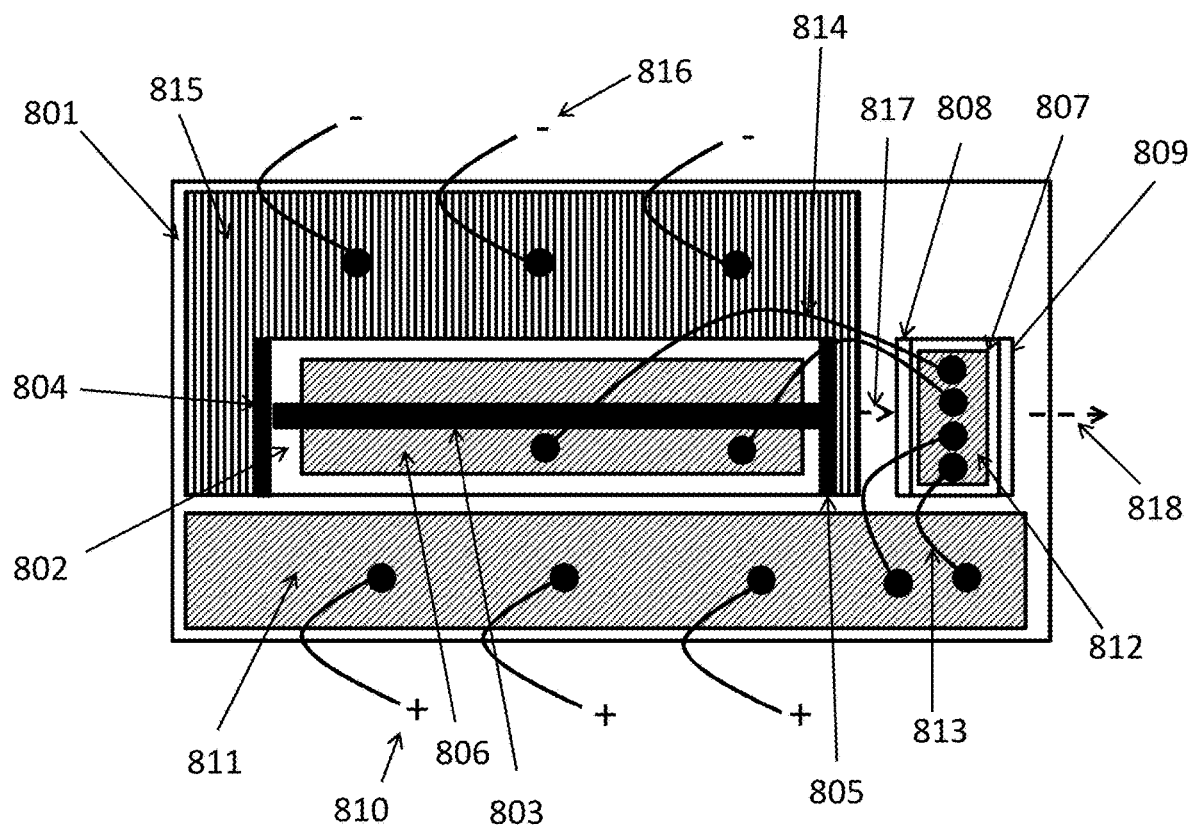
FIGS. 19a-19b are schematic illustrations of laser based light sources with integrated safety features according to embodiments of the present invention.

FIG. 19a presents a simplified top-view schematic diagram illustrating a laser based light source according to this second category of laser based light sources with inherent safety. The laser based light source device is comprised of submount or common support member 801 that serves as the support member configured for the gallium and nitrogen containing waveguide gain element chip or laser diode 802. The waveguide gain element such as a SLED or laser diode device has a waveguide region 803 that could be an etched ridge waveguide, a first end of the waveguide 804 which can be configured as a first mirror, and a second end of a waveguide 805 which can be configured as a second mirror to form a cavity. On the top of the SLED or laser diode device is an electrode 806 configured to inject current to the active region and generate emission such as blue or violet emission and generate a lasing action. In this example, the electrode is attached to the p-side of the diode and configured to inject hole carriers, but in other configurations it could be the n-side electrode configured on the top of the device such as in a p-down mounted device or a device formed with the gallium and nitrogen containing material transfer technology. A phosphor wavelength converter element 807 is attached to the common support member 801, wherein the phosphor member functions to convert at least a fraction of the violet or blue output emission from the laser diode or SLED and convert it to other colors such as yellow, or blue and yellow, or red, green, and blue. The phosphor member has a first surface 808 and a second surface 809.

According to the embodiment in FIG. 19a, an input current 810 is applied to the laser based light source typically through wirebonds from an external power source. The input current is conducted through a first region of metal trace 811 or other conductor element overlying the support or submount member. The phosphor member 807 is configured with a conductor element such as a metal trace 812 on at least one surface such as a top surface of the phosphor. A conducting element such as a one or more wirebond 813 is configured to electrically connect the metal trace 811 and the conductor element metal trace on the phosphor member 812 to allow current flow to the conducting surface on the phosphor member. An additional conductor element such as a second one or more wirebond members 814 are then configured to conduct the input current from the metal trace on the phosphor member 812 to the electrode on the laser diode or SLED 806. This configuration forces the input current to flow through conductor elements that are physically attached to the phosphor member and preferably to the top edge that is likely to be the most vulnerable to damage. The input current is injected to the p-electrode of the laser diode or SLED member. The input current forms electrons and holes in the active region configured in the waveguide and generates an excitation emission. Electrons exit the bottom side of the laser diode or SLED member and into a third trace region on the submount 815. The electrons travel to the ground or negative lead 816 of the input power source. A blue or violet excitation beam 817 from the laser diode or SLED is output from the second mirror 805 and incident on the first surface of the phosphor member 808 where it enters the phosphor member and generates a second or more wavelength with wavelength conversion. The wavelength converted light and in some embodiments a fraction of the excitation light 818 exits the second surface of the wavelength conversion element 809 where it provides the useful light output of the laser based light source. The inherent safety feature of this embodiment is configured such that if the phosphor is broken, removed, or substantially compromised along the top surface the electrical input current will be interrupted and the laser will be de-activated. Of course this is merely an example of a configuration and there could be many variants on this embodiment including but not limited to different shape phosphors, different geometrical designs of the submount or common support member, different orientations of the output beam with respect to the phosphor such as reflection mode phosphor, different electrode and electrical designs, and others.

Figure 19B:
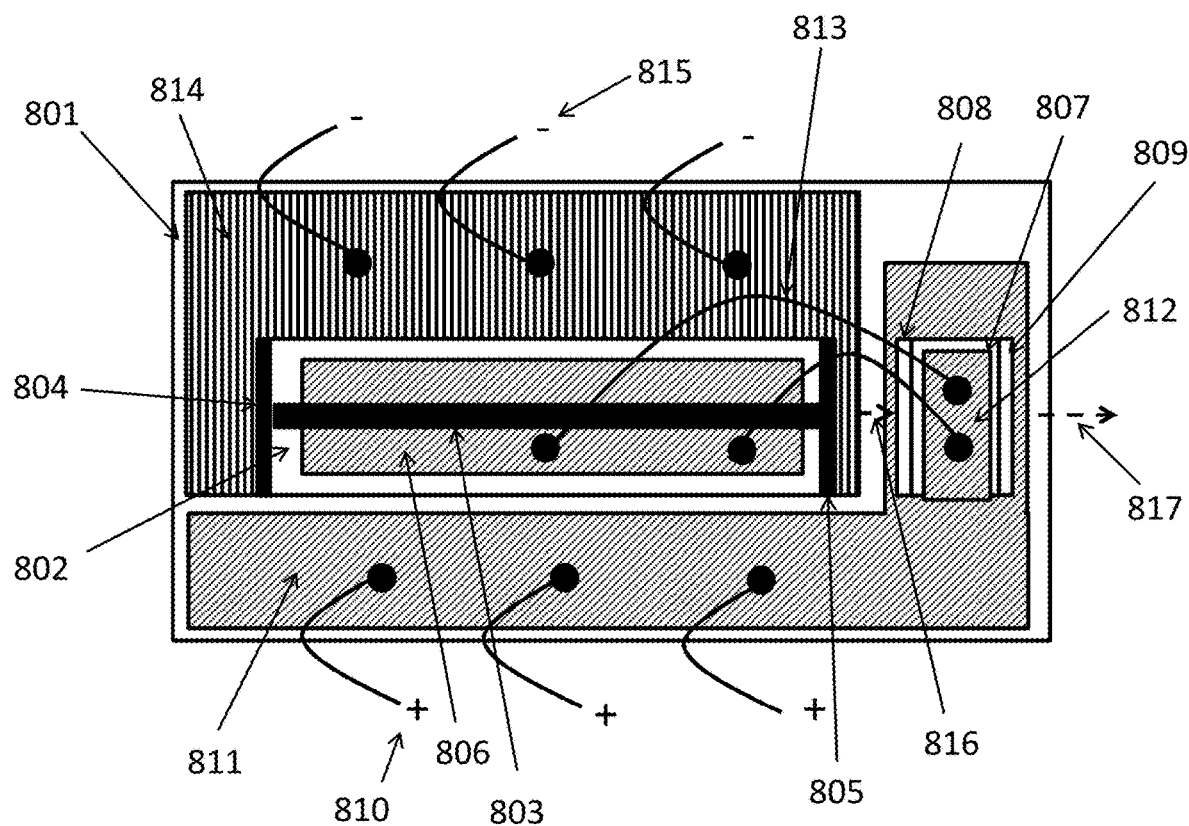

FIG. 19b presents a simplified top-view schematic diagram illustrating a laser based light source according to this second category of laser based light sources with inherent safety. The laser based light source device is comprised of submount or common support member 801 that serves as the support member configured for the gallium and nitrogen containing waveguide gain element chip or laser diode 802. The waveguide gain element such as a SLED or laser diode device has a waveguide region 803 that could be an etched ridge waveguide, a first end of the waveguide 804 which can be configured as a first mirror, and a second end of a waveguide 805 which can be configured as a second mirror to form a cavity. On the top of the SLED or laser diode device is an electrode 806 configured to inject current to the active region and generate emission such as blue or violet emission and generate a lasing action. In this example, the electrode is attached to the p-side of the diode and configured to inject hole carriers, but in other configurations it could be the n-side electrode configured on the top of the device such as in a p-down mounted device or a device formed with the gallium and nitrogen containing material transfer technology. A phosphor wavelength converter element 807 is attached to the common support member 801, wherein the phosphor member functions to convert at least a fraction of the violet or blue output emission from the laser diode or SLED and convert it to other colors such as yellow, or blue and yellow, or red, green, and blue. The phosphor member has a first surface 808 and a second surface 809.

According to the embodiment in FIG. 19b, an input current 810 is applied to the laser based light source typically through wirebonds from an external power source. The input current is conducted through a first region of metal trace 811 or other conductor element overlying the support or submount member. The phosphor member 807 is configured with a conductor element such as a metal trace 812 along at least a portion of the perimeter surface region such as a top surface region, a side surface region, and a bottom surface region of the phosphor. The bottom surface of the phosphor with the conductor element such as a metal trace mounted down to the first region of metal trace on the submount 811 to form an electrical contact and current pathway. A conductor element such as a second one or more wirebond members 813 are then configured to form an electrical pathway from a surface of such as the top surface of the phosphor member with the conductor to the electrode on the laser diode or SLED 806. This configuration forces the input current to flow around a portion of the phosphor member and then through conductor elements that are physically attached to the phosphor member to provide current to the laser diode. It is preferable to increase the length of the conduction path on the perimeter of the phosphor to provide more coverage in the safety feature. The input current is injected to the p-electrode of the laser diode or SLED member. The input current forms electrons and holes in the active region configured in the waveguide and generates an excitation emission. Electrons exit the bottom side of the laser diode or SLED member and into a third trace region on the submount 814. The electrons travel to the ground or negative lead 815 of the input power source. A blue or violet excitation beam 816 from the laser diode or SLED is output from the second mirror 805 and incident on the first surface of the phosphor member 808 where it enters the phosphor member and generates a second or more wavelength with wavelength conversion. The wavelength converted light and in some embodiments a fraction of the excitation light 817 exits the second surface of the wavelength conversion element 809 where it provides the useful light output of the laser based light source. The inherent safety feature of this embodiment is configured such that if the phosphor is broken, removed, or substantially compromised along a substantial portion of the perimeter region the electrical input current will be interrupted and the laser will be de-activated. Of course this is merely an example of a configuration and there could be many variants on this embodiment including but not limited to different shape phosphors, different geometrical designs of the submount or common support member, different orientations of the output beam with respect to the phosphor such as reflection mode phosphor, different electrode and electrical designs, and others.

In a fourth configuration of this second category of an eye safe laser based light source an electrical element such as a thermal fuse is integrated into the package with the phosphor member. Thermal fuses are simple devices configured to conduct electricity under normal operation and typically consist of a low melting point alloy. In one example, the thermal fuse is comprised of metal material with a low melting point and configured to rapidly heat when irradiated directly or indirectly with the violet or blue laser beam light. The rapid heat rise in the thermal fuse material causes the material to melt, creating a discontinuity in the fuse metal which opens the electrical conduction pathway and prevents current flow through the fuse. Examples of alloys deployed for thermal fuses are given in Table 1.

In this embodiment of the present invention, one or more thermal fuses are contained within the electrical pathway providing the current input from an external power source to the gain element of the laser diode. The one or more thermal fuses are physically positioned in locations where the output of the violet or blue laser beam would be incident on it in the case that the phosphor member is comprised, broken, or removed. That is, the thermal fuse is placed in the package where the beam is not expected to be unless an upstream failure in the beam line has occurred. In the case of such an event, the violet or blue laser light would irradiate the fuse material inducing a temperature rise at or above the melting point and hence causing a melting of one or more thermal fuse elements. This melting would then open the electrical pathway and break the electrical circuit from the external power supply to the laser diode gain element and thereby shutting the laser device off. In this preferred example, the thermal fuse could cutoff power to the laser without requiring external control mechanisms.

Figure 20:
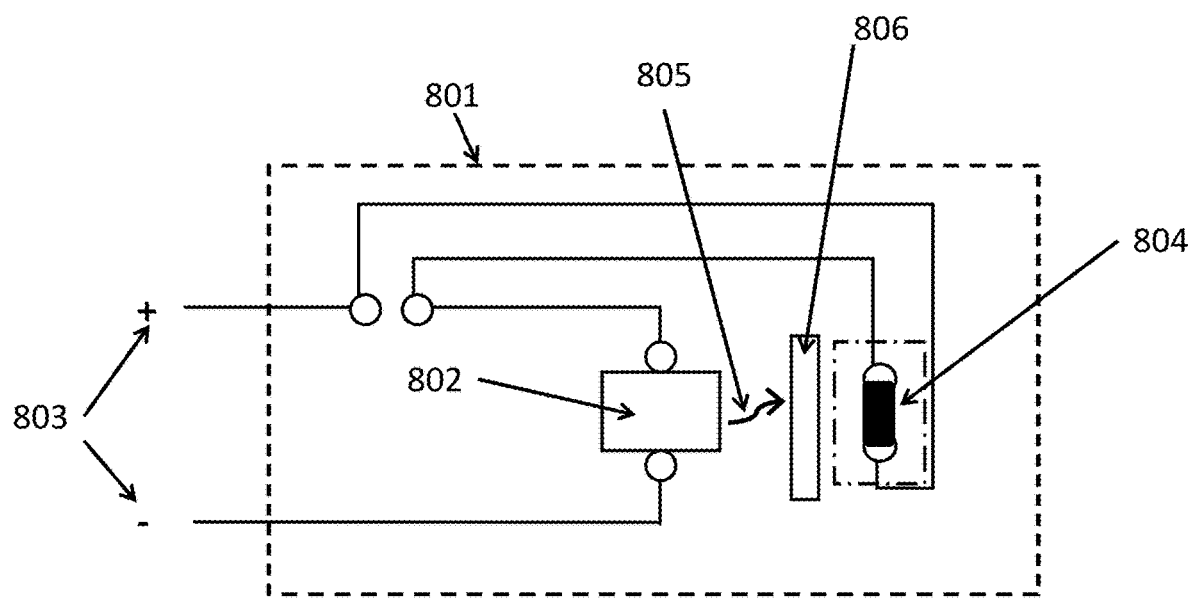
FIG. 20 is a schematic illustrating a laser based light source with an integrated safety feature including a thermal fuse according to an embodiment of the present invention.

FIG. 20 presents a simplified top-view schematic diagram illustrating a laser based light source according to this second category of laser based light sources with inherent safety. The laser based light source device is comprised of submount or common support member 801 that serves as the support member configured for the gallium and nitrogen containing waveguide gain element chip or laser diode 802. The waveguide gain element such as a SLED or laser diode device is configured to receive an electrical input current 803 that contains a thermal fuse element 804 in electrical series. The thermal fuse is preferably configured from a fusable alloy such as one selected from Table I. Upon receiving sufficient electrical input current the laser emits a violet or blue electromagnetic radiation 805 that excites a phosphor member 806. The phosphor wavelength converter element is attached to the common support member 801, wherein the phosphor member functions to convert at least a fraction of the violet or blue output emission from the laser diode or SLED and convert it to other colors such as yellow, or blue and yellow, or red, green, and blue. The thermal fuse member 804 is positioned in the package or on the support member in a location or geometry such that if the phosphor is to become damage or removed causing an unsafe condition laser strikes the fusible alloy material of the thermal fuse and causes it to instantly melt, opening the circuit, and shutting off the laser light source. Of course this is merely an example of a configuration and there could be many variants on this embodiment including but not limited to different shape phosphors, different geometrical designs of the submount or common support member, different orientations of the output beam with respect to the phosphor such as reflection mode phosphor, different electrode and electrical designs, and others.

There are a number of variations on the fusible alloy thermal fuse structure according to the present invention. In another example, one could utilize a tensioned spring which is soldered in place inside a ball of fusible allow. The spring and alloy provide the electrical circuit. When the alloy becomes soft enough, the spring pulls free, thereby breaking the circuit connection. In some embodiments the melting point could be suitably chosen to only break connection in the operating device when a sufficient temperature had been met or exceeded.

The above configurations of the present invention are merely examples of design inherent safety features based on modification of the electrical input to the laser diode or gain element. There are many other possible configurations that could modify the electrical input to the laser diode in the event the phosphor is compromised.

In this embodiment the wavelength conversion member or phosphor member and the gallium and nitrogen containing waveguide gain element can be configured on a common support member. The common support member can serve to transfer the heat generated in waveguide gain element and phosphor member to a heat sink. The common support member can be formed with one or materials including but not limited to copper, copper tungsten, aluminum, aluminum nitride, silicon carbide, beryllium oxide, diamond, or other materials. The attachment of the phosphor member and waveguide gain element member to the common support member can be configured with a glue, epoxy, solder such as AuSn solder, SAC solder, indium, or other. In one example, the first surface of the wavelength conversion member or phosphor member is positioned at a certain distance from the second end of the waveguide gain element. This distance or gap between the waveguide gain element and the phosphor can be comprised of free-space such that the violet or blue beam exiting the second end of the waveguide gain element travels through a free space before entering the phosphor member through the first surface. In another example the distance or gap between the second end of the waveguide gain element and the first surface of the phosphor wavelength conversion element is filled with another material. In yet another example the phosphor wavelength conversion member is fixed or attached to the second end of waveguide gain element. In this configuration intermediate layers or adhesive materials can be positioned between the waveguide gain element and the first surface of the phosphor member or wavelength conversion member.

In this preferred embodiment the wavelength conversion member or phosphor member has two primary surfaces. The first surface is preferably configured with an anti-reflection element such as a coating to reduce the reflection of the excitation blue or violet wavelength from the surface and enable most efficient optical coupling of the excitation source to the wavelength conversion material. Similarly, the first surface can be treated with coatings or members to increase the reflectivity of the converted light to reduce the amount of potentially useful light escaping the backside of the phosphor where it will be useful, hence increasing the extraction efficiency and the overall efficiency of the light source.

In preferred embodiments, the second surface of the phosphor member is preferably configured with an anti-reflection element such as a coating or roughening to reduce the reflection of the desired output wavelengths such as the wavelengths emitted from the wavelength conversion material and the laser diode excitation wavelength in the configuration where the excitation laser light comprises a portion of the desired output light such as blue laser light. By application of this anti-reflection coating the amount of useful light output or extraction of light from the wavelength conversion element will be increased and the overall efficiency will be increased. In a case where the laser excitation light is not part of the useful light output spectrum, an element to increase the reflectivity of the excitation source wavelength on this second surface can be implemented. This increased reflectivity will improve efficiency by reducing the amount of excitation light escaping the wavelength conversion material without creating a wavelength conversion event. The anti-reflector and reflector members can be an optical coating deposited directly on a phosphor wherein the coating is designed to provide a specified reflectivity for the excitation light or the useful output of the light source. The coating can be formed from a DBR configured with an alternating layer stack of two different materials with different indices of refraction for a reflectivity characteristic based on the choice of coating materials, thickness of the alternating layers, and total number of layer periods. Different filter or reflector designs can be implemented such as bandpass filters, notch filters, low pass filters, and high pass filters. Deposition techniques such as electron beam, sputtering, evaporating, or epitaxial methods can be used. Alternatively, dichroic mirrors can be used or other optical elements. In some configurations the reflector member is attached to the wavelength conversion member using a method such as gluing, brazing, soldering, bonding such as thermo-compression bonding, etc, but can be others.

In one example of this preferred embodiment, the laser diode has a blue wavelength to excite a phosphor conversion member to convert a fraction of the blue beam to a yellow light such that a resulting blue and yellow color combination provides a white light output. In a second example of this preferred embodiment, the beam exiting the laser diode has a violet wavelength to excite phosphor conversion members to convert a fraction of the violet beam to a yellow light and a blue light such that a resulting blue and yellow color combination provides a white light output. In a third example of this preferred embodiment configured for an improved white light quality, the beam exiting the laser diode has a violet wavelength to excite phosphor conversion members to convert a fraction of the violet beam to a red light, green light, and blue light such that a resulting red, green, and blue color combination provides a white light output. The above configurations are just merely examples. Of course there can be other configurations and phosphor colors.

The preferred third category of this novel eye safe laser light source invention is based on active feedback sensors. Specifically, the design inherent safety feature is configured with active sensors monitoring the operation of the light source and ensuring that it is functioning as designed in a safe mode. Specifically, the feedback sensors are configured to ensure that the wavelength conversion material is actively converting the potentially dangerous laser output beam from the laser diode to an incoherent eye-safe output light. If a sensor indicates a deviation from this designed operation the electrical or optical input to the laser will be modified or reduced and subsequently drop the laser to below the threshold condition and cease laser operation. An important novelty of this inherent safety design features based on active feedback sensors is that it is a self-contained feedback loop such that there are no external computer interfaces or electronics communications with the laser source required to cease the operation.

In a preferred embodiment in the third category of an eye safe laser light source with active feedback sensor devices the laser light sources is an external cavity wavelength conversion configuration. In this embodiment a gallium and nitrogen containing laser diode is configured to emit a violet or blue wavelength. The laser diode comprises a cavity member configured with a waveguide gain element for providing optical gain. An electrical input conductor configured to provide electrical current to the waveguide gain element from an input power source. The laser diode further comprises a first end and a second end wherein the first and second ends are configured as mirrors to provide optical feedback to the waveguide gain element forming the cavity. This first and second end mirrors can be formed with a facet formation process such as cleaving or etching and can optionally be coated with a layer or layer stack that further increases or decreases the reflectivity. For example, to improve the light output from the second end the reflectivity of first end can be increased to greater than 85% or greater than 95%. Further, the second end can be configured for a reduced reflectivity to allow more useful light to escape the cavity. The reduced reflectivity can be achieved with optical coatings configured to reduce the reflectivity to less than 15%, 10%, 5%, or 3%.

In this preferred embodiment the violet or blue wavelength output beam from this laser diode is incident on a first surface of the wavelength conversion material where it passes into and excites the wavelength conversion material to generate at least a second wavelength. Since the wavelength conversion member is positioned outside the cavity this preferred embodiment is an external cavity wavelength conversion configuration.

The inherent safety design feature of this embodiment is based on integrated sensors and feedback loops to cease operation of the laser light source if an un-safe operations state is indicated or detected. The integrated feedback loops including sensors are configured in a self-contained design such that the safety features do not rely on external signal processing or computing to interface with the sensor system. For example, in many laser light source systems today, photodetectors are integrated as a means to detect signal from the laser source emission and/or from the phosphor conversion emission. In these systems computers or signal processing devices are used to monitor the signal from the detectors and react when signals are detected that could indicate an unsafe state of the light source. That is, the reaction is initiated by an external system or electronic system. A common example of a reaction would be to halt power supply to the laser device and thereby ceasing laser operation. In this invention, the "reaction" to the unsafe state is triggered by a component within the self-contained laser safety system.

In a preferred embodiment the electrical input power to the laser diode is coupled via an electro-optic circuit to the optical output of the wavelength conversion or phosphor member with a photo-detector. Specifically, the circuit is configured with a photodetector designed to detect the wavelength converted color such as yellow in a blue+yellow white light source. When the photodector is sensing a sufficient or threshold level of wavelength converted light the circuit is in maintained in an on-state such that the electrical power from the outside source reaches the laser inducing operation of the laser light source. If in the event that the phosphor is damaged, removed, or compromised the amount of wavelength converted light would drop below this threshold level and the circuit would open, halting any power supply to the laser and ceasing laser light source operation. Typically photodetectors generate a photo-induced current, which can optionally be converted to an induced voltage via electrical elements such as a transimpedance amplifier (TIA), which can be operated as an operational amplifier (op-amp).

Figure 21:
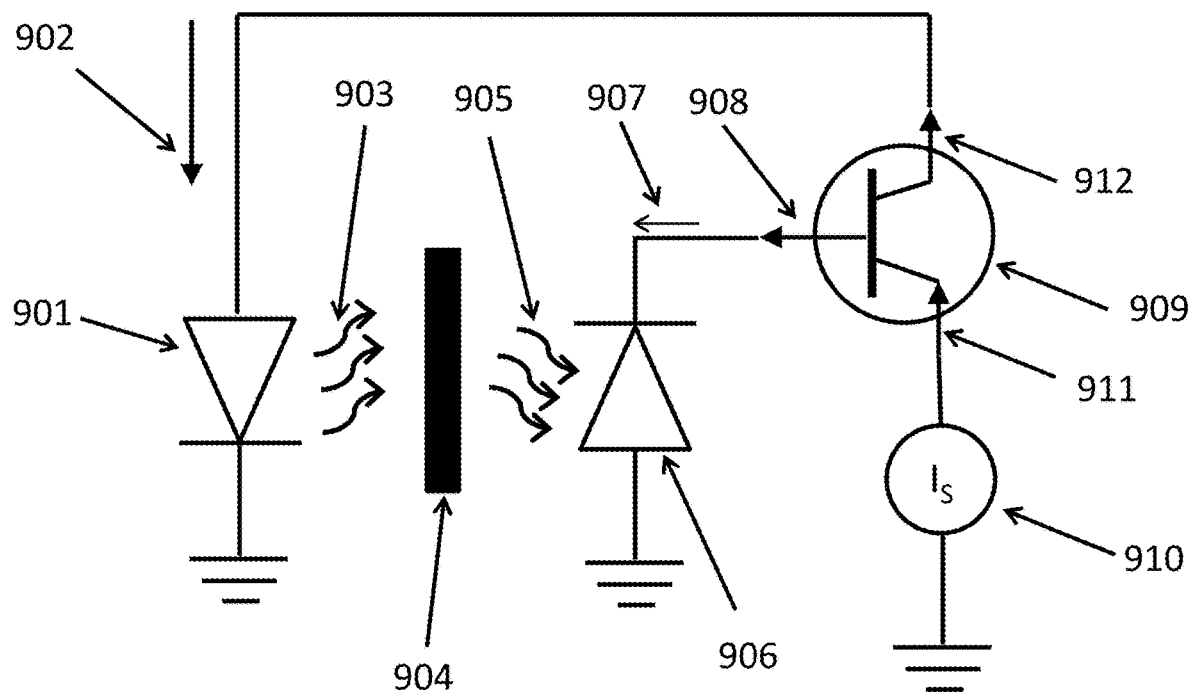
FIG. 21 is a schematic illustrating a laser based light source with an integrated safety feature based on integrated sensors and feedback according to an embodiment of the present invention.

In one example of this configuration a transistor is used to sense the output of the photodetector and allow sufficient current to flow the laser diode for operation of the laser light source. A transistor is composed of semiconductor material with at least three terminals for connection to an external circuit. In a transistor a first voltage or current applied to one pair of the transistor's terminals changes a second current or voltage through another pair of terminals. The three terminals can be referred to as the gate, source, and drain or as the base, emitter, and collecotr. Transistors can be utilized as switch devices to turn on and off electrical signals and as amplifier devices to increase the current or voltage of an input signal to a much larger output signal. In this invention since the controlled (output) power going to the laser for operation can be much higher than the controlling (input) power from the photodetector, a transistor can use a small input signal from the photocurrent generated in a photodetector to enable the high current or voltage output to the laser diode. There are an assortment of circuit designs that can be used that employ this principle including using multiple transistors, TIAs, operational amplifiers, resistors, capacitors, inductors, and any other circuit elements. Moreover, any of an assortment type of transistor can be used such as field effect transistor (FET), junction field effect transistor (JFET), bi-polar junction transistor (BJT), metal-oxide-semiconductor field effect transistor (MOSFET), metal-semiconductor field effect transistor (MESFET), insulated-gate bipolar transistor, and "other types" including hetereojunction bipolar transistor (HBT);

FIG. 21 presents a simplified schematic circuit diagram illustrating a laser based light source with feedback sensors according to this third category of laser based light sources with inherent safety design. The laser diode 901 or alternative SLED is configured with an input current to drive the gain material and excite electron-hole recombination. The recombination results in the emission of a first wavelength violet or blue excitation light 903. The violet or blue excitation light is incident on a wavelength conversion phosphor member 904 wherein at least a portion of the excitation light is converted to at least a second longer wavelength light 905. The second wavelength converted light is configured to form an incidence on a photodetector member 906. The photodetector may comprise a filter member to eliminate or attenuate wavelengths of light other than on or around the second wavelength, wherein the filter is preferably configured to eliminate the excitation first wavelength. The photodetector may be selected from a silicon based detector, a GaAs based detector, a GaP based detector, an InGaAs based detector, a Ge based detector, or another type of detector. The incident light on the photodetector induces a reverse photocurrent 907, which is flowing from the base terminal 908 of a bipolar transistor such as pnp bipolar junction transistor (BJT) 909. The transistor could be other types of transistors. A current source or supply 910 is configured to inject current to the emitter terminal 911 of the transistor. With the base region receiving the negative current flow from the excited photodetector 906 the transistor is switched to its "on state" and allows the transistor to pass the current from the emitter to the collector terminal 912, subsequently passing the drive current 902 to the laser diode 901 and induce the lasing state. The inherent safety design is anchored in the fact that the laser diode is being driven through a switch that is activated by the photodetector only when the photodetector is sensing wavelength converted light. Therefore, in the case that the phosphor member is removed or damaged such that the laser beam is not exciting the phosphor and creating a potentially hazardous situation to the outside environment, the laser diode will be shut off by the a drastic reduction or elimination of current flow to the laser diode.

As described above, the circuit diagram in FIG. 21 is a simplified example circuit of laser light source with a closed loop inherent safety design based on integrated sensors. There will of course be other or different circuit elements in slightly different embodiments. A key consideration in the present embodiment of this third category utilizing the output from the photodetector to "turn on" a transistor through the base or gate region is configuring the circuit to initiate. More specifically, without light output from the laser source there will not be wavelength converted light to be detected by the photodetector and "turn on" the circuit enabling the power to reach the laser. Specific design characteristics or features would be used to address this potential issue. One example would be to employ a capacitor or other time dependent circuit element in a configuration such that upon initial start-up or turn on of the light source the safety circuit would be by-passed or over-ridden for a very short period of time.

Figure 22:
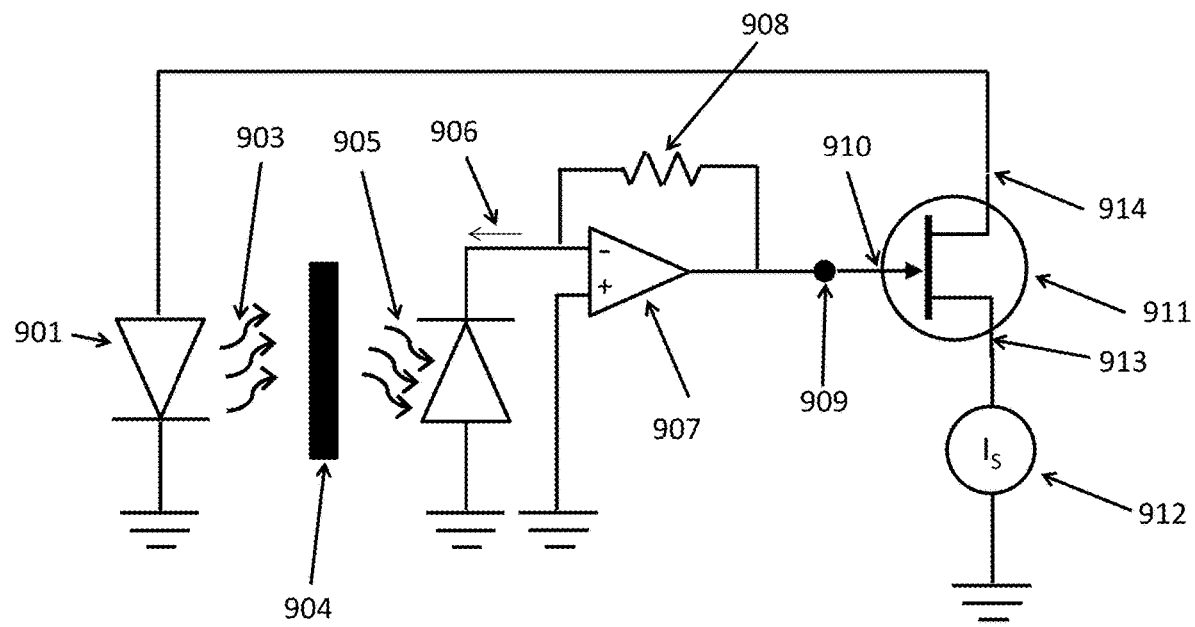
FIG. 22 is a schematic illustrating a laser based light source with an integrated safety feature based on integrated sensors and feedback according to an embodiment of the present invention.

FIG. 22 presents a simplified schematic circuit diagram illustrating a laser based light source with feedback sensors according to this third category of laser based light sources with inherent safety design. The laser diode 901 or alternative SLED is configured with an input current to drive the gain material and excite electron-hole recombination. The recombination results in the emission of a first wavelength violet or blue excitation light 903. The violet or blue excitation light is incident on a wavelength conversion phosphor member 904 wherein at least a portion of the excitation light is converted to at least a second longer wavelength light 905. The second wavelength converted light is configured to form an incidence on a photodetector member 906. The photodetector may comprise a filter member to eliminate or attenuate wavelengths of light other than those wavelengths on or around the second wavelength, wherein the filter is preferably configured to eliminate the excitation first wavelength. The photodetector may be selected from a silicon based detector, a GaAs based detector, a GaP based detector, an InGaAs based detector, a Ge based detector, or another type of detector. The incident light on the photodetector induces a reverse photocurrent 906, which is flowing from a transimpedance amplifier (TIA) 907 configured with a feedback resistor 908. The TIA 907 functions to convert the output photocurrent to a voltage 909 with a variable amplification. In alternative embodiments according to the present invention, configurations or devices other than TIAs are deployed to convert the photocurrent to a voltage.

In this embodiment according to the present invention, the voltage 909 is applied to the gate terminal 910 of a field effect transistor (FET) 911 and is preferably an enhancement mode transistor, but could be a depletion mode transistor. The transistor could be selected from many types of transistor structure. A current source or supply 912 is configured to inject current to the source terminal 913 of the transistor. With the gate region receiving the converted voltage from the TIA resulting from the photocurrent due to the excited photodetector 906, the channel resistance in the transistor is greatly reduced and the transistor is switched to its "on state" and allows the transistor to pass the current from the source to the drain terminal 914, subsequently passing the drive current 902 to the laser diode 901 and induce the lasing state. The inherent safety design is anchored in the fact that the laser diode is being driven through a switch that is activated by the photodetector only when the photodetector is sensing wavelength converted light. Therefore, in the case that the phosphor member is removed, compromised, or damaged such that the laser beam is not exciting the phosphor and creating a potentially hazardous situation to the outside environment, the laser based light source will be shut off by the a drastic reduction or elimination of current flow to the laser diode.

As described above, the circuit diagram in FIG. 22 is a simplified example circuit of laser light source with a closed loop inherent safety design based on integrated sensors.

There will of course be other or different circuit elements in slightly different embodiments. A key consideration in the present embodiment of this third category utilizing the output from the photodetector to "turn on" a transistor through the base or gate region is configuring the circuit to initiate. More specifically, without light output from the laser source there will not be wavelength converted light to be detected by the photodetector and "turn on" the circuit enabling the power to reach the laser. Specific design characteristics or features would be used to address this potential issue. One example would be to employ a capacitor or other time dependent circuit element in a configuration such that upon initial start-up or turn on of the light source the safety circuit would be by-passed or over-ridden for a very short period of time.

In the above example embodiments of this third category of laser based light systems with inherent safety designs based on integrated sensors photodiode were implemented to detected a change in the emission from the waveguide converting phosphor member. In those embodiments the safety interlock design is triggered by a reduction in phosphor converted light, which would be an indication that the phosphor was compromised and may lead to an unsafe condition such as an exposed laser beam. In another embodiment, photodiodes intended to detect the light emission from the laser diode or waveguide gain element can be implemented either in combination with or as a replacement for the previous examples. In this embodiment, a photodiode configured to detect the excitation light such as blue or violet emission is spatially positioned in a location such that if the phosphor is compromised the excitation light intensity would increase on the photodiode. This would trigger an increase in photocurrent, which would subsequently de-activate the laser based light source.

Figure 23:
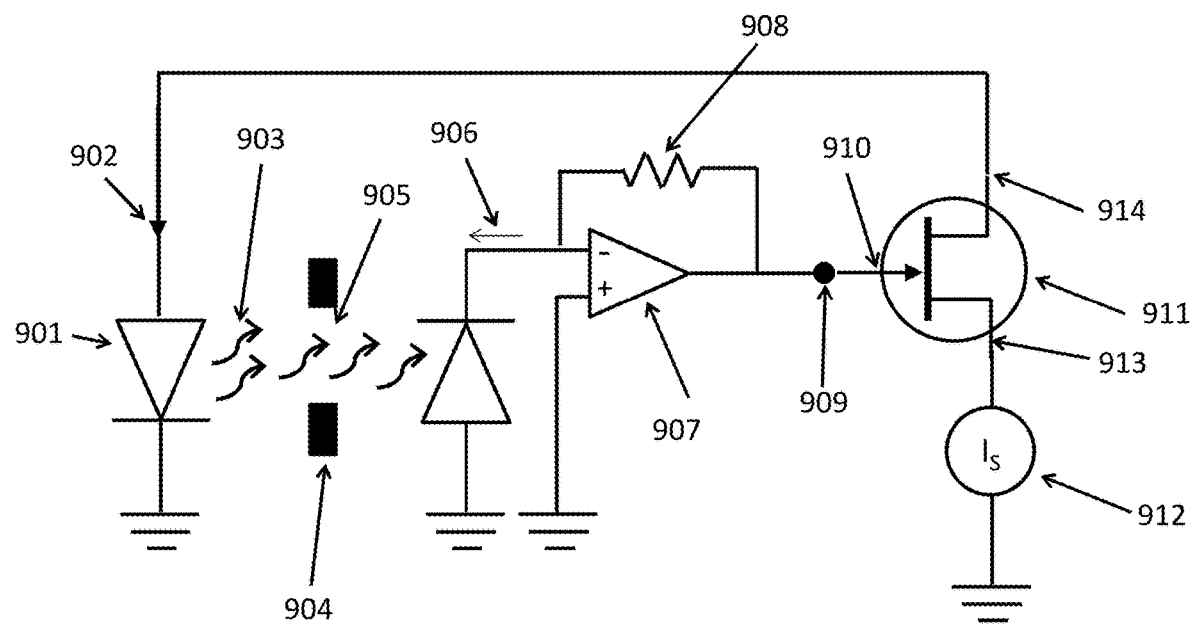
FIG. 23 is a schematic illustrating a laser based light source with an integrated safety feature based on integrated sensors and feedback according to an embodiment of the present invention.

FIG. 23 presents a simplified schematic circuit diagram illustrating a laser based light source with feedback sensors according to this third category of laser based light sources with inherent safety design. The laser diode 901 or alternative SLED is configured with an input current to drive the gain material and excite electron-hole recombination. The recombination results in the emission of a first wavelength violet or blue excitation light 903. The violet or blue excitation light is intended to be incident on a wavelength conversion phosphor member 904 wherein at least a portion of the excitation light is converted to at least a second longer wavelength. In the event that the phosphor member is compromised with a removal, damage, or hole in it as shown in 905, excitation light at the first wavelength is configured to form an incidence on a photodetector member 906. The photodetector may comprise a filter member to eliminate or attenuate wavelengths of light other than those on or around the first wavelength, wherein the filter is preferably configured to eliminate the wavelength converted light from the phosphor member. The photodetector may be selected from a silicon based detector, a GaAs based detector, a GaP based detector, an InGaAs based detector, a Ge based detector, or another type of detector. The incident light on the photodetector induces a reverse photocurrent 906, which is flowing from a transimpedance amplifier (TIA) 907 configured with a feedback resistor 908. The TIA 907 functions to convert the output photocurrent to a voltage 909 with a variable amplification. In alternative embodiments of this invention, other devices aside from a TIA are utilized to convert the photocurrent to a voltage.

In this embodiment according to the present invention, the voltage 909 is applied to the gate terminal 910 of a field effect transistor (FET) 911 and is preferably a depletion mode transistor, but could be an enhancement mode transistor. The transistor could be selected from many types of transistor structures. A current source or supply 912 is configured to inject current to the source terminal 913 of the transistor. With the gate region receiving the converted voltage from the TIA resulting from the photocurrent due to the excited photodetector 906, the channel resistance in the transistor is greatly increased and the transistor is switched to its "off state" and as a result the transistor greatly reduces or eliminates the current flow through the transistor from the source to the drain terminal 914, subsequently cutting off the drive current 902 to the laser diode 901 and turning off the laser light source. The inherent safety design is anchored in the fact that the laser diode is being driven through a switch that is activated by the photodetector only when the photodetector is not substantially sensing the wavelength of the excitation light. Therefore, in the case that the phosphor member is removed, compromised, or damaged such that the laser beam is not exciting the phosphor and creating a potentially hazardous situation to the outside environment, the excitation wavelength power will increase on the photodiode and laser based light source will be shut off by the a drastic reduction or elimination of current flow to the laser diode.

Figure 24:
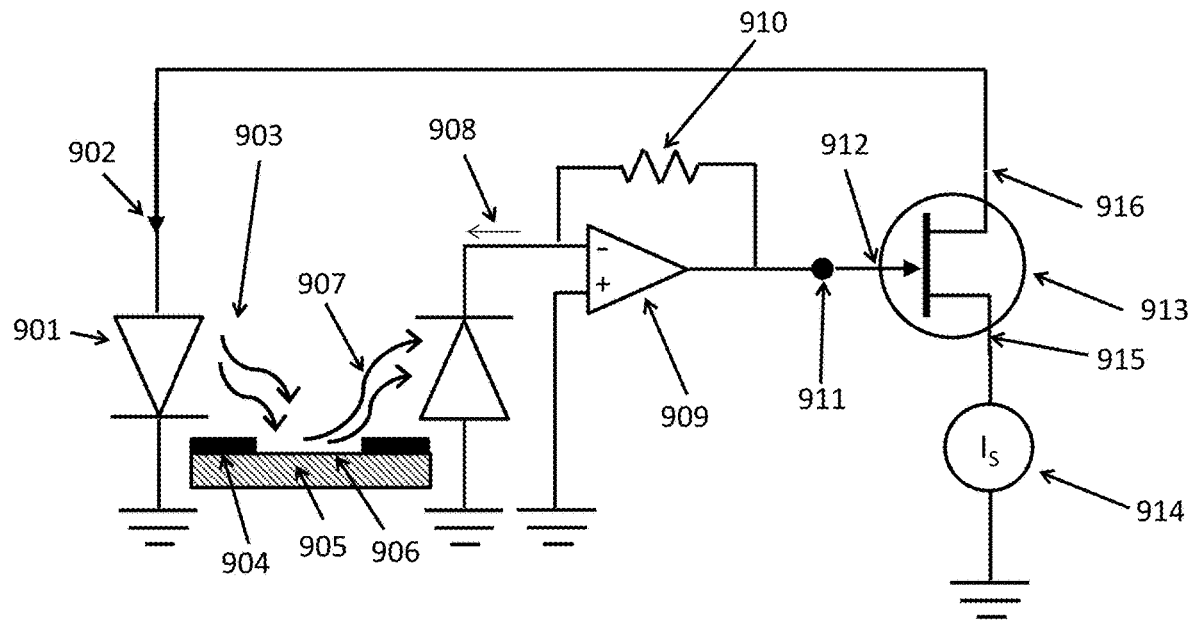
FIG. 24 is a schematic illustrating a laser based light source with an integrated safety feature based on integrated sensors and feedback according to an embodiment of the present invention.

In all embodiments according to the present invention the laser based light source comprised of a laser diode or waveguide gain element combined with a phosphor member, the phosphor may be operated in a reflective mode. FIG. 24 presents a simplified schematic circuit diagram illustrating a laser based light source with feedback sensors according to this third category of laser based light sources with inherent safety design similar to that in FIG. 23 as an example of a reflective mode phosphor embodiment. The laser diode 901 or alternative SLED is configured with an input current to drive the gain material and excite electron-hole recombination. The recombination results in the emission of a first wavelength violet or blue excitation light 903. The violet or blue excitation light is intended to be incident on a wavelength conversion phosphor member 904 operated in a reflective mode and mounted on a support member 905, wherein at least a portion of the excitation light is converted to at least a second longer wavelength. In the event that the phosphor member is compromised with a removal, damage, or hole in it as shown in 906, excitation light at the first wavelength is configured to reflect from the support member or other surface. The reflected excitation light 907 forms an incidence on a photodetector member 908. The photodetector may comprise a filter member to eliminate or attenuate wavelengths of light other than those on or around the first wavelength, wherein the filter is preferably configured to eliminate the wavelength converted light from the phosphor member. The photodetector may be selected from a silicon based detector, a GaAs based detector, a GaP based detector, an InGaAs based detector, a Ge based detector, or another type of detector. The incident light on the photodetector induces a reverse photocurrent 906, which is flowing from a transimpedance amplifier (TIA) 909 configured with a feedback resistor 910. The TIA 909 functions to convert the output photocurrent to a voltage 911 with a variable amplification. In alternative embodiments of this invention, other devices aside from a TIA are utilized to convert the photocurrent to a voltage.

In this embodiment according to the present invention, the voltage 911 is applied to the gate terminal 912 of a field effect transistor (FET) 913 and is preferably a depletion mode transistor, but could be an enhancement mode transistor. The transistor could be selected from many types of transistor structures. A current source or supply 914 is configured to inject current to the source terminal 915 of the transistor. With the gate region receiving the converted voltage from the TIA resulting from the photocurrent due to the excited photodetector 908, the channel resistance in the transistor is greatly increased and the transistor is switched to its "off state" and as a result the transistor greatly reduces or eliminates the current flow through the transistor from the source to the drain terminal 916, subsequently cutting off the drive current 902 to the laser diode 901 and turning off the laser light source. The inherent safety design is anchored in the fact that the laser diode is being driven through a switch that is activated by the photodetector only when the photodetector is not substantially sensing the wavelength of the excitation light. Therefore, in the case that the phosphor member is removed, compromised, or damaged such that the laser beam is not exciting the phosphor and creating a potentially hazardous situation to the outside environment, the excitation wavelength power will increase on the photodiode and laser based light source will be shut off by the a drastic reduction or elimination of current flow to the laser diode.

In any of the embodiments according to this invention, the photodiode or photodetector may be configured for a surface normal detection wherein the detected light is incident on the photodiode at about an angle orthogonal to the semiconductor surface area. The light is typically detected with the generation of a photocurrent in a reversed biased semiconductor structure. This surface normal configuration is the conventional design for a discrete photodiode element integrated into the system, but in some embodiments the photodiode can be integrated with the laser diode or waveguide element either in the same epitaxial layer structure, on the same substrate, or mounted on a common support member. In some preferred embodiments the photodiode may be a waveguide photodiode wherein the detected light enters the photodiode from an edge surface into a waveguide where the light is detected with a photocurrent generation typically in a reverse biased semiconductor structure. Waveguide or edge illumination photodiodes may be configured as discrete photodiodes or may be integrated with the light emitter. Discrete photodiodes or other sensor members indicates that that they may be contained within the same package or assembly as the laser diode and could be mounted on the same support member. Monolithically integrated photodiodes are contained on the same chip as the laser diode or waveguide gain element in the laser based light source.

For the monolithic integration of the photodiode with the waveguide gain element or laser diode several approaches can be implemented. A simple and most straightforward embodiment would be to use the same epitaxial structure for the photodector as used for the laser diode or waveguide gain element. In this embodiment n and p contacts would be formed to the detector region similarly or identical to the laser diode or waveguide gain element, but the bias on the photodiode would be a reverse bias to sweep out the photogenerated current. That is, instead of applying a forward bias to induce a gain as in the laser diode, the photodiode is reverse biased to create an absorption. In alternative embodiments of monolithically integrated photodiodes, a selective area growth method or butt-joint regrowth method may be used to define a separate epitaxial structure than the laser diode or waveguide gain element.

In an embodiment with a monolithically integrated waveguide photodiode, the photodiode waveguide could be positioned relative to the laser diode or waveguide gain element in many configurations. In one embodiment it is positioned adjacent to the laser diode or gain element waveguide. In another embodiment the photodiode is spatially positioned behind or in front of the laser diode or waveguide gain element, or some combination of adjacent and behind or in front of. In yet another embodiment, the photodiode waveguide region is positioned along the same waveguide axis as the laser diode or the waveguide gain element. For example, the photodiode can be positioned behind the rear mirror of a laser diode or a SLED. The waveguide photodiode preferably has a similar structure as the laser diode or waveguide gain element, but optionally with different waveguide dimensions. For example, the photodiode waveguide absorption region can be much shorter such as having a length of 25-100 um, 100 to 250 um, or 250 um to 1000 um. The photodiode waveguide absorption waveguide region may also have a different width to improve its performance such as having a wider width of 15 um to 100 um or a narrower width of 1 um to 15 um. In alternative embodiments, surface normal photodiodes are integrated with the laser diodes or waveguide gain elements.

Active safety measures can make use of integrated active components. Example active components include photodiodes/photodetectors, thermistors, thermocouples, and others. Strategically located photodetectors designed to detect direct blue emission from the laser, scattered blue emission, or phosphor emission such as yellow phosphor emission can be used to detect failures of the phosphor where a blue beam could be exposed. Upon detection of such an event, a close circuit or feedback loop would be configured to cease power supply to the laser diode and effectively turn it off. As an example, a detector used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system. In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and deactivate it. Of course these are merely example embodiments, there are several configurations for photodiodes and/or thermistors to be integrated with a laser based white light source to form a safety feature such as a feedback loop to cease operation of the laser.

Of course other safety elements can be incorporated to any embodiment of the present invention. For example passive safety design features and measures can be employed. Passive safety measures can include positioning the laser beam with respect to the phosphor in a way such that if the phosphor is removed or damaged, the exposed laser beam would not make it to the outside environment in a harmful form such as collimated, coherent beam. More specifically, the light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor. The beam dumps, absorbing material, or scattering material will attenuate the power of the laser beam and make it incoherent.

In one embodiment, the present invention provides a laser-based eye safe white light source comprising a form factor characterized by a length, a width, and a height. The apparatus has a support member and at least one gallium and nitrogen containing waveguide gain element or laser diode devices and phosphor material overlying the support member. The waveguide gain element or laser device is capable of an emission of a laser beam with a wavelength preferably in the blue region of 425 nm to 475 nm or preferably in the ultra violet or violet region of 380 nm to 425 nm, but can be other such as in the cyan region of 475 nm to 510 nm or the green region of 510 nm to 560 nm. In a preferred embodiment the phosphor material can provide a yellowish emission in the 550 nm to 590 nm range such that when mixed with the blue emission of the laser diode a white light is produced. In other embodiments phosphors with red, green, yellow, and even blue emission can be used in combination with the laser diode excitation source to produce a white light with color mixing.

In many embodiments of the present invention the attachment interface between the phosphor and the common support member must be designed and processed with care. The thermal impedance of this attachment joint should be minimized using a suitable attaching material, interface geometry, and attachment process practices for a thermal impedance sufficiently low to allow the heat dissipation. Moreover, the attachment interface may be designed for an increased reflectivity to maximize the useful white light exiting the emission surface of the phosphor. Examples include AuSn solders, SAC solders, lead containing solders, indium solders, indium, and other solders. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The side-pumped transmissive apparatus has a form factor characterized by a length, a width, and a height. In an example, the height is characterized by a dimension of less than 25 mm and greater than 0.5 mm, although there may be variations.

To improve the efficiency of the laser based light source, measures can be taken to minimize the amount of light exiting from the first surface wherein the excitation light is incident on the phosphor and maximize the light exiting the second primary white light emission side of the phosphor where the useful white light exits. Such measures can include the use of filters, spectrally selective reflectors, conventional mirrors, spatial mirrors, polarization based filters, holographic elements, or coating layers, but can be others.

In one example for a transmissive mode phosphor, a filter is positioned on the backside of the phosphor to reflect the backward propagating yellow emission toward the front of the phosphor where it has another opportunity to exit the primary emitting surface into useful white light. In this configuration the reflector would have to be designed to not block the blue excitation light. The reflector could be configured from the spectrally selective distributed Bragg reflector (DBR) mirror comprised of 2 or more alternating layers with different refractive indices designed to reflect yellow light over a wide range of angles. The DBR could be deposited directly on the phosphor using techniques such as e-beam deposition, sputter deposition, or thermal evaporation. Alternatively, the DBR could be in the form of a plate-like element that is applied to the phosphor. Since in a typical white light source configured from a mixing of yellow and blue emission the yellow emission comprised about 70% of the energy, this approach of reflecting the yellow light may be a sufficient measure in many applications. Of course, there can be additional variations, modifications, and alternatives.

In another example for a transmissive mode phosphor, a filter system is positioned on the backside of the phosphor to reflect the backward propagating yellow emission and the scattered blue excitation light back toward the front of the phosphor where it has another opportunity to exit the primary emitting surface into useful white light. The challenge of this configuration is to allow the forward propagating blue pump excitation light to pass through the filter without allowing the scattered backward propagating blue light to pass. One approach to overcoming this challenge is deploying a filter designed for incident angular reflectivity dependence and configuring the laser at an incident angle wherein the reflectivity is a minimum such as a normal incidence. Again, in this configuration the reflector could be configured from DBR mirrors such that one DBR mirror pair would reflect yellow and a second DBR pair would serve to reflect the blue light with the determined angular dependence. The DBR could be deposited directly on the phosphor using techniques such as e-beam deposition, sputter deposition, or thermal evaporation. Alternatively, the DBR could be in the form of a plate-like element that is applied to the phosphor. Of course, there can be additional variations, modifications, and alternatives.

A second approach to overcoming the challenge of reflecting a backward propagating blue emission and yellow emission while allowing a forward blue emission to pass is deploying a filter system that combines a yellow spectrally selective reflector such as a DBR and a polarization based reflector for the blue light. Since the blue emission from the laser excitation source can be highly polarized with polarization ratios greater than 90% or greater than 95% and the backward propagating scattered blue light will have a mixed polarization, the polarization based reflector can be configured to allow the polarization state of the laser diode output beam (eg TE) to freely pass the filter while acting as a reflector to other polarization states. This configuration would likely require two elements that may be combined into a single thing film. A first element would be a yellow reflector such as a DBR mirror pair or another single layer or multi-layer film designed to reflect yellow. The second element would be a polarization sensitive material such as a plastic, ceramic, metal, or glass. The DBR or other yellow reflective material could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

A third approach to overcoming the challenge of reflecting a backward propagating blue emission and yellow emission while allowing a forward blue emission to pass is deploying a filter system that combines a yellow spectrally selective reflector such as a DBR and a spatial based reflector for the blue light. This configuration would likely require two elements that may be combined into a single thing film. A first element would be a yellow reflector such as a DBR mirror pair or another single layer or multi-layer film designed to reflect yellow. The second element would be a comprised of an element to reflect blue and would be applied to the back of the phosphor in a selective manner such that it was not present where the excitatiom beam is incident on the phosphor, but is present over the area where the lbeam is not incident. The second element could be another DBR coating stack or a broadband reflector material such as Ag or Al. Both the first element such as a DBR or other yellow reflective material and the second element spatially reflective to blue light could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

In other embodiments, coatings or other materials may be used to reduce the reflectivity of the front emission surface of the phosphor. In yet other embodiment, coatings or additional elements may be applied to reduce the reflectivity of the incident beam on the phosphor surface. In configurations where off axis excitation beam incident angles are used such measure to reduce the reflectivity of the laser beam on the phosphor may be critical.

In the present invention, the waveguide gain element or laser diode output beam must be configured to be incident on the phosphor material to excite the phosphor. The apparatus typically has a free space with a non-guided beam characteristic transmitting the emission of the laser beam from the laser device to the phosphor material. The 1 beam spectral width, wavelength, size, shape, intensity, and polarization are configured to excite the phosphor material. Specifically, in many applications it is desirable to have a round excitation beam such that the illuminated spot on the phosphor is also round and the resulting white light emission radiates from a round area. Such a round area is advantageous for forming collimated or spot light sources using conventional optics and reflectors commonly available for round emission. Additionally, the round beam produces some symmetry in the phosphor so that there are not thermal hotspots which can lead to changes in phosphor conversion efficiency or even initiate failure mechanisms in the phosphor.

This same concept can also be utilized to generate other shapes such as elliptical, conical, rectangular and others for applications which require non-circular beams. In automotive headlights for example, customized spatial patterns are desired to produce illumination in desired areas, and darker spots in the beam pattern in order to avoid causing glare to other oncoming drivers.

The inherent divergence properties of the output beams from typical edge-emitting waveguide gain elements or diode lasers leads to the beam expanding in both the x-direction (slow divergence axis) and y-direction (fast divergence axis) as it propagates in free/unguided space. Complicating matters is the different divergence rates of the beam on the fast and slow axis resulting from the waveguide confinement characteristics in the laser diode. For example, typical full width at half maximum (FWHM) beam divergences range from about 5-20 degrees in the slow axis and 10 to 40 degrees in the fast axis, but can be others. Another measure of divergence of the laser beam is the divergence angles taken at the point in the output beam where the power has dropped to the 1/e2 level. For this 1/e2 measure, typical beam divergences range from about 10-30 degrees in the slow axis and 20 to 80 degrees in the fast axis, but can be others. Thus, the ratio of the fast axis to slow axis divergence angles range from about 2:1 to about 4:1. The resulting projected spot from a free-space/unguided laser beam is an elliptical shape, typically with the fast axis diameter being greater than the slow axis diameter.

In some preferred embodiments of the present invention a collimating optic is positioned between the waveguide gain element or laser diode and the phosphor to collimate and/or beam shape the waveguide gain element or laser output beam. By placing a free space optic in front of the output beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to ball lenses, aspheric collimator, dichroic mirrors, turning mirrors, optical isolators, but could be others.

Figure 25:
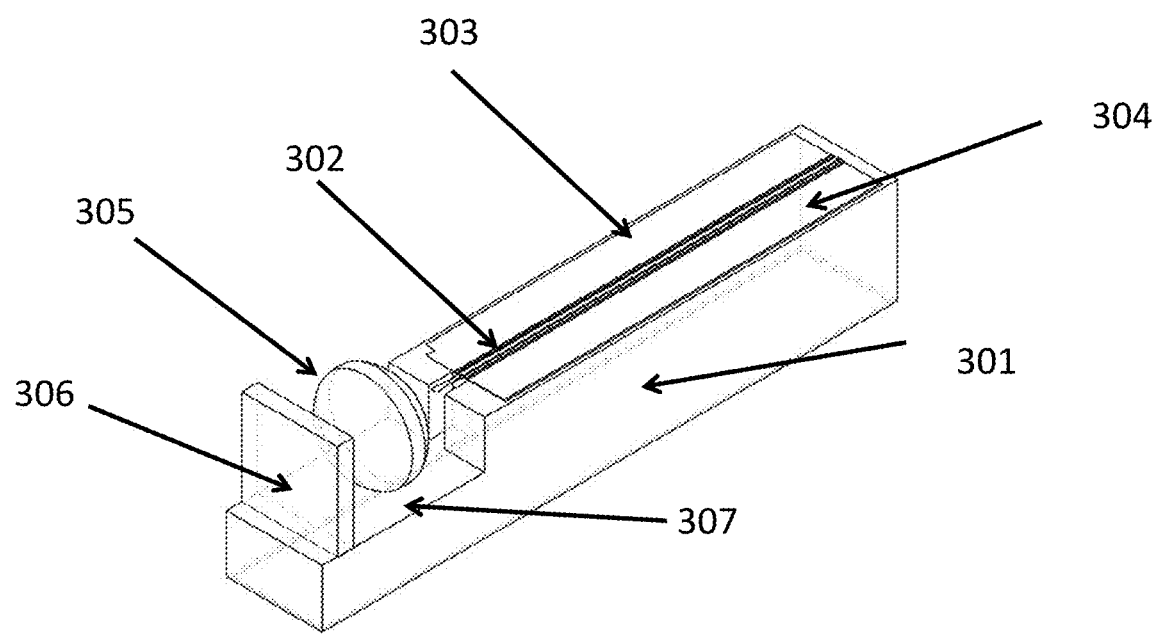
FIG. 25 is a simplified illustrating a laser based light source with an integrated lens element, a waveguide gain element, and a phosphor member integrated onto the sub-mount member according to an embodiment of the present invention.

In all three categories of laser based light sources with inherent safety feature designs according to this invention, integrated optics can be included in the laser light source. In a preferred embodiment, optics are positioned between the waveguide gain element or laser diode output facet to shape the output beam prior to incidence on the one or more phosphor members. Example of optical elements include aspheric lens, collimating lens, fast axis collimating lens, slow axis collimating lens, ball lens, pin holes, any others. FIG. 25 presents a schematic diagram illustrating a laser based light source that could represent all categories described above according to this invention, but also including free-space optics to collimate and shape the laser beam for incidence on the phosphor according to the present invention. In this embodiment the gallium and nitrogen containing lift-off and transfer technique is deployed to fabricate a very small and compact submount member with the waveguide gain element or laser diode chip formed from transferred epitaxy layers. Of course, a conventional chip on submount embodiment could be used for this integrated free-space optic embodiment. The laser based light source is comprised of submount material 301 that serves as the common support member configured to act as an intermediate material between a waveguide gain element laser diode 302 formed in transferred gallium and nitrogen containing epitaxial layers and a final mounting surface and as an intermediate material between the phosphor plate material 305 and a final mounting surface. The waveguide guide element or laser diode and/or submount is configured with electrodes 303 and 304 that may be formed with deposited metal layers and combination of metal layers including, but not limited to Au, Pd, Pt, Ni, Al, titanium, or others. The output beam is coupled into an aspheric lens 305 for collimation and beam shaping to create a more circular beam, which then excites a phosphor plate 305 positioned in front of aspheric lens. The phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple electrical power to the waveguide gain element or laser diode device to generate a output beam from the laser or waveguide gain element. Of course this is merely an example of a configuration and there could be many variants on this embodiment including but not limited to different shape phosphors, different geometrical designs of the submount or common support member, different orientations of the waveguide gain element or laser output beam with respect to the phosphor, different electrode and electrical designs, and others.

In an alternative preferred embodiment, beam shaping can achieved by tilting the phosphor excitation surface with respect the waveguide gain element or laser diode aperture and positioning the aperture at a designed distance from the phosphor to exploit the beam divergence properties of the waveguide gain element or laser diode and achieve the desired spot size. This "optics-less" beam shaping embodiment is advantageous over embodiments where optical elements are introduced for beam shaping and collimation. These advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor.

In alternative embodiments of the present invention, multiple phosphors are operated in a transmissive mode for a white emission. In one example, a violet waveguide gain element or laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the output beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration the beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light.

In an alternative embodiment of a multi-phosphor transmissive example according to the present invention, a blue waveguide gain element or laser diode operating with a wavelength of 425 nm to 480 nm is configured to excite a first green phosphor and a second red phosphor. In this configuration, a first green phosphor plate could be fused or bonded to the second red phosphor plate. In a practical configuration the output beam would be directly incident on the first green phosphor wherein a fraction of the green emission would excite the second red phosphor to emit red emission to combine with green phosphor emission and blue waveguide gain element or laser diode emission to generate a white light. In an alternative practical configuration the output beam would be directly incident on the second red phosphor wherein a fraction of the blue electromagnetic emission would be absorbed in the red phosphor to excite red emission and a portion of the remaining blue laser emission would pass to the green phosphor and create a green emission to combine with the red phosphor emission and blue waveguide gain element or laser diode emission to generate a white light. The benefit or feature of this embodiment is the higher color quality that could be achieved from a white light comprised of red, green, and blue emission. Of course there could be other variants of this invention including integrating more than two phosphor and could include one of or a combination of a red, green, blue, and yellow phosphor.

In other variations, the support member can be used to manipulate the light in the laser based light source. In one example, an optically transparent support member could serve as a waveguide for the waveguide gain element or laser diode generated light to reach the phosphor. In another example, an optically transparent support member can be configured to transmit the excitation light to the phosphor member. In other examples of this variation wherein the support member manipulates the light, the support member can be shaped or configured to form reflectors, mirrors, diffusers, lenses, absorbers, or other members to manipulate the light. In another variation, the support member could also serve as a protective safety measure to ensure that no direct emitting laser light is exposed as it travels to reach the phosphor.

Point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assemblies are applied to a large point source, the optical control and collimation is diminished.

In many of the specific examples of the laser based light source with inherent safety features provide above phosphor members were operated in a transmissive mode where typically the entering excitation light and useful exit light enter and exit through separate surfaces. However, these are merely examples and alternative specific preferred embodiments of the laser based light source can be configured with a reflective mode phosphor operation. In reflective mode phosphors the input excitation light typically enters through the same surface as the useful output light exits. In one example the excitation waveguide gain element or laser beam enters the phosphor through the same primary surface as the useful white light is emitted from. That is, operated in reflective mode the phosphor could have a first primary surface configured for both receiving the incident excitation beam and emitting useful white light. In this configuration, the phosphor is positioned in front of the waveguide gain element or laser facet that outputs the laser beam, wherein both the laser and the phosphor are configured on a support member. The gallium and nitrogen containing waveguide gain element or laser diode is configured with a cavity that has a length greater than 100 um, greater than 500 um, greater than 1000 um, or greater than 1500 um long and a width greater than 1 um, greater than 10 um, greater than 20 um, greater than 30 um, or greater than 45 um. The cavity is configured with a front facets and back facet on the end wherein the front facet comprises the output facet and emits the excitation beam incident on the phosphor. The front facet can be configured with an anti-reflective coating to decrease the reflectivity or no coating at all thereby allowing radiation to pass through the mirror without excessive reflectivity. In some preferred embodiments a superluminescent diode (SLED) is employed as the waveguide gain element. In other examples the coating may be configured to slightly increase the reflectivity. Since no beam is to be emitted from the back end of the cavity member, the back facet or mirror is configured to reflect the radiation back into the cavity. For example, the back facet includes highly reflective coating with a reflectivity greater than 85% or 95%. In one example, the phosphor can be comprised of Ce doped YAG and emits yellow emission. The phosphor may be a ceramic phosphor and could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 um, greater than 100 um, greater than 200 um, greater than 500 um, greater than 1 mm, or greater than 10 mm and a thickness of less than 500 um, less than 200 um, less than 100 um or less than 50 um. A key benefit to a reflective mode phosphor is the ability to configure it for excellent heat dissipation since the backside of surface of the phosphor can be directly heat-sunk to the common support member or intermediate submount member. Since the phosphor is preferably thin, the thermal path is short and can rapidly travel to the support member. In alternative or the same embodiments a YAG:CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one example of the reflective mode laser based light source embodiment of this invention optical coatings, material selections, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light is applied to the phosphor prior to attaching the phosphor to the common support member. Such coatings could be comprised of metal layers such as silver or aluminum, or others such as gold, which would offer good thermal conductivity and good reflectance or could be comprised of dielectric layers configured as single layers, multi layers, or DBR stacks, but could be others. In another example, a reflective material is used as a bonding medium that attaches the phosphor to the support member or to an intermediate submount member. Examples of reflective materials include reflective solders like AuSn, SnAgC (SAC), or Pb containing phosphors, or reflective glues, but could be others. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, Pb containing solders, indium, and other solders. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode laser based light source embodiment of this invention is configured with the phosphor member attached to the common support member with the large primary surface configured for receiving the excitation light and emitting useful white light positioned at an angle normal (about 90 degrees) or off-normal (about 0 degrees to about 89 degrees) to the axis of the waveguide gain element or laser diode output beam functioning to excite the phosphor. That is, the output beam is pointing toward the phosphor's emission surface at an angle of between 0 and 90 degrees, wherein 90 degrees (orthogonal) is considered normal incidence. The inherent geometry of this configuration wherein the laser beam is directed away from or in an opposite direction that the useful white light will exit the phosphor toward the outside world is ideal for safety. As a result of this geometry, if the phosphor get damaged or removed during operation or from tampering, the excitation beam would not be directed to the outside world where it could be harmful. Instead, the excitation beam would be incident on the backing surface where the phosphor was attached. With proper design of this backing surface the excitation beam can be scattered, absorbed, or directed away from the outside world instead of exiting the white light source and into the surrounding environment.

In one embodiment of this reflective mode laser based light source the waveguide gain element or laser excitation beam is configured normal to the primary phosphor emission surface. In this configuration the waveguide gain element or laser diode would be positioned in front of the primary emission surface of the phosphor where it could impede the useful white light emitted from the phosphor. This could create losses in or inefficiencies of the white light device and would lead to difficulty in efficiently capturing all white light emitted from the phosphor. Such optics and reflectors include, but are not limited to aspheric lenses or parabolic reflectors. To overcome the challenges of normal incident reflective mode phosphor excitation, in an alternative preferable embodiment the excitation beam would be configured with an incident angle that is off-axis to the phosphor such that it hits the phosphor surface at an angle of between 0 and 89 degrees or at a "grazing" angle. In this preferable embodiment the waveguide gain element or laser diode device is positioned adjacent to or to the side of the phosphor instead of in front of the phosphor where it will not substantially block or impede the emitted white light, and importantly, allow for optics such as collimating lenses or reflectors to access the useful light and project it to the application. Additionally, in this configuration the built in safety feature is more optimal than in the normal incidence configuration since when incident at an angle in the case of phosphor damage or removal the incident excitation beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

In one embodiment of the present invention, the rapidly diverging elliptical nature of the excitation beam exiting the waveguide gain element or laser diode would be mitigated using a beam shaping optic such as a collimating optic. This optic would be positioned between the waveguide gain element or laser diode and the phosphor to shape and/or collimate the output beam prior to incidence with the phosphor. By placing a free space optic in front of the output beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to ball lenses, aspheric collimator, dichroic mirrors, turning mirrors, optical isolators, but could be others.

In an alternative preferred off-axis reflective mode embodiment, beam shaping can be achieved by rotating the waveguide gain element or laser beam with respect to the tilted phosphor excitation surface. By rotating the beam about the axis of the beam emission, the phosphor tilt will shift from increasing the fast axis beam diameter to the increasing the slow axis beam diameter, and hence, compensate for the slower diverging slow axis beam axis diameter and make for a more circular beam. This dual-axis tilting or rotation embodiment of "optics-less" beam shaping is advantageous over embodiments where optical elements are introduced for beam shaping and collimation. The advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor.

In other variations, the support member can be used to manipulate the laser based light source. In one example, an optically transparent support member could serve as a waveguide for the excitation light to reach the phosphor. In another example, an optically transparent support member can be configured to transmit the excitation light to the phosphor member. In other examples of this variation wherein the support member manipulates the light, the support member can be shaped or configured to form reflectors, mirrors, diffusers, lenses, absorbers, or other members to manipulate the light. In another variation, the support member could also serve as a protective safety measure to ensure that no direct emitting excitation light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assemblies are applied to a large point source, the optical control and collimation is diminished.

In all embodiments of the laser based light source final packaging would need to be considered. There are many aspects of the package that should be accounted for such as form factor, cost, functionality, thermal impedance, sealing characteristics, and basic compatibility with the application. Form factor will depend on the application, but in general making the smallest size packaged white source will be desirable. Cost should be minimized in all applications, but in some applications cost will be the most important consideration. In such cases using an off-the-shelf packages produced in high volume may be desirable. Functionality options include direction and properties of the exiting light emission for the application as well as integration of features such as photodectors, thermistors, or other electronics or optoelectronics. For best performance and lifetime the thermal impedance of the package should be minimized, especially in high power applications.

The package is characterized by a sealing configuration. One example of a sealing configuration includes open environment wherein the white light source is subjected to the ambient conditions. In some embodiment with robust laser waveguide gain element or diode and phosphor designs intended for open environment operation this embodiment is favorable. As an example, the waveguide gain element or laser diode chip may be encapsulated in a protective layer to prevent oxidation, chemical reaction, or contamination of the laser diode. In some embodiments the laser is formed from a substantially aluminum free nonpolar or semipolar design wherein the laser diode facet regions are less prone to oxidation and degradation. Similarly, the phosphor can also be encapsulated in a protective layer to prevent oxidation, chemical reaction, or contamination of the phosphor.

In preferred embodiments of the present invention, the laser based light source is characterized with an environmentally sealed package or a hermetically sealed package. For an environmentally sealed configuration, the package enclosure prevents dust and other particles from interacting with the laser or phosphor. For hermetically sealed packages, the package should be leak tight and characterized by a very small or non-existent leak rate. For hermetically sealed packages it is typically favorable to backfill the packaging of a combination of oxygen and nitrogen such as clean dry air (CDA), but can be others such as nitrogen. Typically for GaN based lasers it is desirable for hermetically sealed packages, but other packages can be considered and deployed for various applications. Examples of off the shelf packages for the CPoS white light source include TO cans such as TO38, TO56, TO9, TO5, or TO46. Flat packages configured with windows can also be used. Examples of flat packages include a butterfly package like a TOSA. Surface mount device (SMD) packages can also be used, which are attractive due to their low price, hermetic sealing, and potentially low thermal impedance. In other embodiments, custom packages are used.

As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

Figure 26:
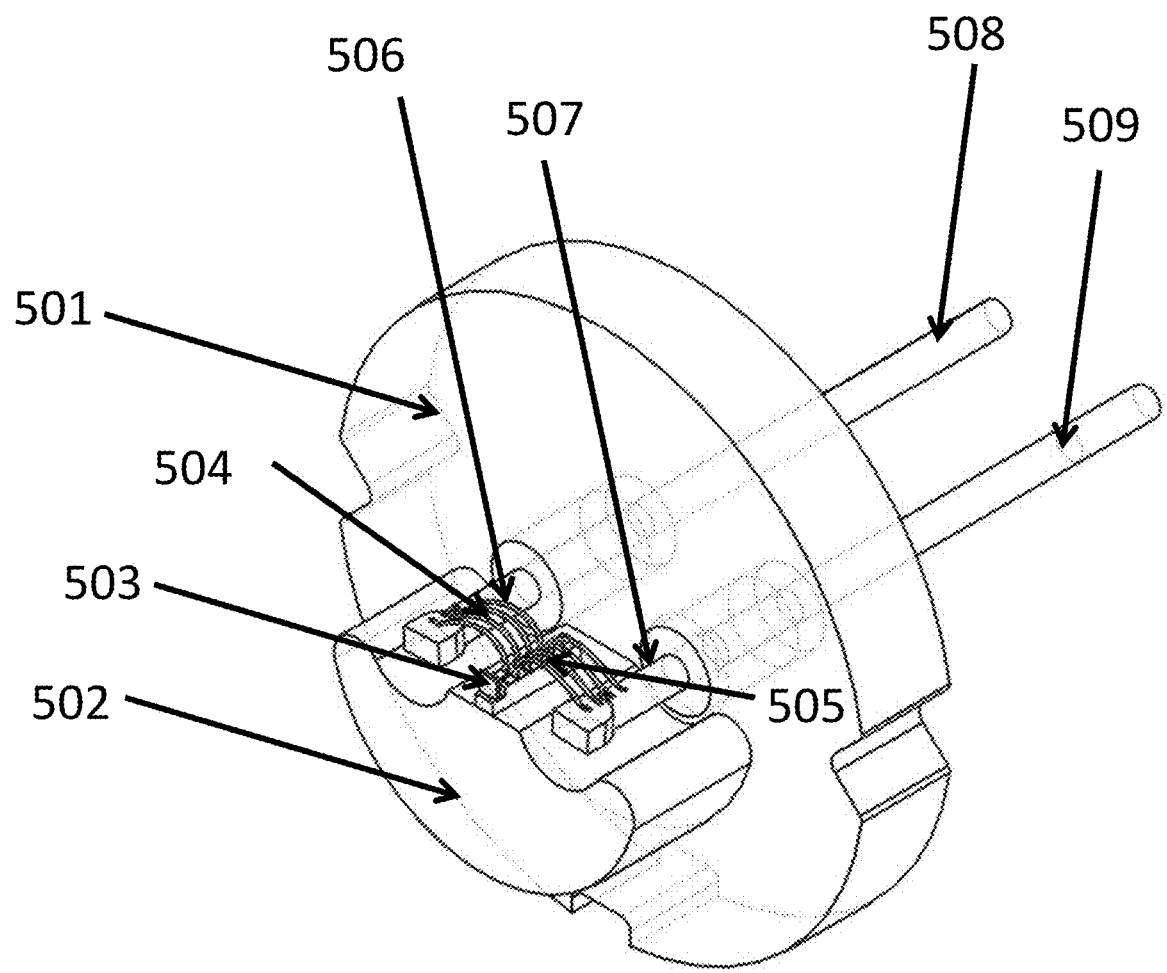
FIG. 26 is a simplified diagram illustrating a laser-based light source mounted on the pedestal of can-type package.

FIG. 26 presents a schematic illustration of one example of a laser based light source according to the present invention. In this example, a laser based white light source is configured in a TO-can type package. The TO-can has a base member 501 with a protruding pedestal member 502, wherein the pedestal member is configured to transmit heat from the pedestal to the base where the heat is subsequently passed to a heat sink. The base member can be comprised of a metal such as copper, copper tungsten, aluminum, or steel, or other. The transmissive white light source 503 according to this invention is mounted on the pedestal 502. The mounting to the pedestal can be accomplished using a soldering or gluing technique such as using AuSn solders, SAC solders, lead containing solders, indium, or other solders. Electrical connections from the p-electrode and n-electrode of the waveguide gain element or laser diode are made using wire bonds 504 and 505. The wirebonds connect the electrode to electrical feedthroughs 506 and 507 that are electrically connected to external pins 508 and 509 on the backside of the TO-can base. The pins are then electrically coupled to a power source to electrify the white light source and generate light emission such as white light emission. In this configuration the light source is not capped or sealed such that is exposed to the open environment. Of course, the example in FIG. 26 is merely an example and is intended to illustrate one possible simple configuration of a packaged CPoS white light source. Specifically, since can-type packages are widely popular for laser diodes and are available off the shelf they could be one option for a low cost and highly adaptable solution.

Figure 27:
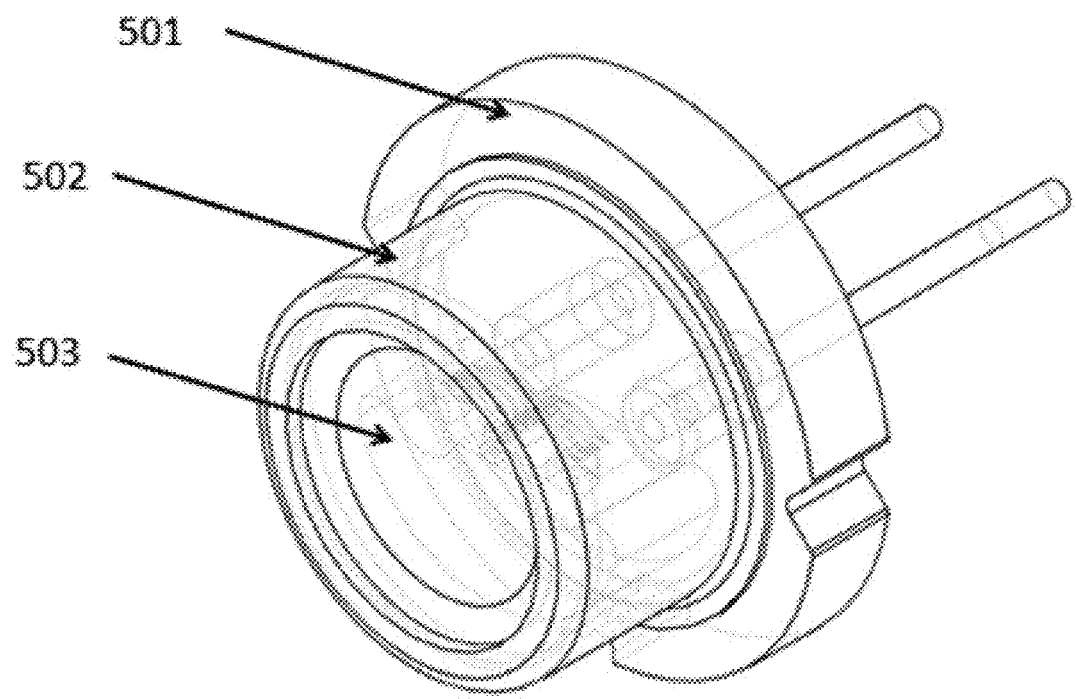
FIG. 27 is a simplified diagram illustrating a laser-based light source mounted in a can-type package and sealed with a cap member according to an embodiment of the present invention.

FIG. 27 is a schematic illustration of the laser based light source configured in a can type package as shown in FIG. 26, but with an additional cap member to form a seal around the white light source. As seen in FIG. 27, the TO-can type package 501 has a cap 502 mounted to the base. The cap can be soldered, brazed, welded, or glue to the base. The cap member has a transparent window region 503 configured to allow the emitted light to pass to the outside environment where it can be harnessed in application. The sealing type can be an environmental seal or a hermetic seal, and in an example the sealed package is backfilled with a nitrogen gas or a combination of a nitrogen gas and an oxygen gas. In some embodiments, a lens or other type of optical element to shape, direct, or collimate the white light is included directly in the cap member. Of course, the example in FIG. 27 is merely an example and is intended to illustrate one possible configuration of sealing a white light source. Specifically, since TO-can type packages are easily hermetically sealed, this embodiment may be suitable for applications where hermetic seals are needed.

Figure 28:
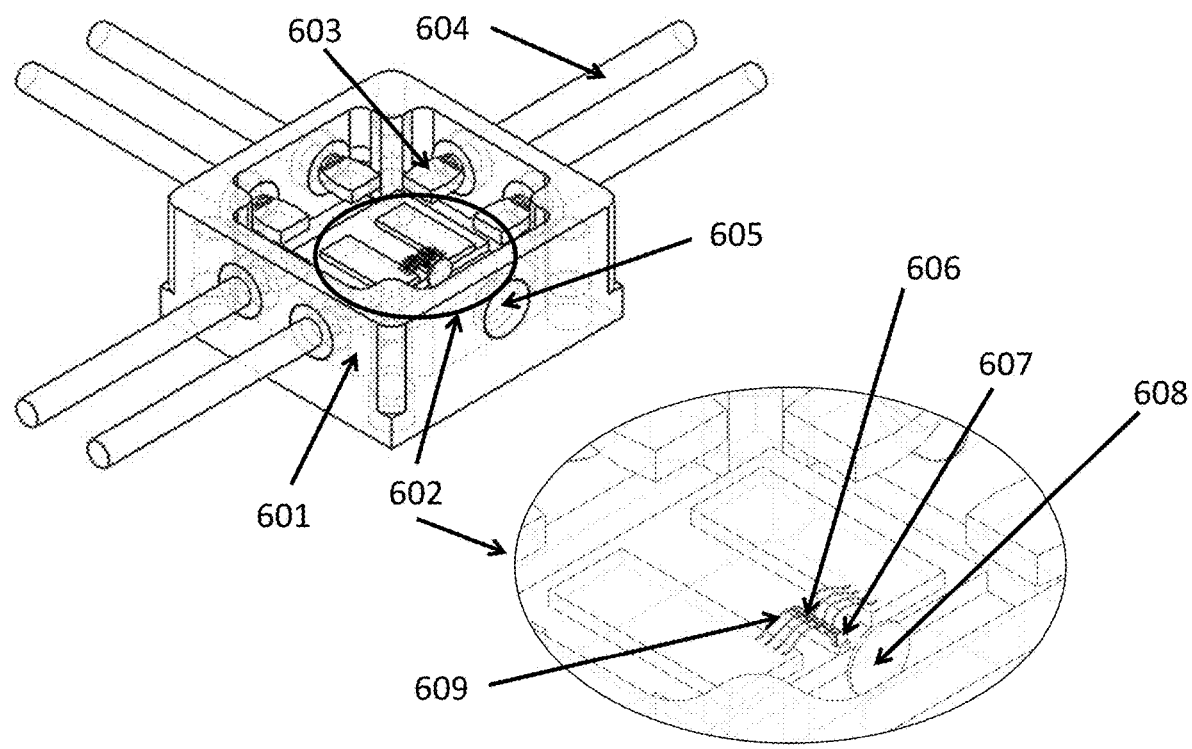
FIG. 28 is a simplified diagram illustrating a laser-based light source mounted in a flat-type package with a collimating optic according to an embodiment of the present invention.

In one embodiment according to the present invention, a laser based light source is configured in a flat type package with a lens member to create a collimated white beam as illustrated in FIG. 28. As seen in FIG. 28, the flat type package has a base or housing member 601 with a collimated light source 602 mounted to the base and configured to create a collimated white beam to exit a window 603 configured in the side of the base or housing member. The mounting to the base or housing can be accomplished using a soldering or gluing technique such as using AuSn solders, SAC solders, lead containing solders, indium, or other solders. Electrical connections to the laser based light source can be made with wire bonds to the feedthroughs 604 that are electrically coupled to external pins 605. In this example, the laser based light source 602 comprises the waveguide gain element or laser diode member 606, the one or more phosphor wavelength converter members 607 configured to accept the excitation beam, and a collimating lens such as an aspheric lens 608 configured in front of the phosphor to collect the emitted white light and form a collimated beam. The collimated beam is directed toward the window 603 wherein the window region is formed from a transparent material. The transparent material can be a glass, quartz, sapphire, silicon carbide, diamond, plastic, or any suitable transparent material. The external pins 605 are electrically coupled to a power source to electrify the light source and generate light emission, such as white light. As seen in the Figure, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIG. 28 is merely an example and is intended to illustrate one possible configuration of sealing a white light source.

The flat type package examples shown in FIG. 28 according to the present invention is illustrated in an unsealed configuration without a lid to show examples of internal configurations. However, flat packages are easily sealed with a lid or cap member. The lid or cap can be soldered, brazed, welded, glued to the base, or other. The sealing type can be an environmental seal or a hermetic seal, and in an example the sealed package is backfilled with a nitrogen gas or a combination of a nitrogen gas and an oxygen gas.

An alternative example of a packaged laser based light source according to the present invention the light source is configured in a surface mount device (SMD) type package. The example SMD package has a base member with the light source mounted on the base member wherein the base member is configured to conduct heat away from the laser light source and to a heat sink. The base member is comprised of a thermally conductive material such as copper, copper tungsten, aluminum, SiC, steel, diamond, composite diamond, AlN, sapphire, or other metals, ceramics, or semiconductors The mounting to the base member can be accomplished using a soldering or gluing technique such as using AuSn solders, SAC solders, lead containing solders, indium, or other solders. The mounting joint could also be formed from thermally conductive glues, thermal epoxies, and other materials. Electrical connections from the p-electrode and n-electrode of the waveguide gain element or laser diode are made to using wirebonds to internal feedthroughs. The feedthroughs are electrically coupled to external leads. The external leads can be electrically coupled to a power source to electrify the light source and generate light emission such as white light. The top surface of the surface mount package may be comprised of or coated with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, this is merely an example and is intended to illustrate one possible simple configuration of a surface mount packaged laser based light source. Specifically, since surface mount type packages are widely popular for LEDs and other devices and are available off the shelf they could be one option for a low cost and highly adaptable solution. The SMD package can be configured for a sealing such as an environmental seal or a hermetic seal.

In all embodiments, of the laser based light source according to the present invention safety features and design considerations can be included. In any based laser based source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the white light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor.

In one embodiment, an optical beam dump serves as an optical element to absorb the waveguide gain element or laser beam that could otherwise be dangerous to the outside environment. Design concerns in the beam dump would include the management and reduction of laser beam back reflections and scattering as well as dissipation of heat generated by absorption. Simple solutions where the optical power is not too high, the absorbing material can be as simple as a piece of black velvet or flock paper attached to a backing material with a glue, solder, or other material. In high power applications such as those that would incorporated into high power laser systems, beam dumps must often incorporate more elaborate features to avoid back-reflection, overheating, or excessive noise. Dumping the beam with a simple flat surface could result in unacceptably large amounts of light escaping to the outside world where it could be dangerous to the environment even though the direct reflection is mitigated. One approach to minimize scattering is to use a porous or deep dark cavity material deep lined with an absorbing material to dump the beam.

In some embodiments of this invention, safety features and systems use active components. Example active components include photodetectors/photodiode and thermistors. A photodiode is a semiconductor device that converts light into current wherein a current is generated when light within a certain wavelength range is incident on the photodiode. A small amount of current is also produced when no light is present. Photodiodes may be combined with components such as optical filters to provide a wavelength or polarization selection of the light incident on the detector, built-in lenses to focus the light or manipulate the light incident on the detector, and may have large or small surface areas to select a certain responsivity and/or noise level. The most prevalent photodiode type is based on Si as the optical absorbing material, wherein a depletion region is formed. When a photon is absorbed in this region an electron-hole pair is formed, which results in a photocurrent. The primary parameter defining the sensitivity of a photodiode is its quantum efficiency, (QE) which is defined as the percentage of incident photons generating electron-hole pairs which subsequently contribute to the output signal. Quantum efficiencies of about 80% are usual for silicon detectors operating at wavelengths in the 800-900 nm region. The sensitivity of a photodiode may also be expressed in units of amps of photodiode current per watt of incident illumination. This relationship leads to a tendency for responsivity to reduce as the wavelength becomes shorter. For example, at 900 nm, 80% QE represents a responsivity of 0.58 A/W, whereas at 430 nm, the same QE gives only 0.28 A/W. In alternative embodiments, photodiodes based on other materials such as Ge, InGaAs, GaAs, InGaAsP, InGaN, GaN, InP, GaP, InGaP or other semiconductor based materials can be used. The photodiode can be a p-n type, a p-i-n type, an avalanche photodiode, a uni-traveling carrier photodiode, a partially depleted photodiode, or other type of diode.

The decreasing responsivity with such shorter wavelengths presents difficulty in achieving a high performance silicon based photodiode in the violet or blue wavelength range. To overcome this difficulty blue enhancement and/or filter techniques can be used to improve the responsivity this wavelength range. However, such techniques can lead to increased costs, which may not be compatible with some applications. Several techniques can be used to overcome this challenge including deploying new technologies for blue enhanced silicon photodiodes or using photodiodes based on different material systems such as photodiodes based on GaN/InGaN. In one embodiment an InGaN and/or GaN-containing photodiode is combined with the integrated white light source. In a specific embodiment, the photodiode is integrated with the laser diode either by a monolithic technique or by an integration onto a common submount or support member as the laser diode to form an integrated GaN/InGaN based photodiode.

The photodiode or photodetector may be configured for a surface normal detection wherein the detected light is incident on the photodiode at about an angle orthogonal to the semiconductor surface area. The light is typically detected with the generation of a photocurrent in a reversed biased semiconductor structure. This surface normal configuration is the conventional design for a discrete photodiode element integrated into the system, but in some embodiments the photodiode can be integrated with the laser diode or waveguide element either in the same epitaxial layer structure, on the same substrate, or mounted on a common support member. In some preferred embodiments the photodiode may be a waveguide photodiode wherein the detected light enters the photodiode from an edge surface into a waveguide where the light is detected with a photocurrent generation typically in a reverse biased semiconductor structure. Waveguide or edge illumination photodiodes may be configured as discrete photodiodes or may be integrated with the light emitter. Discrete photodiodes or other sensor members indicates that that they may be contained within the same package or assembly as the laser diode and could be mounted on the same support member. Monolithically integrated photodiodes are contained on the same chip as the laser diode or waveguide gain element in the laser based light source.

For the monolithic integration of the photodiode with the waveguide gain element or laser diode several approaches can be implemented. A simple and most straightforward embodiment would be to use the same epitaxial structure for the photodector as used for the laser diode or waveguide gain element. In this embodiment n and p contacts would be formed to the detector region similarly or identical to the laser diode or waveguide gain element, but the bias on the photodiode would be a reverse bias to sweep out the photogenerated current. That is, instead of applying a forward bias to induce a gain as in the laser diode, the photodiode is reverse biased to create an absorption. In alternative embodiments of monolithically integrated photodiodes, a selective area growth method or butt-joint regrowth method may be used to define a separate epitaxial structure than the laser diode or waveguide gain element.

In an embodiment with a monolithically integrated waveguide photodiode, the photodiode waveguide could be positioned relative to the laser diode or waveguide gain element in many configurations. In one embodiment it is positioned adjacent to the laser diode or gain element waveguide. In another embodiment the photodiode is spatially positioned behind or in front of the laser diode or waveguide gain element, or some combination of adjacent and behind or in front of. In yet another embodiment, the photodiode waveguide region is positioned along the same waveguide axis as the laser diode or the waveguide gain element. For example, the photodiode can be positioned behind the rear mirror of a laser diode or a SLED. The waveguide photodiode preferably has a similar structure as the laser diode or waveguide gain element, but optionally with different waveguide dimensions. For example, the photodiode waveguide absorption region can be much shorter such as having a length of 25-100 um, 100 to 250 um, or 250 um to 1000 um. The photodiode waveguide absorption waveguide region may also have a different width to improve its performance such as having a wider width of 15 um to 100 um or a narrower width of 1 um to 15 um. In alternative embodiments, surface normal photodiodes are integrated with the laser diodes or waveguide gain elements.

In another embodiment of this invention to overcome the difficulty of achieving a low cost silicon based photodiode operable with high responsivity in the blue wavelength region, a wavelength converter material such as a phosphor can be used to down convert ultraviolet, violet, or blue laser light to a wavelength more suitable for high-responsivity photo-detection according to the criteria required in an embodiment for this invention. For example, if photodiodes operating in the green, yellow, or red wavelength regime can be lower cost and have a suitable responsivity for the power levels associated with a converted wavelength, the photodiode can be coated with phosphors to convert the laser light to a red, green, or yellow emission. In other embodiments the detectors are not coated, but a converter member such as a phosphor is place in the optical pathway of the laser beam or scattered laser beam light and the photodiode.

Strategically located detectors designed to detect direct blue emission from the laser, scattered blue emission, or phosphor emission such as yellow phosphor emission can be used to detect failures of the phosphor where a blue beam could be exposed or other malfunctions of the white light source. Upon detection of such an event, a close circuit or feedback loop would be configured to cease power supply to the laser diode and effectively turn it off.

As an example, a photodiode can be used to detect if the phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system.

In a preferred embodiment, a InGaN/GaN-based photodiode is integrated with the white light source. The InGaN/GaN-based photodiode can be integrated using a discrete photodiode mounted in the package or can be directly integrated onto a common support member with the laser diode. In a preferable embodiment, the InGaN/GaN-based photodiode can be monolithically integrated with the laser diode.

In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off.

In many applications according to the present invention, the packaged integrated white light source will be attached to a heat sink member. The heat sink is configured to transfer the thermal energy from the packaged white light source to a cooling medium. The cooling medium can be an actively cooled medium such as a thermoelectric cooler or a microchannel cooler, or can be a passively cooled medium such as an air-cooled design with features to maximize surface and increase the interaction with the air such as fins, pillars, posts, sheets, tubes, or other shapes. The heat sink will typically be formed from one or more metal members, but can be others such as thermally conductive ceramics, semiconductors, or composites.

The heat sink member is configured to transport thermal energy from the packaged waveguide gain element or laser diode based white light source to a cooling medium. The heat sink member can be comprised of a metal, ceramic, composite, semiconductor, plastic and is preferably comprised of a thermally conductive material. Examples of candidate materials include copper which may have a thermal conductivity of about 400 W/(mK), aluminum which may have a thermal conductivity of about 200 W/(mK), 4H—SiC which may have a thermal conductivity of about 370 W/(mK), 6H—SiC which may have a thermal conductivity of about 490 W/(mK), AlN which may have a thermal conductivity of about 230 W/(mK), a synthetic diamond which may have a thermal conductivity of about >1000 W/(mK), a composite diamond, sapphire, or other metals, ceramics, composites, or semiconductors. The heat sink member may be formed from a metal such as copper, copper tungsten, aluminum, or other by machining, cutting, trimming, or molding.

The attachment joint joining the packaged laser light source according to this invention to the heat sink member should be carefully designed and processed to minimize the thermal impedance. Therefore a suitable attaching material, interface geometry, and attachment process practice must be selected for an appropriate thermal impedance with sufficient attachment strength. Examples include AuSn solders, SAC solders, lead containing solders, indium solders, indium, and other solders. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink.

In some embodiments of this invention, the laser based light source comprises one or more phosphor members that are shaped to some form to manipulate the generated light such as white light. For example, the surfaces of the phosphor members can be roughened, polished, formed into a convex surface, formed into a concave surface, or formed into any geometry that could produce a desirable optical effect the laser based light source. Such desired optical effects include collimation, shaping, pointing the emission to a certain location or others. The phosphor shaping can be performed in combination with optical coatings such as mirror coatings to create a modified reflection property to further enhance the optical emission characteristics. These are merely examples as there are several other phosphor shaping and modifying methods and combinations that could be included in this invention.

In some embodiments of this invention, the laser based light source is combined with one or more optical members to manipulate the generated light such as white light. In an example the white light source could serve in a spot light system such as a flashlight or an automobile headlamp or other light applications where the light must be directed or projected to a specified location or area. As an example, to direct the light it should be collimated such that the photons comprising the white light are propagating parallel to each other along the desired axis of propagation. The degree of collimation depends on the light source and the optics using to collimate the light source. For the highest collimation a perfect point source of light with 4 pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector.

In an another example a simple singular lens or system of lenses is used to collimate the white light into a projected beam. In a specific example, a single aspheric lens is place in front of the phosphor member emitting white light and configured to collimate the emitted white light. In another embodiment, the lens is configured in the cap of the package containing the integrated white light source. In some embodiments, a lens or other type of optical element to shape, direct, or collimate the white light is included directly in the cap member In an example the lens is comprised of a transparent material such as a glass, SiC, sapphire, quartz, a ceramic, a composite, or a semiconductor.

Such white light collimating optical members can be combined with the white light source at various levels of integration. For example, the collimating optics can reside within the same package as the integrated white light source in a co-packaged configuration. In a further level of integration the collimating optics can reside on the same submount or support member as the white light source. In another embodiment, the collimating optics can reside outside the package containing the integrated white light source.

Figure 29:
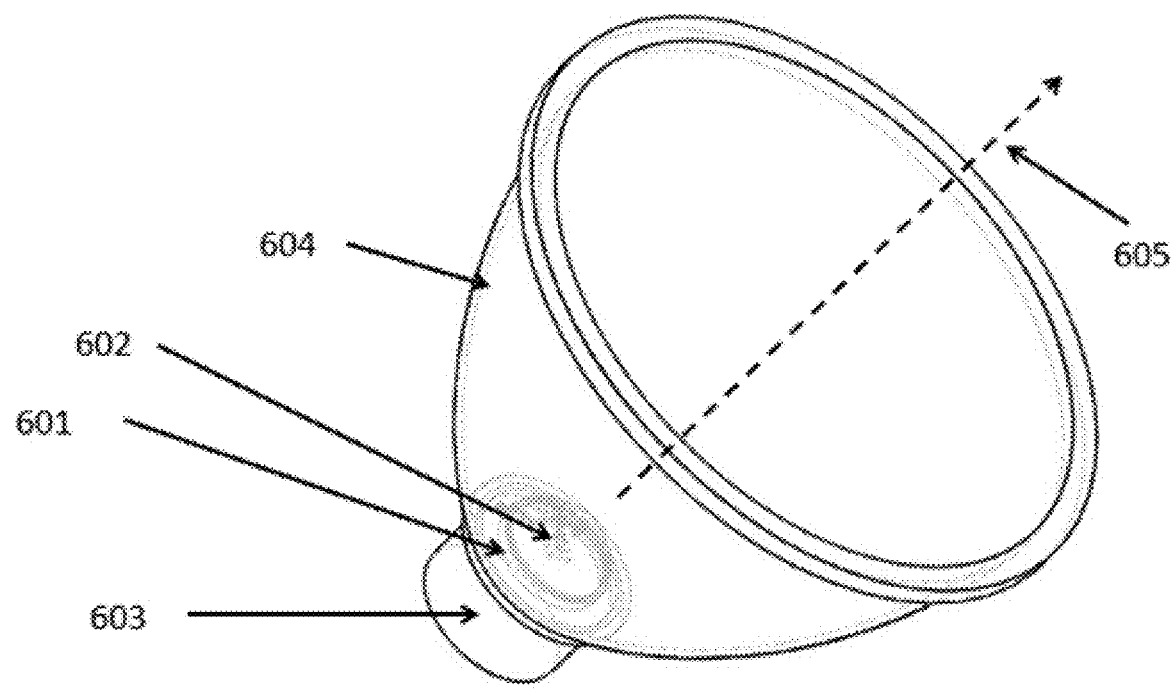
FIG. 29 is a simplified diagram illustrating a laser-based light source mounted in a surface mount type package mounted on a heat sink with a collimating reflector according to an embodiment of the present invention.

In an alternative embodiment, FIG. 29 provides a schematic illustration of a laser based light source according to this invention configured in an SMD-type package with an additional parabolic member configured to collimate and project the emitted light such as a white light. The example configuration for a collimated white light from SMD-type package according to FIG. 29 comprises an SMD type package 601 comprising a based and a cap or window region and the integrated white light source 602. The SMD package is mounted to a heat-sink member 603 configured to transport and/or store the heat generated in the SMD package from the waveguide gain element or laser diode and the one or more phosphor members. A reflector member 604 such as a parabolic reflector is configured with the one or more phosphor members of the laser based source at or near the focal point of the parabolic reflector. The parabolic reflector functions to collimate and project the white light along the axis of projection 605. Of course, this is merely an example and is intended to illustrate one possible configuration of combining the laser based light source according to this invention with a reflector collimation optic. In some embodiments the phosphor member is shaped to form a preferred optical effect such as collimation. In another example, the collimating reflector could be integrated into the window member of the cap or could be included within the package member. In a preferred embodiment, the reflector is integrated with or attached to the submount.

Figure 30:
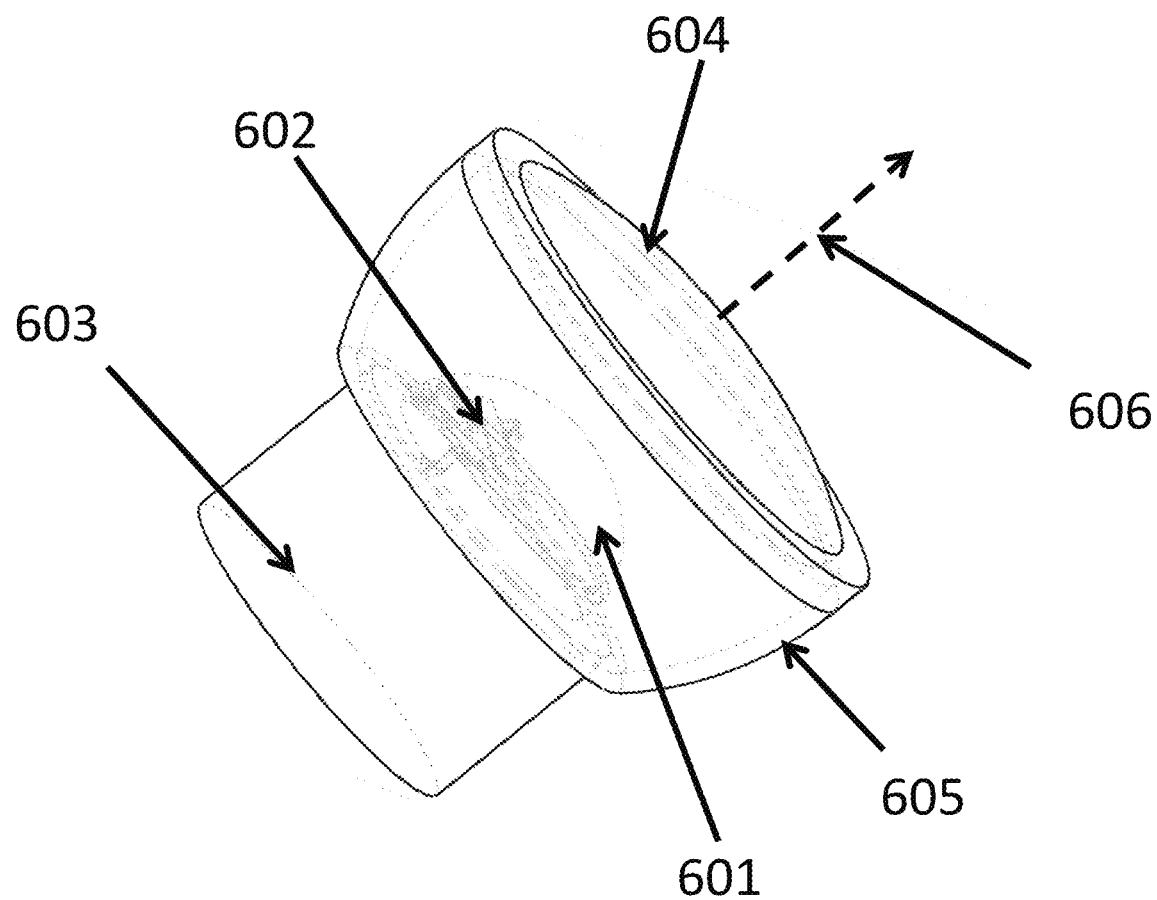
FIG. 30 is a simplified diagram illustrating a laser-based light source mounted in a surface mount type package mounted on a heat sink with a collimating lens and reflector member according to an embodiment of the present invention.

In an alternative embodiment, FIG. 30 provides a schematic illustration of a laser based light source according to this invention configured in an SMD-type package with an additional lens member configured to collimate and project the white light. The example configuration for a collimated emitted light, such as a white light, from SMD-type package according to FIG. 30 comprises an SMD type package 601 comprising a based and a cap or window region and the laser-based light source 602. The SMD package is mounted to a heat-sink member 603 configured to transport and/or store the heat generated in the SMD package from the waveguide gain element or laser diode and one or more phosphor members. A lens member 604 such as an aspheric lens is configured with the one or more phosphor members of the laser based light source to collect and collimate a substantial portion of the emitted light, such as white light. The lens member is supported by support members 605 to mechanically brace the lens member in a fixed position with respect to the white light source. The support members can be comprised of metals, plastics, ceramics, composites, semiconductors or other. The lens member functions to collimate and project the white light along the axis of projection 606. Of course, this is merely an example and is intended to illustrate one possible configuration of combining the laser based light source according to this invention with a reflector collimation optic. In some embodiments the phosphor member is shaped to form a preferred optical effect such as collimation. In another example, the collimating reflector could be integrated into the window member of the cap or could be included within the package member. In a preferred embodiment, the reflector is integrated with or attached to the submount.

In an embodiment according to the present invention, FIG. 45 provides a schematic illustration of a white light source according to this invention configured in an SMD-type package as shown in FIG. 32, but with an additional lens member and reflector member configured to collimate and project the white light. The example configuration for a collimated white light from SMD-type package according to FIG. 45 comprises an SMD type package 601 comprising a based and a cap or window region and the integrated white light source 602. The SMD package is mounted to a heatsink member 603 configured to transport and/or store the heat generated in the SMD package from the laser and phosphor member. A lens member 604 such as an aspheric lens is configured with the white light source to collect and collimate a substantial portion of the emitted white light. A reflector housing 605 or lens member is configured between the white light source and the lens member to reflect any stray light or light that would not otherwise reach the lens member into the lens member for collimation and contribution to the collimated beam. In one embodiment the lens member is supported by the reflector housing member to mechanically brace the lens member in a fixed position with respect to the white light source. The lens member functions to collimate and project the white light along the axis of projection 606. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

A further understanding of the nature and advantages of the present invention may be realized by reference to the latter portions of the specification and attached drawings.

In all of the embodiments of this invention the additional features and designs can be included. For example shaping of the excitation beam for optimizing the beam spot characteristics on the one or more phosphors can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated. Moreover, optical elements can be included to manipulate the generated white light. In some embodiments reflectors such as parabolic reflectors or lenses such as collimating lenses are used to collimate the white light or create a spot light that could be applicable in an automobile headlight, flashlight, spotlight, or other lights.

In one embodiment, the present invention provides a laser-based white light source comprising a form factor characterized by a length, a width, and a height. The apparatus has a support member and at least one gallium and nitrogen containing laser diode devices and phosphor material overlying the support member. The waveguide gain element or laser device is capable of an emission of a n output beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In a preferred embodiment the phosphor material can provide a yellowish emission in the 560 nm to 580 nm range such that when mixed with the blue emission of the waveguide gain element or laser diode a white light is produced. In other embodiments phosphors with red, green, yellow, and even blue emission can be used in combination with the waveguide gain element or laser diode excitation source to produce a white light with color mixing. The apparatus typically has a free space with a non-guided laser beam characteristic transmitting the emission of the optical beam from the device to the phosphor material. The output beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In other embodiments free space optics such as collimating lenses can be used to shape the beam prior to incidence on the phosphor. The beam can be characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 10 W. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the waveguide gain element laser diode device to generate the excitation beam and excite the phosphor material. The white light source configured to produce greater than 1 lumen, 10 lumens, 100 lumens, 1000 lumens, or greater of white light output. The support member is configured to transport thermal energy from the at least one waveguide gain element or laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

According to an embodiment, the present invention provides a dynamic laser-based light source or light projection apparatus including a micro-display such as a microelectromechanical system (MEMS) scanning mirror, or "flying mirror" or a digital light processing (DLP) chip to dynamically modify the spatial pattern and/or the color of the emitted light. In one embodiment the light is pixelated to activate certain pixels and not activate other pixels to form a spatial pattern or image of white light. In another example, the dynamic light source is configured for steering or pointing the light beam. The steering or pointing can be accomplished by a user input configured from a dial, switch, or joystick mechanism or can be directed by a feedback loop including sensors.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes one or more of a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a microelectromechanical system (MEMS) scanning mirror, or "flying mirror", configured to project the laser light or laser pumped phosphor white light to a specific location to the outside world. By rastering the laser beam using the MEMS mirror a pixel in two dimensions can be formed to create a pattern or image.

According to an embodiment, the present invention includes a housing having an aperture and an input interface for receiving one or more signals such as frames of images. The dynamic light system also includes a processing module. In one embodiment, the processing module is electrically coupled to an ASIC for driving the laser diode and the MEMS scanning mirrors.

In one embodiment, a laser driver module is provided. Among other things, the laser driver module is adapted to adjust the amount of power to be provided to the laser diode. For example, the laser driver module generates a drive current based one or more pixels from the one or more signals such as frames of images, the drive currents being adapted to drive a laser diode. In a specific embodiment, the laser driver module is configured to generate pulse-modulated signal at a frequency range of about 50 to 300 MHz.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes one or more of a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a laser driver module coupled to the laser source. The apparatus can include a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip.

The apparatus can include a laser driver module coupled to the laser source. The apparatus includes an optical member provided within proximity of the laser source, the optical member being adapted to direct the laser beam to the digital light processing chip. The apparatus includes a power source electrically coupled to the laser source and the digital light processing chip. In one embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode.

In a specific embodiment of the present invention including a dynamic light source, the dynamic feature is activated by a feedback loop including a sensor. Such sensors may be selected from, but not limited to a microphone, geophone, hydrophone, a chemical sensor such as a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video sensor, transducer, image sensor, infrared sensor, SONAR, LIDAR, or others.

In one example of a dynamic light feature including a feedback loop with a sensor a motion sensor is included. The dynamic light source is configured to illuminate a location where the motion is detected by sensing the spatial of position of the motion and steering the output beam to that location. In another example of a dynamic light feature including a feedback loop with a sensor an accelerometer is included. The accelerometer is configured to anticipate where the laser light source apparatus is moving toward and steer the output beam to that location even before the user of the apparatus can move the light source to be pointing at the desired location. Of course, these are merely examples of implementations of dynamic light sources with feedback loops including sensors. There can be many other implementations of this invention concept that includes combining dynamic light sources with sensors.

In certain embodiments, the laser based light source apparatus, the source is operable in an environment comprising at least 150,000 ppm oxygen gas.

In certain embodiments, the laser based light source apparatus, the support member comprises a material selected from copper, copper tungsten, aluminum, silicon, and a combination of any of the foregoing.

In certain embodiments, the laser based light source apparatus comprises a micro-channel cooler thermally coupled to the support member.

In certain embodiments, the laser based light source apparatus comprises a heat heat-sink thermally coupled to the common support member. In one example the heat sink has fins or a measure for increased surface area.

In certain embodiments, the laser based light source apparatus comprises a heat spreader coupled between the common support member and the heat sink.

In certain embodiments, the laser based light source apparatus, an optical coupler comprises one or more optical fibers.

In certain embodiments of the laser based light source apparatus, the output beam is geometrically configured to optimize an interaction with a phosphor material.

In certain embodiments of the laser based light source apparatus, the white light source is configured in a package. In one example, the package is hermetically sealed.

In certain embodiments of the laser based light source apparatus, the white light source is configured in a package such a flat package(s), surface mount packages such as SMDs, TO9 Can, TO56 Can, TO-5 can, TO-46 can, CS-Mount, G-Mount, C-Mount, micro-channel cooled package(s), and others.

In certain embodiments of the laser based light source apparatus, the emitted white light is collimated using a reflector or lens.

What is claimed is:

1. A laser based light source comprising;
    an optical cavity member comprising at least a waveguide gain element, a first mirror, and a second mirror;

the waveguide gain element comprising gallium and nitrogen and configured as an edge-emitting excitation source;

the waveguide gain element configured with a gallium and nitrogen containing active region positioned between an n-type gallium and nitrogen containing cladding region and a p-type gallium and nitrogen containing cladding region;

the waveguide gain element configured to receive an electrical input to generate an excitation light having a first wavelength within the optical cavity member, the first wavelength being a violet wavelength in the 385 nm to 425 nm range or a blue wavelength in the 425 nm to 485 nm range;

the waveguide gain element further comprising a first end region and a second end region with a cavity region therebetween;

the first end region comprising a first facet on a first end of the cavity region, the first facet including portions of the active region, the n-type gallium and nitrogen containing cladding region, and the p-type gallium and nitrogen containing cladding region, the first end region providing the first mirror and configured to reflect light back into the waveguide gain element and provide optical feedback to the waveguide gain element;

the second end region comprising a second facet on a second end of the cavity region, the second facet including portions of the active region, the n-type gallium and nitrogen containing cladding region, and the p-type gallium and nitrogen containing cladding region, the second end region shaped to provide a reflectivity that does not provide sufficient optical feedback to the waveguide gain element to maintain lasing;

one or more phosphor wavelength conversion members; the one or more phosphor wavelength conversion members comprising a first surface and a second surface;

the first surface of the one or more phosphor wavelength conversion members coupled directly to the second end region of the waveguide gain element; the first surface of the one or more phosphor wavelength conversion members physically integrated with the second mirror to provide the second mirror of the optical cavity member;

the second mirror configured to reflect light back into the waveguide gain element and provide optical feedback to the waveguide gain element;

the optical feedback provided by the second mirror enabling the laser based light source to achieve a threshold condition and maintain lasing;

the one or more phosphor wavelength conversion members configured to receive the excitation light generated within the optical cavity member and convert at least a portion of the excitation light to a second wavelength different from the first wavelength and emit incoherent light comprising the second wavelength from the second surface of the one or more phosphor wavelength conversion members;

a safety design feature wherein the laser based light source is configured to modify or reduce the optical feedback to the waveguide gain element upon a damage, compromise, or change to the one or more phosphor wavelength conversion members that does not cause a corresponding damage, compromise, or change to the second facet; and the modified or reduced optical feedback configured to prevent the laser based light source from achieving the threshold condition and thereby preventing the laser based light source from lasing.

2. The laser based light source of claim 1, wherein the waveguide gain element is comprised of a superluminescent diode.

3. The laser based light source of claim 1, wherein the laser based light source is a white light source; and wherein the waveguide gain element is characterized by a first blue wavelength in the range of 425 to 475 nm, the one or more phosphor wavelength conversion members comprises a second yellow wavelength range, and wherein the white light emission is comprised of the first blue wavelength and the second yellow wavelength.

4. The laser based light source of claim 1, wherein the laser based light source is a white light source; and wherein the waveguide gain element is characterized by a first violet wavelength in the range of 385 to 425 nm, a first phosphor wavelength conversion member comprises a second blue wavelength, a second phosphor wavelength conversion member comprises a third yellow wavelength range, and wherein the white light emission is comprised of the second blue wavelength and the third yellow wavelength.

5. The laser based light source of claim 1, wherein the laser based light source is a white light source; and wherein the waveguide gain element is characterized by a first blue wavelength in the range of 425 to 475 nm, a first phosphor wavelength conversion member comprises a second green wavelength, a second phosphor wavelength conversion member comprises a third red wavelength range, and wherein the white light emission is comprised of the first blue wavelength, the second green wavelength, and the third red wavelength.

6. The laser based light source of claim 1, wherein the laser based light source is a white light source; and wherein the waveguide gain element is characterized by a first violet wavelength in the range of 385 to 425 nm, a first phosphor wavelength conversion member comprises a second blue wavelength, a second phosphor wavelength conversion member comprises a third green wavelength range, a third phosphor wavelength conversion member comprises a fourth red wavelength range, and wherein the white light emission is comprised of the second blue wavelength, the third green wavelength, and the fourth red wavelength.

7. The laser based light source of claim 1, comprising at least one of or a combination of a passive safety feature such as a beam dump configured to absorb laser light and an active safety feature such as integrated photodiode configured to turn the laser diode off when a change in signal is sensed.

8. The laser based light source of claim 1, wherein at least one of the one or more phosphor wavelength conversion members is comprised of a ceramic yttrium aluminum garnet (YAG) doped with Ce or a single crystal YAG doped with Ce; and wherein the phosphor has an optical conversion efficiency of greater than 50 lumen per optical watt.

9. The laser based light source of claim 1, wherein the wavelength conversion member includes a reflector member to provide the second mirror.

10. The laser based light source of claim 1, wherein the wavelength conversion member includes a coating to provide the second mirror.

11. The laser based light source of claim 1, wherein the second facet is angled relative to the waveguide gain element to reduce reflectivity of the second end region.

12. A laser based light source comprising;
an optical cavity member comprising at least a waveguide gain element, a first mirror, and a second mirror;

the waveguide gain element comprising gallium and nitrogen and configured as an edge-emitting excitation source;

the waveguide gain element configured with a gallium and nitrogen containing active region positioned between an n-type gallium and nitrogen containing cladding region and a p-type gallium and nitrogen containing cladding region;

the waveguide gain element configured to receive an electrical input to generate an excitation light having a first wavelength within the optical cavity member, the first wavelength being a violet wavelength in the 385 nm to 425 nm range or a blue wavelength in the 425 nm to 485 nm range;

the waveguide gain element further comprising a first end region and a second end region with a cavity region therebetween;

the first end region comprising a first facet on a first end of the cavity region, the first facet including portions of the active region, the n-type gallium and nitrogen containing cladding region, and the p-type gallium and nitrogen containing cladding region, the first end region providing the first mirror and configured to reflect light back into the waveguide gain element and provide optical feedback to the waveguide gain element;

the second end region comprising a second facet on a second end of the cavity region, the second facet including portions of the active region, the n-type gallium and nitrogen containing cladding region, and the p-type gallium and nitrogen containing cladding region, the second end region configured to provide a reflectivity that does not provide sufficient optical feedback to the waveguide gain element to maintain lasing;

one or more phosphor wavelength conversion members;

the one or more phosphor wavelength conversion members comprising a first surface and a second surface;

the first surface of the one or more phosphor wavelength conversion members coupled to the second end region of the waveguide gain element; the first surface of the one or more phosphor wavelength conversion members providing the second mirror of the optical cavity member;

the second mirror configured to reflect light back into the waveguide gain element and provide optical feedback to the waveguide gain element;

the optical feedback provided by the second mirror enabling the laser based light source to achieve a threshold condition and maintain lasing;

the one or more phosphor wavelength conversion members configured to receive the excitation light generated within the optical cavity member and convert at least a portion of the excitation light to a second wavelength different from the first wavelength and emit incoherent light comprising the second wavelength from the second surface of the one or more phosphor wavelength conversion members;

a safety design feature wherein the laser based light source is configured to modify or reduce the optical feedback to the waveguide gain element upon a damage, compromise, or change to the one or more phosphor wavelength conversion members; and the modified or reduced optical feedback configured to prevent the laser based light source from achieving the threshold condition and thereby preventing the laser based light source from lasing.

13. The laser based light source of claim 12, wherein the wavelength conversion member includes a reflector member to provide the second mirror.

14. The laser based light source of claim 12, wherein the wavelength conversion member includes a coating to provide the second mirror.

15. The laser based light source of claim 12, wherein the second end region of the waveguide gain element is shaped to provide the reflectivity that does not provide sufficient optical feedback to the waveguide gain element to maintain lasing.

16. A laser based light source comprising;

an optical cavity member comprising at least a waveguide gain element, a first mirror, and a second mirror;

the waveguide gain element configured as an edge-emitting excitation source;

the waveguide gain element configured to receive an electrical input to generate an excitation light having a first wavelength within the optical cavity member, the first wavelength being a violet wavelength in the 385 nm to 425 nm range or a blue wavelength in the 425 nm to 485 nm range;

the waveguide gain element further comprising a first end region and a second end region with a cavity region therebetween;

the first end region comprising a first facet on a first end of the cavity region, the first end region providing the first mirror and configured to reflect light back into the waveguide gain element and provide optical feedback to the waveguide gain element;

the second end region comprising a second facet on a second end of the cavity region, the second end region configured to provide a reflectivity that does not provide sufficient optical feedback to the waveguide gain element to maintain lasing;

one or more phosphor wavelength conversion members;

the one or more phosphor wavelength conversion members comprising a first surface and a second surface;

the first surface of the one or more phosphor wavelength conversion members coupled directly to the second end region of the waveguide gain element; the first surface of the one or more phosphor wavelength conversion members providing the second mirror of the optical cavity member;

the second mirror configured to reflect light back into the waveguide gain element and provide optical feedback to the waveguide gain element;

the optical feedback provided by the second mirror enabling the laser based light source to achieve a threshold condition and maintain lasing;

the one or more phosphor wavelength conversion members configured to receive the excitation light generated within the optical cavity member and convert at least a portion of the excitation light to a second wavelength different from the first wavelength and emit incoherent light comprising the second wavelength from the second surface of the one or more phosphor wavelength conversion members;

a safety design feature wherein the laser based light source is configured to modify or reduce the optical feedback to the waveguide gain element upon a damage, compromise, or change to the one or more phosphor wavelength conversion members; and the modified or reduced optical feedback configured to prevent the laser based light source from achieving the threshold condition and thereby preventing the laser based light source from lasing.

17. The laser based light source of claim 16, wherein the wavelength conversion member includes a reflector member to provide the second mirror.

18. The laser based light source of claim 16, wherein the wavelength conversion member includes a coating to provide the second mirror.

19. The laser based light source of claim 16, wherein the second end region of the waveguide gain element is shaped to provide the reflectivity that does not provide sufficient optical feedback to the waveguide gain element to maintain lasing.

* * * * *